United States Patent
Shibata et al.

(10) Patent No.: US 7,525,839 B2
(45) Date of Patent: Apr. 28, 2009

(54) SEMICONDUCTOR MEMORY DEVICE CAPABLE OF CORRECTING A READ LEVEL PROPERLY

(75) Inventors: Noboru Shibata, Kawasaki (JP); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 11/753,143

(22) Filed: May 24, 2007

(65) Prior Publication Data
US 2007/0279982 A1    Dec. 6, 2007

(30) Foreign Application Priority Data
May 31, 2006    (JP)    ............... 2006-152660

(51) Int. Cl.
*G11C 7/10*    (2006.01)
(52) U.S. Cl. ............... 365/185.03; 365/185.09; 365/185.12
(58) Field of Classification Search ............ 365/185.03, 365/185.09, 185.12
See application file for complete search history.

(56) References Cited

U.S. PATENT DOCUMENTS
6,307,776 B1 *    10/2001    So et al. ............... 365/185.03

FOREIGN PATENT DOCUMENTS
JP    2004-326866    11/2004

* cited by examiner

*Primary Examiner*—Huan Hoang
(74) *Attorney, Agent, or Firm*—Oblon, Spivak, McClelland, Maier & Neustadt, P.C.

(57) ABSTRACT

In a memory cell array, a plurality of memory cells each of which stores a plurality of bits are connected to a plurality of word lines and a plurality of bit lines and are arranged in a matrix. Control portions read a threshold level of a second memory cell adjacent to a first memory cell in the memory cell array, determine a correction level according to the threshold level read from the second memory cell, add the determined correction level to a read level of the first memory cell, and then read the threshold level of the first memory cell. A storage portion stores the correction level.

18 Claims, 47 Drawing Sheets

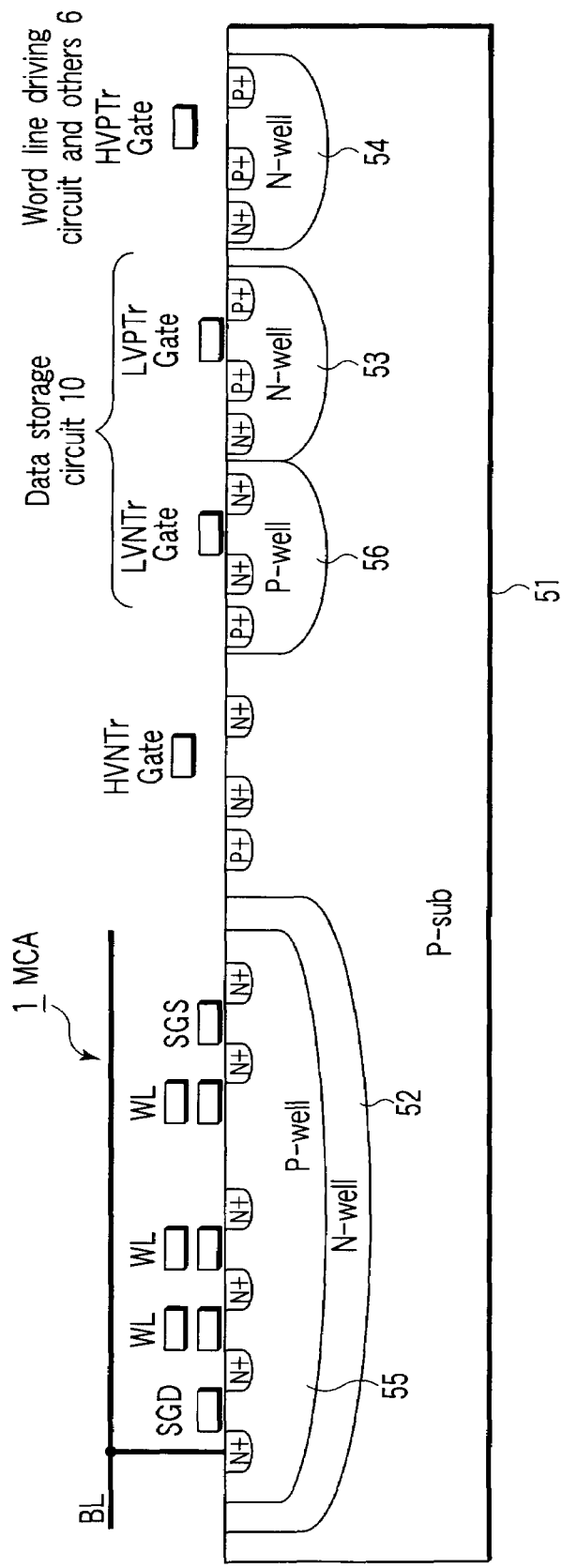
F I G. 4

|  | Cell (P-well) | Cell (N-well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vss (0V) | Vss (0V) | Vss (0V) | Vss (0V) | Vdd (2.5V) | Vdd (2.5V)/Vreadh |

FIG. 5

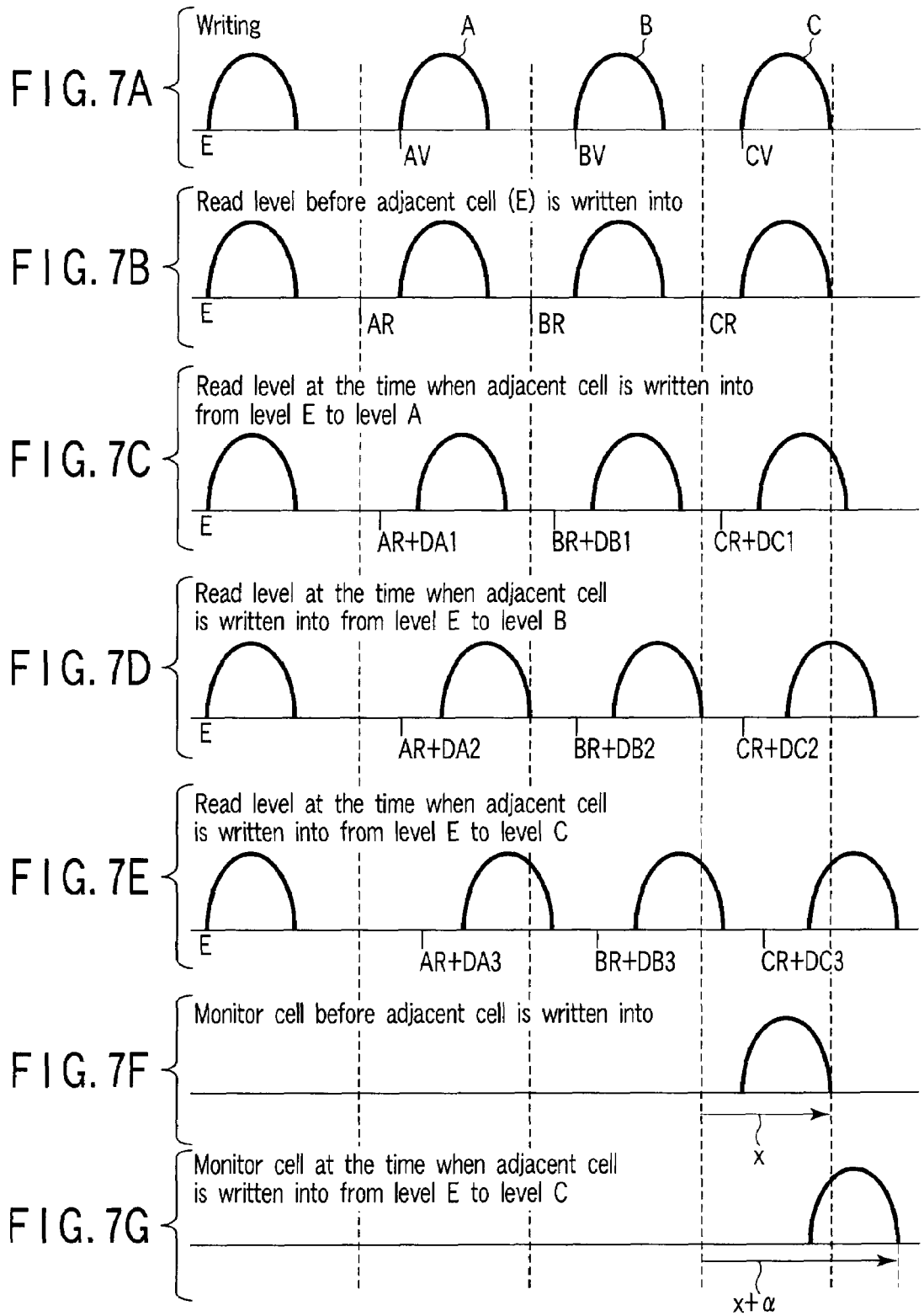

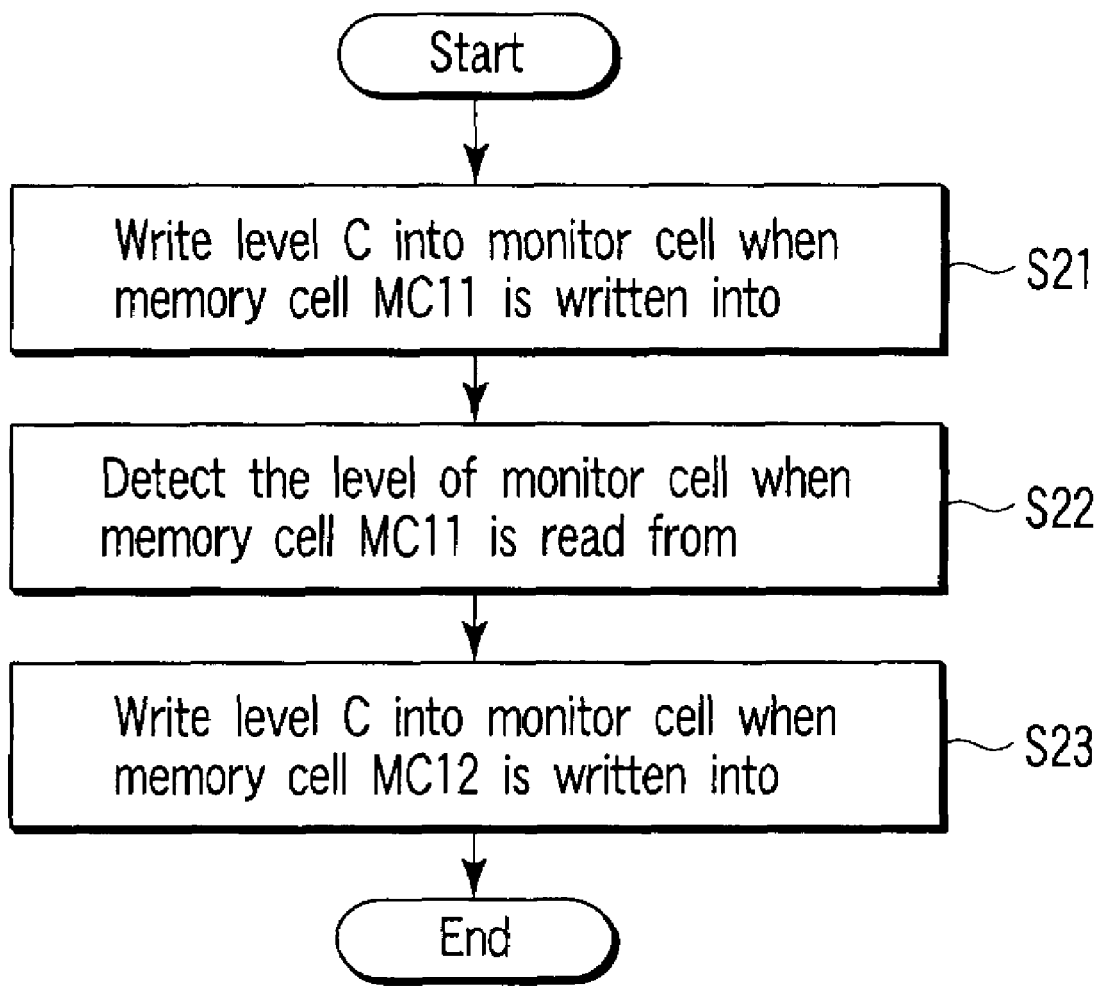
F I G. 12

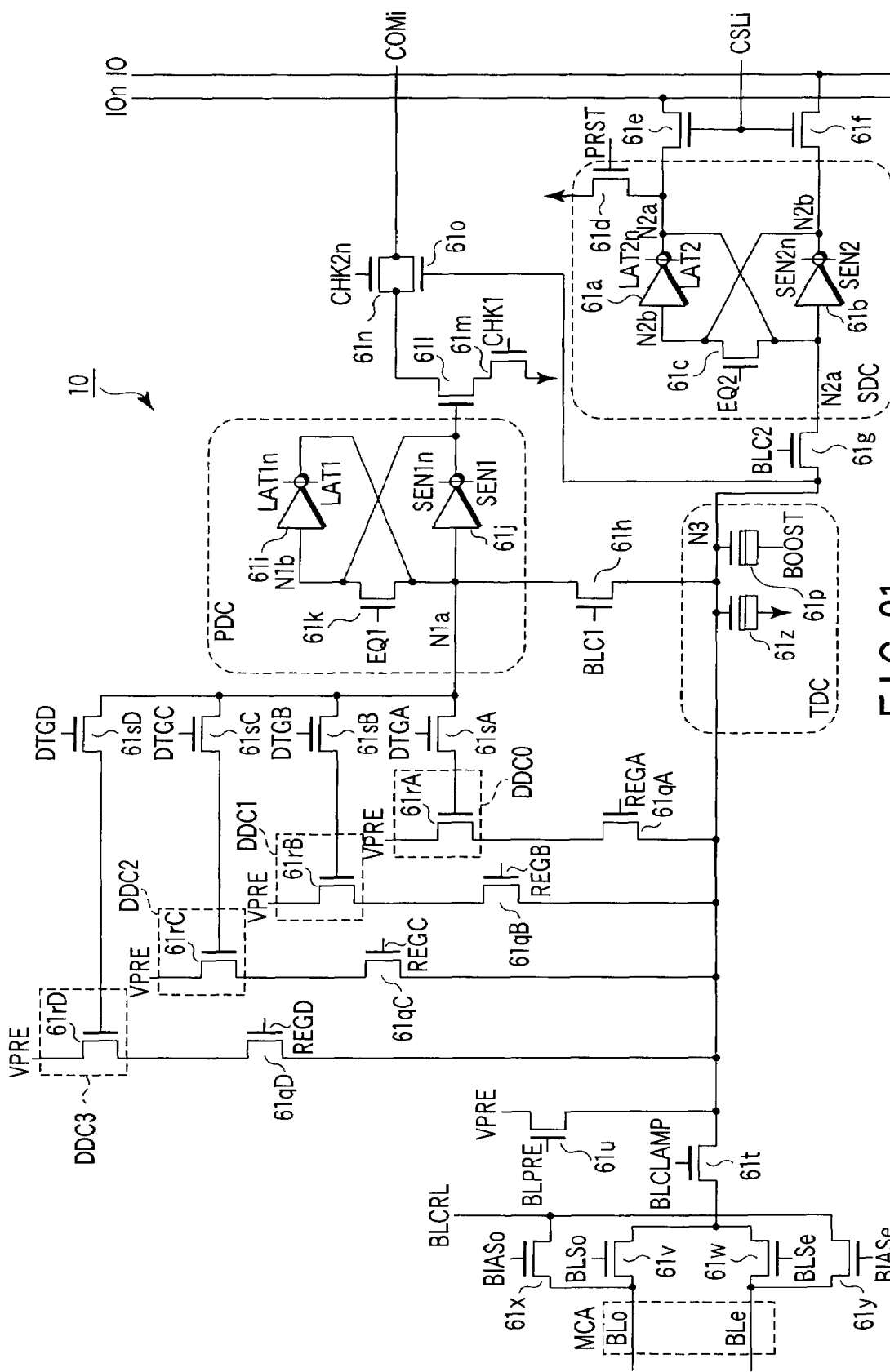
F I G. 21

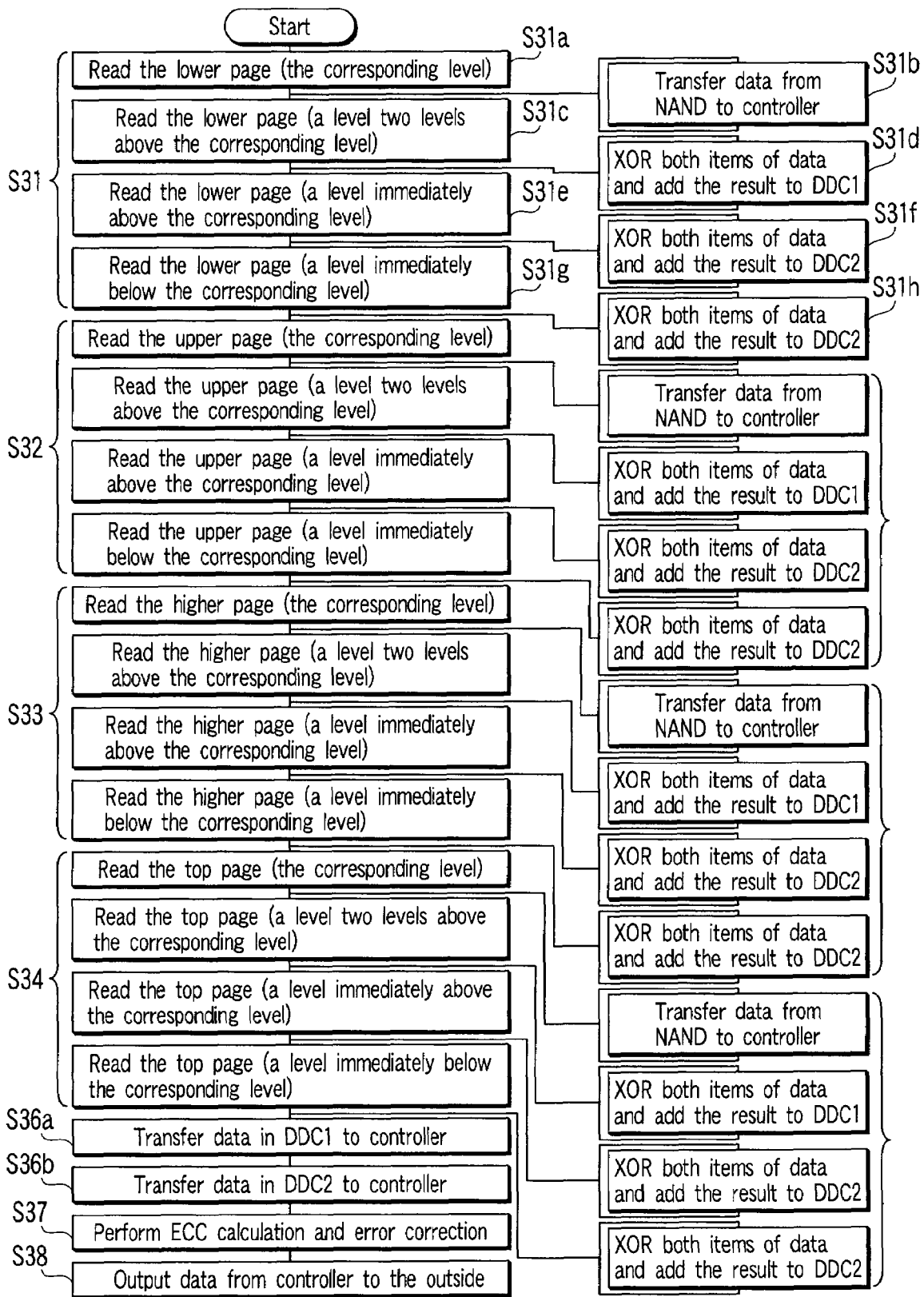
F I G. 25

| Write level | Z | A | B | C | D | E | F | G | H | I | J | K | L | M | N | O |
|---|---|---|---|---|---|---|---|---|---|---|---|---|---|---|---|---|
| PDC | 1 | 0 | 0 | 0 | 0 | 0 | 0 | 0 | 0 | 0 | 0 | 0 | 0 | 0 | 0 | 0 |
| SDC | 1 | 1 | 1 | 1 | 1 | 1 | 1 | 1 | 0 | 0 | 0 | 0 | 0 | 0 | 0 | 0 |
| DDC2 | 0 | 0 | 0 | 0 | 1 | 1 | 1 | 1 | 0 | 0 | 0 | 0 | 1 | 1 | 1 | 1 |
| DDC1 | 0 | 0 | 1 | 1 | 0 | 0 | 1 | 1 | 0 | 0 | 1 | 1 | 0 | 0 | 1 | 1 |
| DDC0 | 0 | 1 | 0 | 1 | 0 | 1 | 0 | 1 | 0 | 1 | 0 | 1 | 0 | 1 | 0 | 1 |

| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|---|
| Change of adjacent cell: naught | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | 143 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 |
| After correction(-0) | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Change of adjacent cell: small | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | 83 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 |
| After correction(-1) | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
| Change of adjacent cell: below average | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 |
| After correction(-2) | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
| Change of adjacent cell: average | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 |
| After correction(-3) | | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
| Change of adjacent cell: above average | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | | | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 |
| After correction(-4) | | | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 |
| Change of adjacent cell: large | | | | | | | | | | | | | | | | | | | | | | | | | | | | | | | |
| Number of times "H" was read | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
| Number of cells with an n number of times | | | | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 | 23 | 60 |
| After correction(-5) | | | | | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |

FIG. 45

SEMICONDUCTOR MEMORY DEVICE CAPABLE OF CORRECTING A READ LEVEL PROPERLY

CROSS-REFERENCE TO RELATED APPLICATIONS

This application is based upon and claims the benefit of priority from prior Japanese Patent Application No. 2006-152660, filed May 31, 2006, the entire contents of which are incorporated herein by reference.

BACKGROUND OF THE INVENTION

1. Field of the Invention

This invention relates to a semiconductor memory device capable of storing 2-level or more data in, for example, a single memory.

2. Description of the Related Art

For example, in a NAND flash memory, each of a plurality of memory cells arranged in the row direction is connected via a bit line to the corresponding latch circuit. Each latch circuit holds data in writing or reading data. The plurality of cells arranged in the row direction are written into or read from simultaneously.

Furthermore, to store large volumes of data, a level memory capable of storing 2 bits or more in a single memory has been developed. Moreover, with the miniaturization of elements, the effect of capacity coupling between the floating gates of a plurality of adjacent cells has become a problem. Specifically, when data is written into a memory cell, the threshold voltage of a memory cell adjacent to the memory cell and previously written into rises due to capacity coupling.

For this reason, the following method has been proposed: for example, when data is read from a first memory cell, the threshold voltage of a second memory cell adjacent to the first memory cell and written into later than the first memory cell is detected, and a correction value corresponding to the detected threshold voltage is added to a read-out voltage in reading data from the first memory cell, thereby reading the data from the first memory cell (e.g., Jpn. Pat. Appln. KOKAI Publication No. 2004-326866).

However, the capacitance between the floating gates of adjacent cells varies very widely from chip to chip or from one word line to another. For this reason, it has been difficult to determine an appropriate correction value. Therefore, a semiconductor memory device capable of setting an appropriate correction value according to the capacitance between the floating gates of adjacent cells has been desired.

BRIEF SUMMARY OF THE INVENTION

According to a first aspect of the invention, there is provided a semiconductor memory device comprising: a memory cell array in which a plurality of memory cells are arranged in a matrix, each of said plurality of memory cells storing a plurality of bits; a storage portion which is formed so as to store a correction level; and a control portion which is formed so as to read a threshold level of a second memory cell adjacent to a first memory cell in the memory cell array and which reads the correction level from the storage portion according to the threshold level read from the second memory cell, adds the read-out correction level to a threshold level of the first memory cell, and reads the threshold level of the first memory cell.

According to a second aspect of the invention, there is provided a semiconductor memory device comprising: a memory cell array in which a plurality of memory cells are arranged in a matrix, each of said plurality of memory cells storing a plurality of bits; a first memory cell in the memory cell array; a second memory cell which is adjacent to the first memory cell and is written into later than the first memory cell; a third memory cell which is selected simultaneously with the first memory cell and into which a constant threshold level is written; a fourth memory cell which is selected simultaneously with the second memory cell and into which the constant threshold level is written; and a control portion which reads a threshold level of the third memory cell when a threshold level of the first memory cell is read and which adds a first correction level corresponding to the read-out threshold level and a second correction level corresponding to a threshold level of the second memory cell to a read level of the first memory cell and read the threshold level of the first memory cell.

According to a third aspect of the invention, there is provided a memory system comprising: a memory cell array in which a plurality of memory cells are arranged in a matrix and which has a first memory cell for storing write data and a second memory cell for storing an error correction bit for the data in the first memory cell; an error correcting portion which corrects an error in the data read from the first memory cell on the basis of the data read from the first and second memory cells; and a control portion which reads data from the first and second memory cells at a plurality of read levels a plurality of times to create probability data used in the error correcting portion.

According to a fourth aspect of the invention, there is provided a memory system comprising: a memory cell array in which a plurality of memory cells are arranged in a matrix, each of said plurality of memory cells storing a plurality of bits; a first memory cell in the memory cell array; a second memory cell which is adjacent to the first memory cell and is written into later than the first memory cell; a control portion which reads a threshold level of the first memory cell at an n number of read levels (n is a natural number) and further reads a threshold level of the second memory cell at a k number of read levels (k is equal to or smaller than n); and a controller which counts the number of first logical levels read at the n number of read levels and which finds the amount of change in the threshold level of the second memory cell read at the k number of read levels, corrects the result of the counting according to the amount of change, and outputs the corrected data as read-out data.

According to a fifth aspect of the invention, there is provided a memory system comprising: a memory cell array in which a plurality of memory cells are arranged in a matrix, each of said plurality of memory cells storing a plurality of bits; a first memory cell in the memory cell array; a second memory cell which is adjacent to the first memory cell and is written into later than the first memory cell; a third memory cell which is selected simultaneously with the first memory cell and into which a constant threshold level is written; a fourth memory cell which is selected simultaneously with the second memory cell and into which a constant threshold level is written; an error correcting portion which corrects an error in the read-out data on the basis of the data read from said plurality of memory cells; and a control portion which not only reads data from the first memory cell at a plurality of read levels a plurality of times but also reads a threshold level of the third memory cell to create probability data used in the error correcting portion and which adds a first correction level corresponding to the read-out threshold level of the third memory cell and a second correction level corresponding to a threshold level of the second memory cell to the data read from the first memory cell and uses the corrected data as the probability data.

According to a sixth aspect of the invention, there is provided a memory system comprising: a memory cell array in which a plurality of memory cells are arranged in a matrix, each of said plurality of memory cells storing a plurality of bits; a first memory cell in the memory cell array; a second memory cell which is adjacent to the first memory cell and is written into later than the first memory cell; a control portion which reads not only a threshold level of the first memory cell at an n number of read levels (n is a natural number) but also a threshold level of the second memory cell at an k number of read levels (k is equal to or smaller than n), thereby finding the threshold level of the second memory cell; and a controller which counts the number of first logical levels read from the first memory for each threshold level of the second memory cell, estimates the center value of the threshold levels written into the first memory cell on the basis of the result of the counting, and corrects the read level according to the center value.

BRIEF DESCRIPTION OF THE SEVERAL VIEWS OF THE DRAWING

FIG. 4 is a sectional view of a NAND flash memory;

FIG. 5 is a table listing examples of the voltages supplied to various regions in FIG. 4;

FIG. 6 shows the sequence in which a memory cell is read from;

FIGS. 7A to 7G show examples of threshold levels written into a memory cell;

FIG. 12 is a flowchart to explain the operation of the second embodiment;

FIG. 14 shows a part of the relationship between threshold levels and read levels in a third embodiment of the invention;

FIG. 17 shows a part of the relationship between threshold levels and read levels following FIG. 16;

FIG. 21 is a circuit diagram of a data storage circuit;

FIG. 25 is a flowchart to explain the operation of modification 1;

FIG. 26 shows a part of the relationship between the threshold level and the read level in modification 1;

Figure 27:
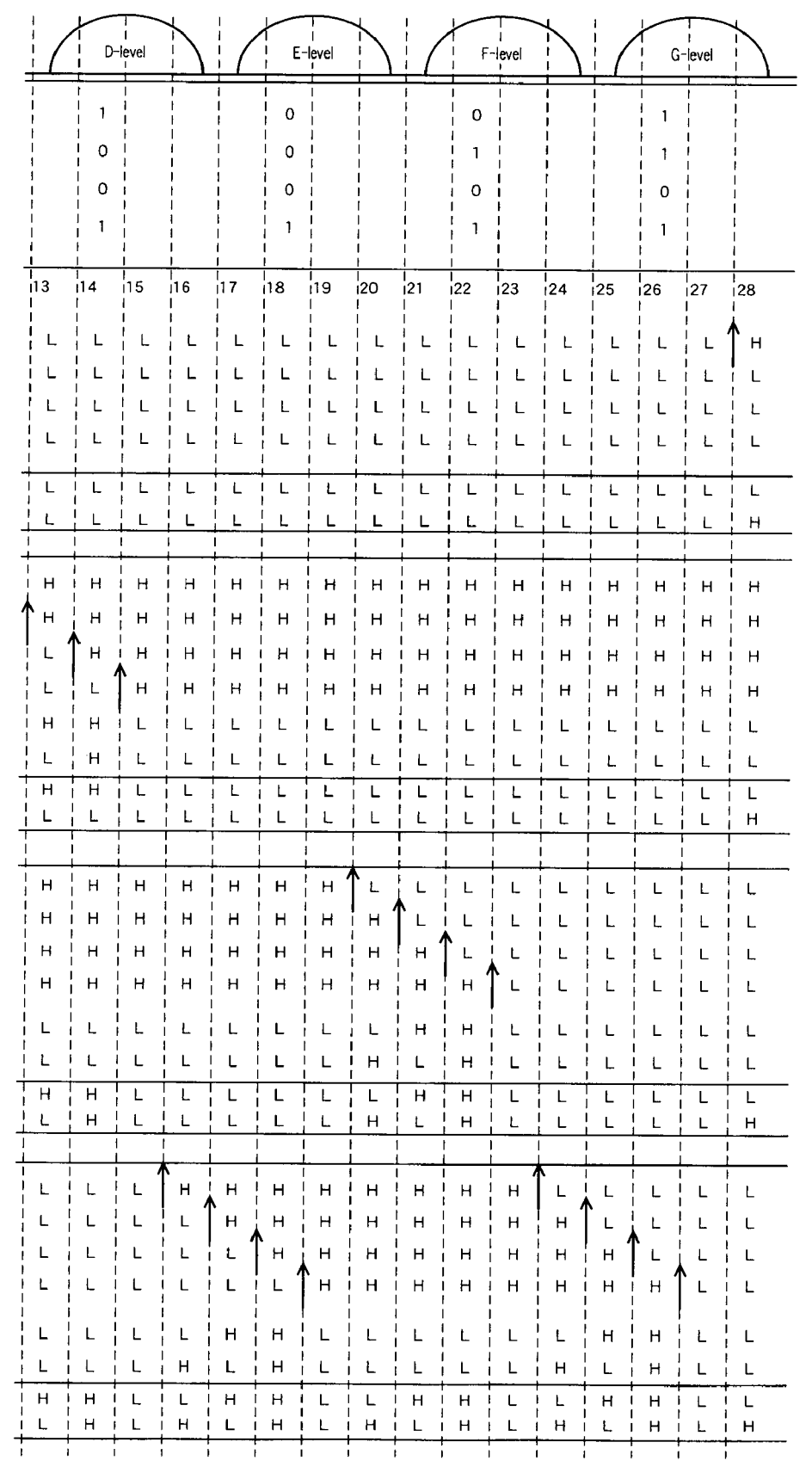

FIG. 27 shows a part of the relationship between the threshold level and the read level, following FIG. 26;

FIG. 28 shows a part of the relationship between the threshold level and the read level, following FIG. 27;

Figure 32:
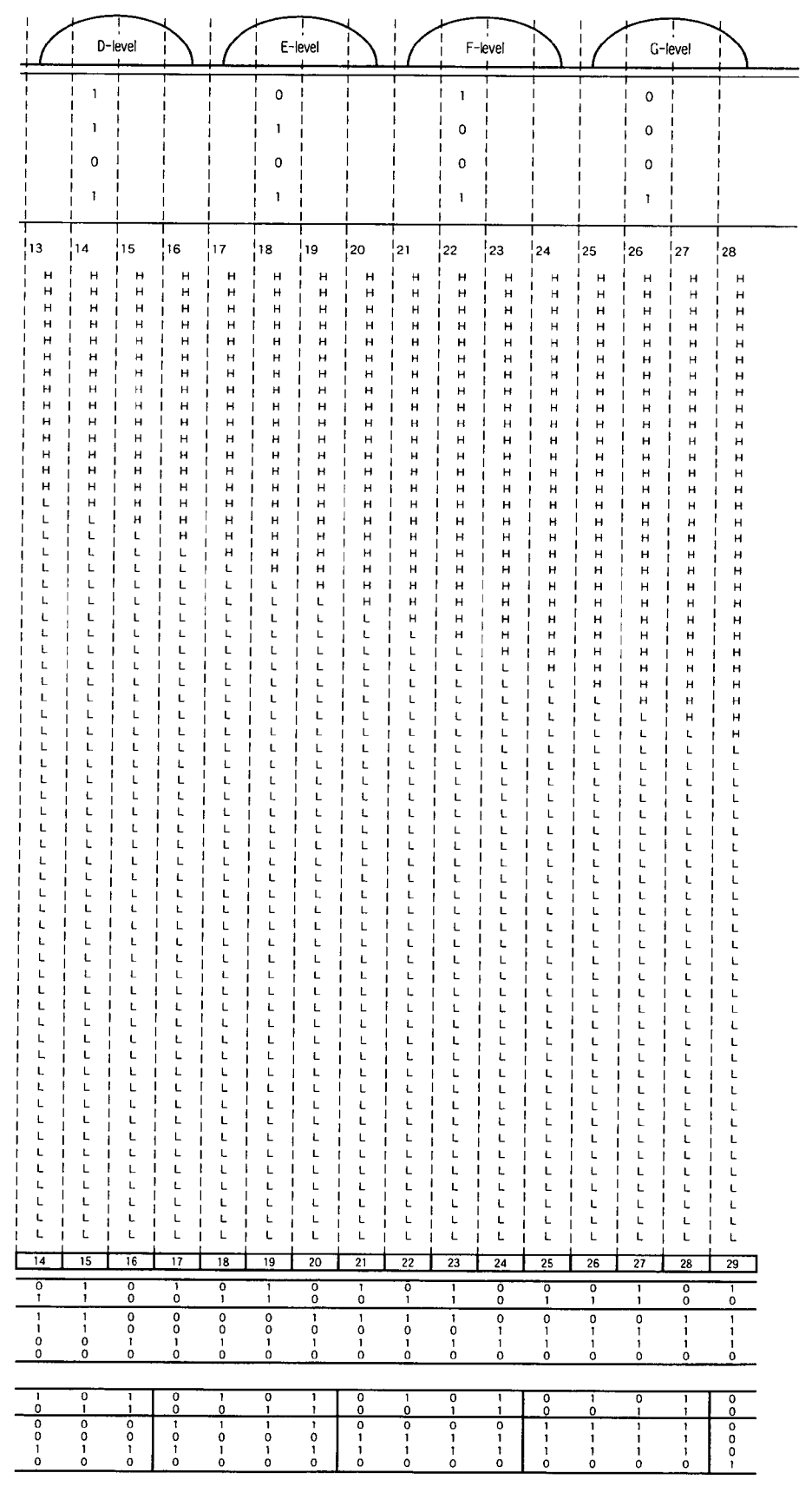

FIG. 32 shows a part of the relationship between the threshold level and the read level, following FIG. 31;

FIG. 35 shows a table listing an example of written data in modification 2;

FIGS. 41A and 41B show the number of "Hs" after each page is corrected as described above in the fourth embodiment;

FIG. 44 shows the number of times "H" was read according to the amount of change in the threshold level in a sixth embodiment of the invention;

FIG. 45 shows the number of times "H" was read according to the amount of change in the threshold level, following FIG. 44;

DETAILED DESCRIPTION OF THE INVENTION

Hereinafter, referring to the accompanying drawings, embodiments of the invention will be explained.

Figure 1:
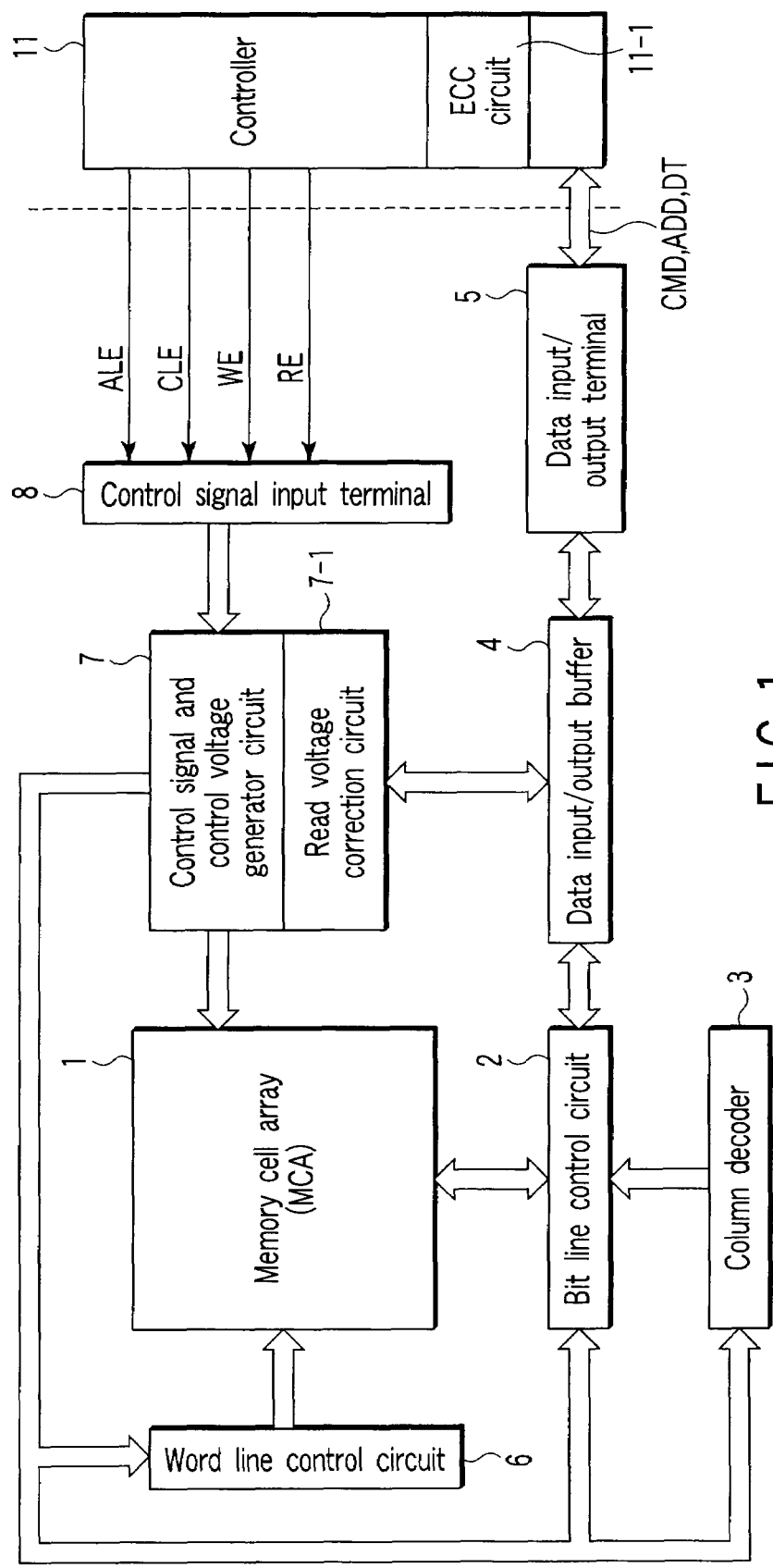
FIG. 1 schematically shows the configuration of a NAND flash memory.

FIG. 1 shows a schematic configuration of a NAND flash memory which stores, for example, 3-bit, 8-level data.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal 5 to the outside. The data input/output terminal 5 is connected to a controller 11 outside the memory chip. The controller 11, which is composed of, for example, a microcomputer, receives the data output from the data input/output terminal 5. The controller 11 outputs various commands for controlling the operation of the NAND flash memory, addresses ADD, and data DT. The write data input to the data input/output terminal 5 from the controller 11 is supplied via the data input/output buffer 4 to the data storage circuit selected by the column decoder 3. The commands and addresses are supplied to a control signal and control voltage generator circuit 7.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by the control signal and control voltage generator circuit 7. The control signal and control voltage generator circuit 7 is connected to a control signal input terminal 8 and is controlled by control signals address latch enable (ALE), command latch enable (CLE), write enable (WE), and read enable (RE) input via the control signal input terminal 8 from the controller 11.

The bit line control circuit 2, column decoder 3, word line control circuit 6, and control signal and control voltage generator circuit 7 constitute a write circuit and a read circuit.

The control signal and control voltage generator circuit 7 has a read voltage correction circuit 7-1 and a dynamic data cache (DDC) control circuit (not shown). The DDC control circuit generates a control signal for controlling the refresh operation of a plurality of DRAMs acting as a dynamic latch circuit included in the data storage circuit described later.

Figure 2:
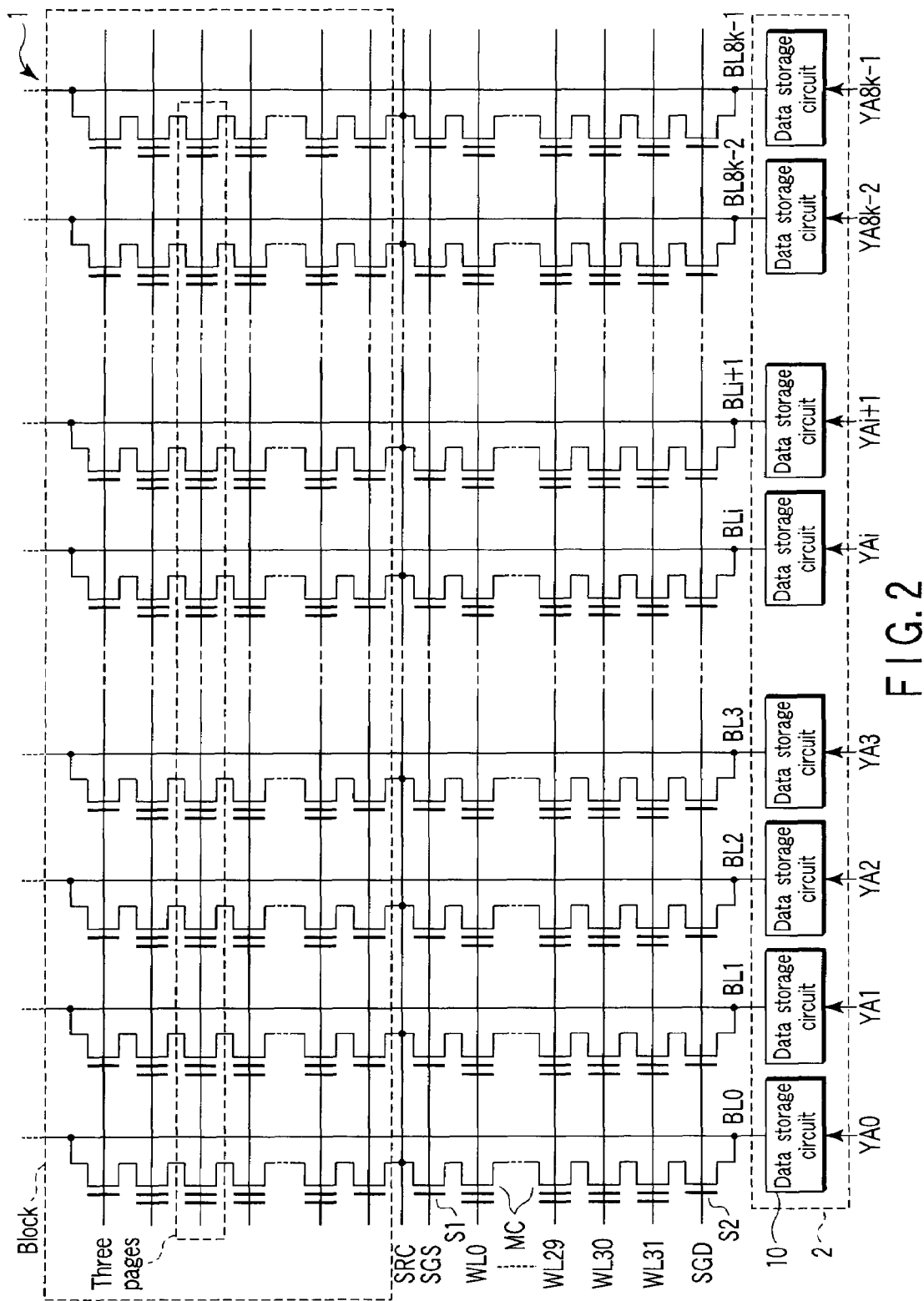
FIG. 2 is a circuit diagram showing an example of the configuration of the memory cell array and bit line control circuit in FIG. 1.

FIG. 2 shows a configuration of the memory cell array 1 and bit line control circuit 2 shown in FIG. 1. FIG. 2 shows a case where all the cell arranged in the row direction are written into simultaneously. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BLOe and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Bit lines BL0, BL1, . . . , BLi, BL8k-2, BL8K-1 are connected to the individual data storage circuits 10.

The memory cell array 1 includes a plurality of blocks as shown by a broken line. Each block is composed of a plurality of NAND cells. In the memory cell array 1, data is erased in, for example, blocks.

A plurality of memory cells connected to a single word line (or the memory cells enclosed by a broken line) constitute one sector. Data is written or read in sectors. Specifically, data is simultaneously written into or read from all of the memory cells arranged in the row direction.

In a read operation, a program verify operation, and a program operation, all the bit lines connected to the data storage circuits 10 are selected. Furthermore, a single word line is selected according to an external address, with the result that a third page enclosed by a broken line is selected. Switching to the third page is done by an address.

Figure 3A:
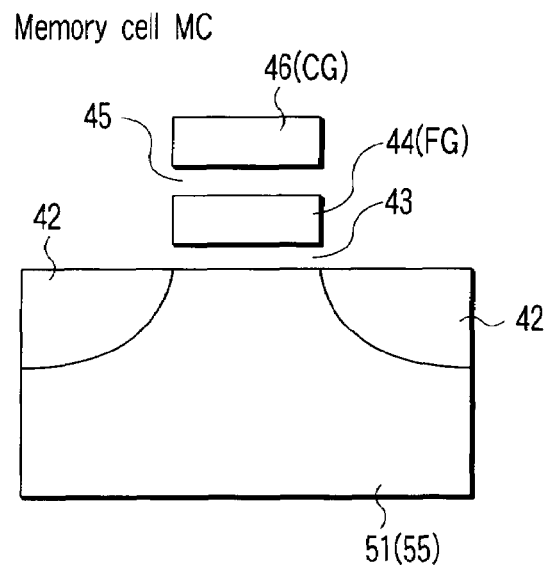
FIGS. 3A and 3B are sectional views of a memory cell and a select transistor, respectively.
Figure 3B:
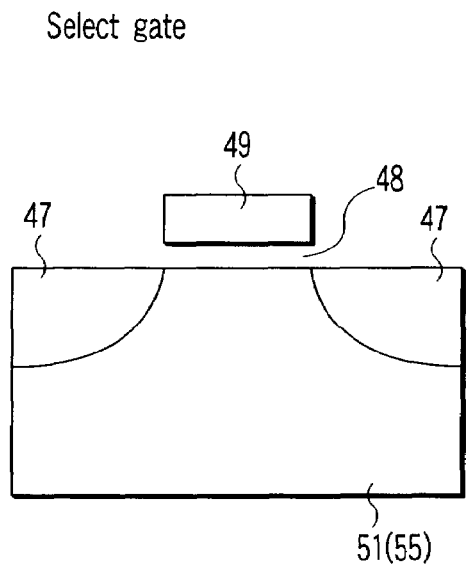

FIGS. 3A and 3B show a sectional view of a memory cell and that of a select transistor, respectively. FIG. 3A shows a memory cell. In a substrate 51 (or a p-well region 55 described later), an n-type diffused layer 42 acting as the source and drain of a memory cell is formed. Above the p-well region 55, a floating gate (FG) 44 is formed via a gate insulating film 43. Above the floating gate 44, a control gate (CG) 46 is formed via an insulating film 45. FIG. 3B shows a select gate. In the p-well region 55, an n-type diffused layer 47 acting as a source and a drain is formed. Above the p-well well region 55, a control gate 49 is formed via a gate insulating film 48.

FIG. 4 is a sectional view of a semiconductor memory device according to the first embodiment. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 4, the high-voltage transistors HVNTr, HVPTr have, for example, a thicker gate insulating film than that of the low-voltage transistors LVNTr, LVPTr. The peripheral circuits 2 to 8 in FIG. 1 are also composed of low-voltage transistors LVNTr, LVPTr, and high-voltage transistors HVNTr, HVPTr.

FIG. 5 is a table listing examples of the voltages supplied to various regions in FIG. 4 in erasing, programming, and reading a memory cell.

First Embodiment

Figure 6:
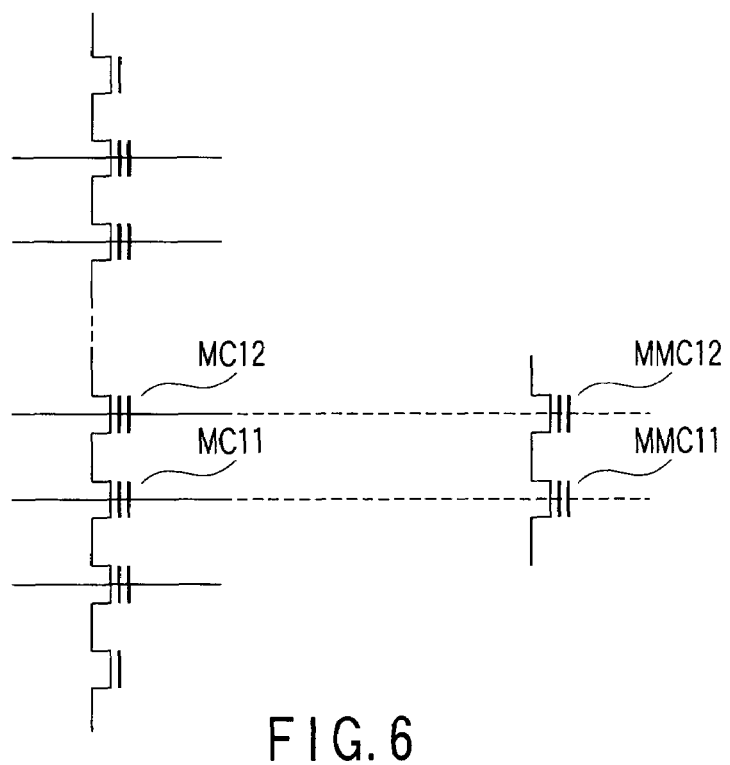

As shown in FIG. 6, for example, when the data is read from cell MC11 in a first embodiment of the invention, first the threshold voltage (also referred to as the threshold level) of the data in cell MC12 written into later than cell MC11 is checked and the value read from cell MC11 at a read level corresponding to the threshold level is determined to be the read-out data from cell MC11.

As shown in FIG. 7A, first data is written into cell MC11. Thereafter, as shown in FIG. 7B, before adjacent cell MC12 is written into, that is, when the adjacent cell is at the erase level, the data read at read levels AR, BR, CR is the read-out data from cell MC11.

Moreover, as shown in FIG. 7C, for example, if the adjacent cell is written into from erase level E to level A, the threshold level should have fluctuated because of the capacitance between floating gates. For this reason, shift values DA1, DB1, DC1 are added to the read levels AR, BR, CR, respectively, producing levels AR+DA1, BR+DB1, CR+DC1. Then, the values read at levels AR+DA1, BR+DB1, CR+DC1 are determined to be the read-out data.

In addition, as shown in FIG. 7D, for example, when the adjacent cell has been written into from erase level E to B-level, shift values DA2, DB2, DC2 are added to the read levels AR, BR, CR, respectively, producing levels AR+DA2, BR+DB2, CR+DC2. Then, the values read at levels AR+DA2, BR+DB2, CR+DC2 are determined to be the read-out data.

Furthermore, as shown in FIG. 7E, for example, when the adjacent cell is written into from erase level E to C-level, shift values DA3, DB3, DC3 are added to the read levels AR, BR, CR, respectively, producing levels AR+DA3, BR+DB3, CR+DC3. Then, the values read at levels AR+DA3, BR+DB3, CR+DC3 are determined to be the read-out data.

Since DA1, DB1, and DC1 have almost the same value, only one level D1 is held as a parameter. Similarly, for DA2, DB2, and DC2, only D2 is held as a parameter. For DA3, DB3, and DC3, only D3 is held as a parameter. If the erase level of the adjacent cell is −1V, A-level is 0.5V (A-level=0.5V), B-level is 1.7V (B-level=1.7V), and C-level is 3V (C-level=3V), D1, D2, and D3 are roughly proportional to the variation in the adjacent cell. It follows that D1=0.5−(−1)=1.5, D2=1.7−(−1)=2.7, and D3=3−(−1)=4. This gives D1:D2:D3=1:1.8:2.7.

Figure 8:
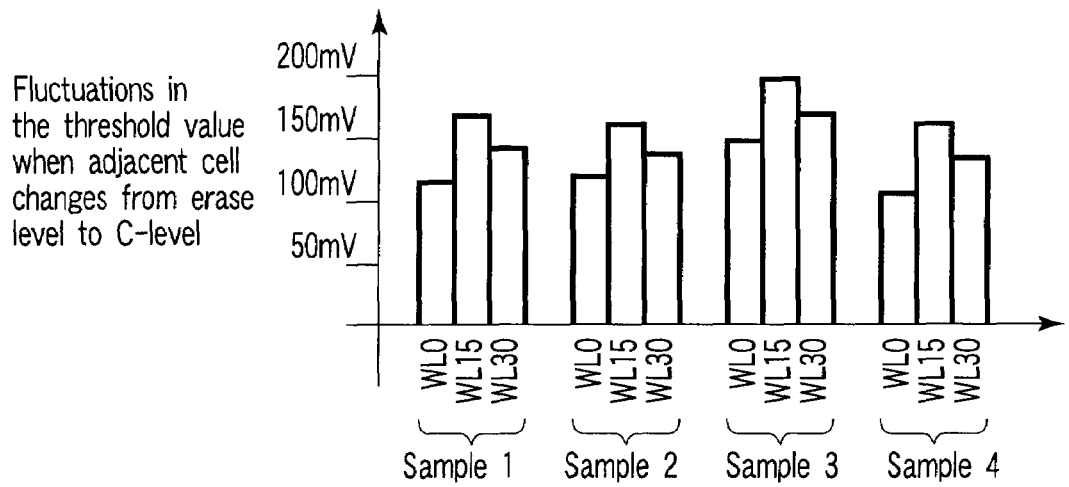
FIG. 8 shows the way the threshold level changes due to a change in the threshold level of an adjacent cell.

FIG. 8 shows the values obtained by actually measuring changes in the threshold level of cell MC11 when, for example, adjacent cell MC12 changed from erase level E to C-level. As seen from FIG. 8, the threshold level varies according to the position of word line WL in each sample.

Figure 9:
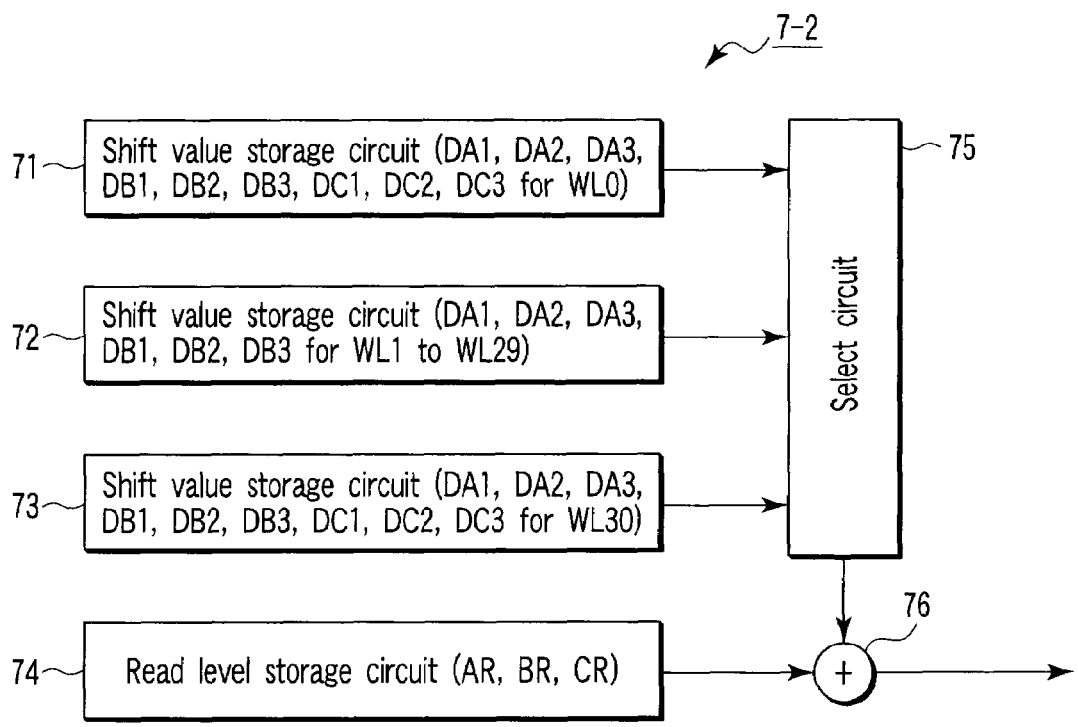
FIG. 9 shows a configuration of a first embodiment of the invention.

FIG. 9 shows a configuration of a read voltage correction circuit 7-1 according to the first embodiment. The read voltage correction circuit 7-1 is provided in, for example, the control signal and control voltage generator circuit 7 of FIG. 1. The read voltage correction circuit 7-1 includes shift value storage circuits 71, 72, 73, a read level storage circuit 74, and a select circuit 75. For example, at the time of chip die sort testing, the read voltage correction circuit 7-1 trims the individual shift values DA1, DB1, DC1 and DA2, DB2, DC2, and DA3, DB3, DC3 shown in FIGS. 7C, 7D, and 7E. The trimmed shift values are stored in the shift value storage circuits 71, 72, 73, respectively. The shift values stored in the shift value storage circuits 71, 72, 73 are read into the select circuit 75 according to the corresponding reading. An adder 76 adds the shift value selected by the select circuit 75 to the read level read from the read level generator circuit 74. The control signal and control voltage generator circuit 7 generates a read voltage on the basis of the read level supplied from the adder 76.

Here, word line WL1 to word line WL29 are set as one parameter. In the trimming, for example, after cell MC11 shown in FIG. 6 is written to the A-level, B-level, or C-level, the threshold level of the adjacent cell MC12 is written from erase level E to C-level. Thereafter, the A, B, or C read level is changed gradually and the value at the time when the cell goes on is determined to be a shift value. In the case of the NAND flash memory, since all the cells connected to a word line are read at the same time, it is possible to take the average of the values read simultaneously from the plurality of cells.

Moreover, in the case of the NAND flash memory where half of the cells connected to a word line are read at a time, it is possible to get the average of the threshold levels read from half of the cells at a time.

Furthermore, instead of trimming each of D1, D2, and D3, one of them may be trimmed and the rest be found from the following relationship: D1:D2:D3=1:1.8:2.7. The shift values found in this way are stored into the shift value storage circuits 71, 72, 73, respectively.

The shift value storage circuit may be composed of nonvolatile storage elements. Alternatively, the data may be stored in memory cells in the memory cell array and, when the power is turned on, the data may be read from the memory cells and stored into the registers of the shift storage circuits.

Figure 10:
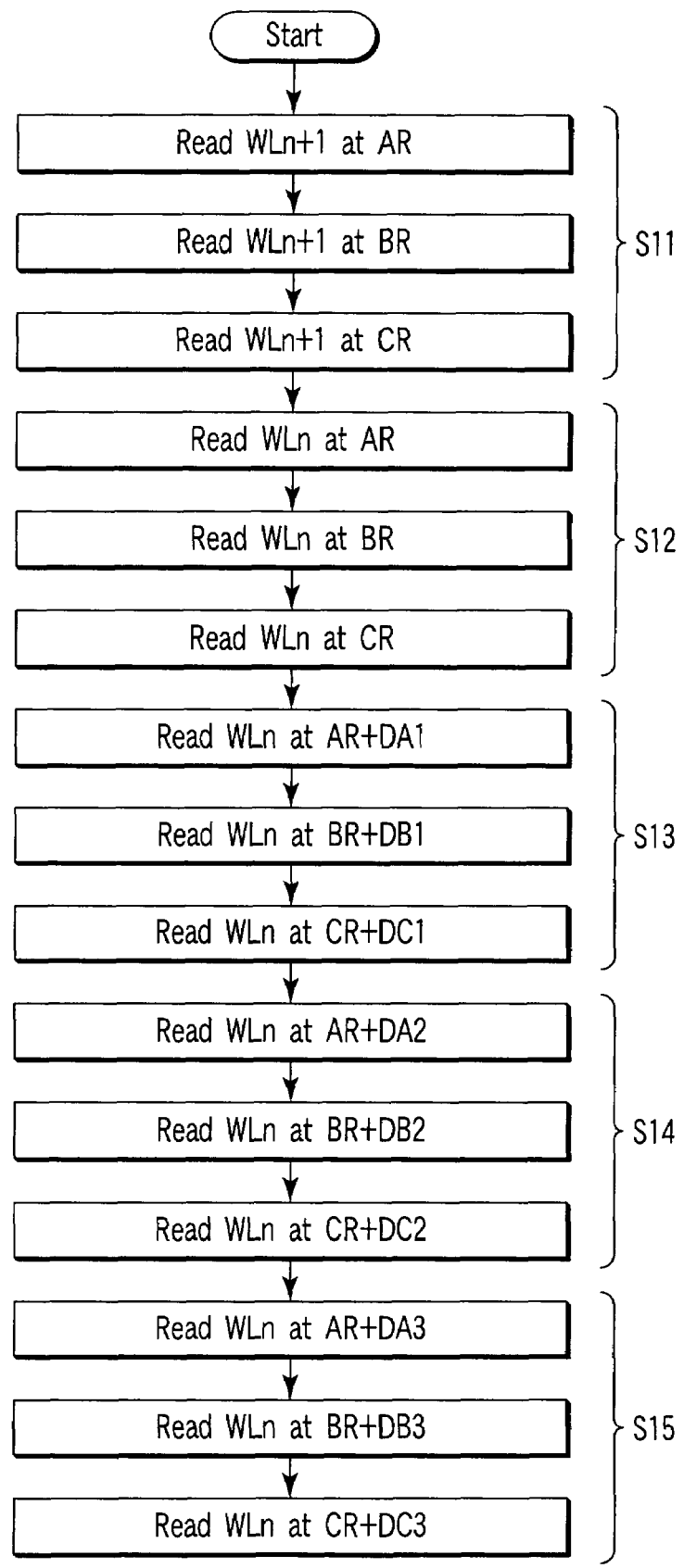
FIG. 10 is a flowchart to explain the operation of the first embodiment.

FIG. 10 is a flowchart to help explain the operation of reading the memory cells connected to, for example, word line WLn. When word line WLn is selected, first the memory cells connected to word line WLn+1 are read at read levels AR, BR, and CR sequentially and it is determined at which level the threshold level is (S11). Thereafter, the memory cells connected to word line WLn are read at read levels AR, BR, and CR sequentially and it is determined at which level the threshold level is (S12). Thereafter, the memory cells connected to word line WLn are read at read levels AR+DA1, BR+DB1, and CR+DC1 sequentially and it is determined at which level the threshold level is (S13). Next, the memory cells connected to word line WLn are read at read levels AR+DA2, BR+DB2, and CR+DC2 sequentially and it is determined at which level the threshold level is (S14). Then, the memory cells connected to word line WLn are read at read levels AR+DA3, BR+DB3, and CR+DC3 sequentially and it is determined at which level the threshold level is (S15).

In this way, the threshold level of the memory cells connected to word line WLn+1 is read. A correction value is added according to the threshold level and the threshold level of the memory cells connected to word line WLn is read. From the result of the reading, the data read at an appropriate level is selected and determined to be the reading result. Accordingly, it is possible to read the data in the memory cell accurately, while suppressing a fluctuation in the threshold level caused by the writing of adjacent cells.

In the first embodiment, the shift value of the threshold level is found word line by word line for each chip. Using the shift value, the read level is corrected and the data in the memory cells is read. Consequently, even when the amount of change in the threshold level of adjacent cells differs according to the capacitance between the floating gates (FG-FG) of adjacent memory cells for each word line and for each chip, the threshold level of the memory cell can be read accurately.

In the first embodiment, the shift value has been trimmed word line by word line for each chip and the resulting values have been set as correction values. The invention is not limited to this. For instance, the shift value may be trimmed chip by chip so as to determine a single shift value and a correction may be made according to the single shift value.

Moreover, when a variation in the shift value for each word line is small, it is unnecessary to do trimming word line by word line.

Furthermore, when a variation in the shift value for each chip is small, a fixed shift value differing from one word line to another may be set in a chip without trimming for each chip.

Second Embodiment

Figure 11:
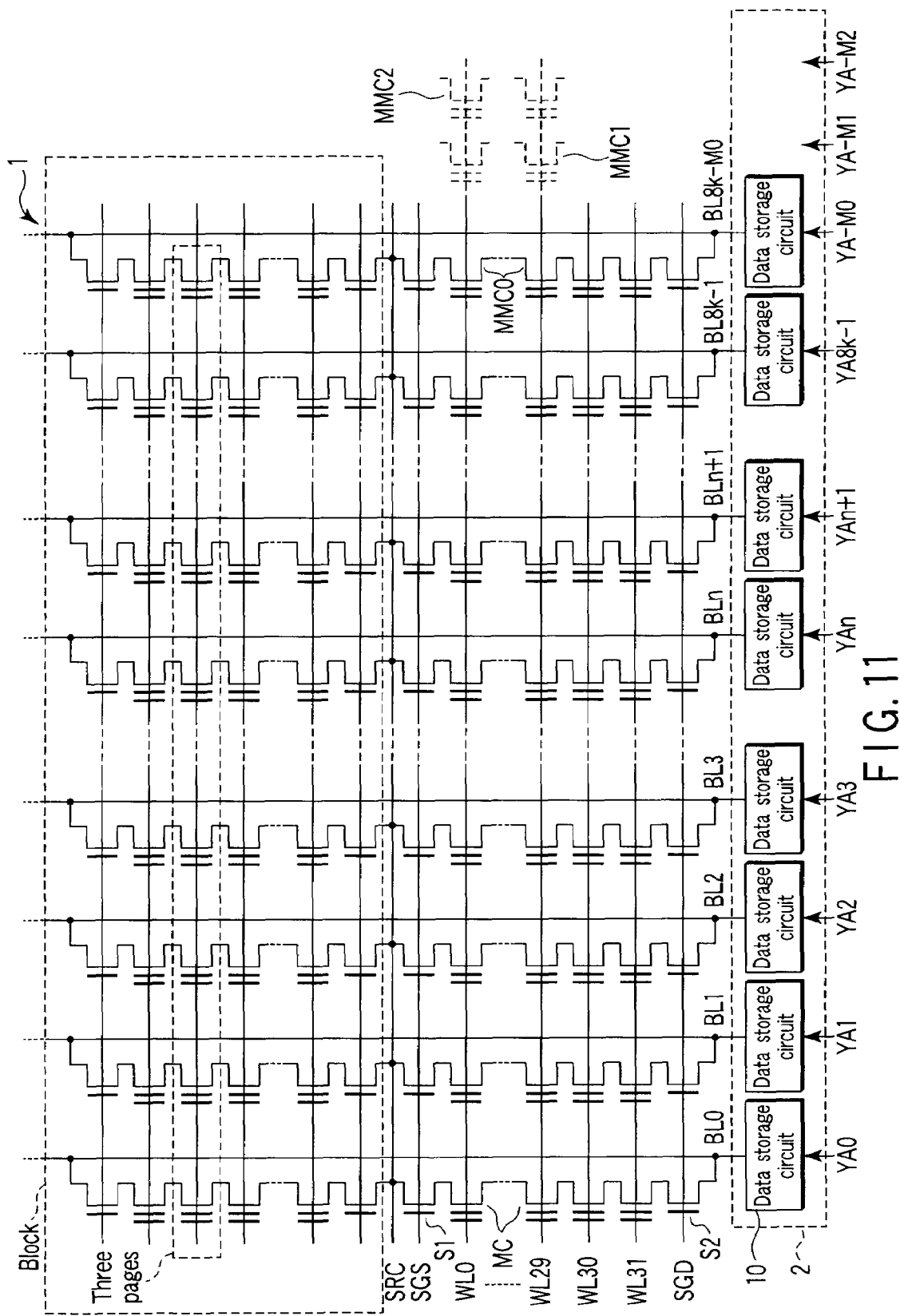
FIG. 11 is a circuit diagram of a memory cell array applied to a second embodiment of the invention.

FIG. 11 shows a second embodiment of the invention. In the first embodiment, the shift values D1, D2, and D3 have been trimmed word line by word line for each chip and these shift values D1, D2, and D3 have been stored as parameters into the storage circuits 71, 72, and 73. In contrast, in the second embodiment, monitor cells are provide in the memory cell array 1, monitor levels are set in the monitor cells, and the read levels of the individual memory cells are determined according to the monitor levels.

Specifically, as shown in FIG. 11, the memory cell array 1 includes, for example, a plurality of monitor cells MMC0. The monitor cells MMC0 are connected to, for example, bit line BL-M0. Bit line BL-M0 is connected to each of the data storage circuits 10 and supplied with monitor cell address YA-M0. The monitor cell MMC0 is selected by the address YA-M0 and row address. That is, the monitor cell MMC0 is selected at the same time when the memory cell sharing a word line with the monitor cell MMC0 is selected. Of A-level, B-level, or C-level, for example, C-level is always written into the monitor cell MMC0. The number of monitor cells connected to one word line is not limited to 1. Like MMC1 and MMC2 shown by broken lines in FIG. 11, for example, another two or more monitor cells may be added to a single word line and one of the levels read from three or more monitor cells may be decided by majority.

With the above configuration, the operation will be explained with reference to FIGS. 6, 7, and 12. FIG. 6 shows a case where one monitor cell is connected to one word line. First, for example, when data is written into cell MC11 of FIG. 6, for example, C-level is written into monitor cell MMC11 selected together with cell MC11 (S21). Next, after cell MC11 is written into, when cell MC11 is read before cell MC12 is written into, the threshold level of monitor cell MMC11 written into at the same time when cell MC12 is written into is checked (S22). At this time, monitor cell MMC12 selected together with cell MC12 has not been written into. For this reason, since monitor cell MMC11 has been unaffected by the coupling between FG and FG, the threshold level of the monitor cell MMC11 has not fluctuated. Therefore, cell MC11 is read out at the read levels AR, BR, and CR. When cell MC12 is written into, C-level is written into monitor cell MMC12 selected together with cell MC12 (S23). Thereafter, when cell MC11 is read, first the threshold level of monitor cell MMC11 written into at the same time when cell MC11 is written into. Since monitor cell MMC 12 selected together with cell MC12 has been written into, the threshold level of monitor cell MMC11 has fluctuated because of the effect of the coupling between FG and FG. Accordingly, the shift value is determined by detecting a fluctuation in the threshold level of monitor cell MMC11.

Specifically, as shown in FIGS. 7A and 7F, when neither memory cell MC12 nor monitor cell MMC12 has been written into, monitor cell MMC11 selected together with memory cell MC11 has a C-level threshold distribution as shown in FIG. 7B. For this reason, if reading is done at a level of CR+x, monitor cell MMC11 goes on. From this, it is seen that neither memory cell MC12 nor monitor cell MMC12 has been written into. The data read from memory cell MC11 is the data read at AR, BR, and CR.

On the other hand, when memory cell MC12 and monitor cell MMC12 have been written into, monitor cell MMC11 selected together with memory cell MC11 has a C-level threshold distribution shown in FIG. 7G. For this reason, if reading is done at a level of CR+x, monitor cell MMC11 goes off. Therefore, if reading is done at a level of "CR+x+α" raised from CR+x by α, monitor cell MMC11 goes on. From this, it is seen that memory cell MC12 and monitor cell MMC12 have been written into. Accordingly, in reading memory cell MC11, appropriate data is selected according to the data in MC12 from the result of reading at levels obtained by adding a correction value of "α" (DA3, DB3, DC3) to AR, BR, CR. Therefore, determining "α" makes it possible to detect a shift value differing from one word line to another for each chip.

Figure 13:
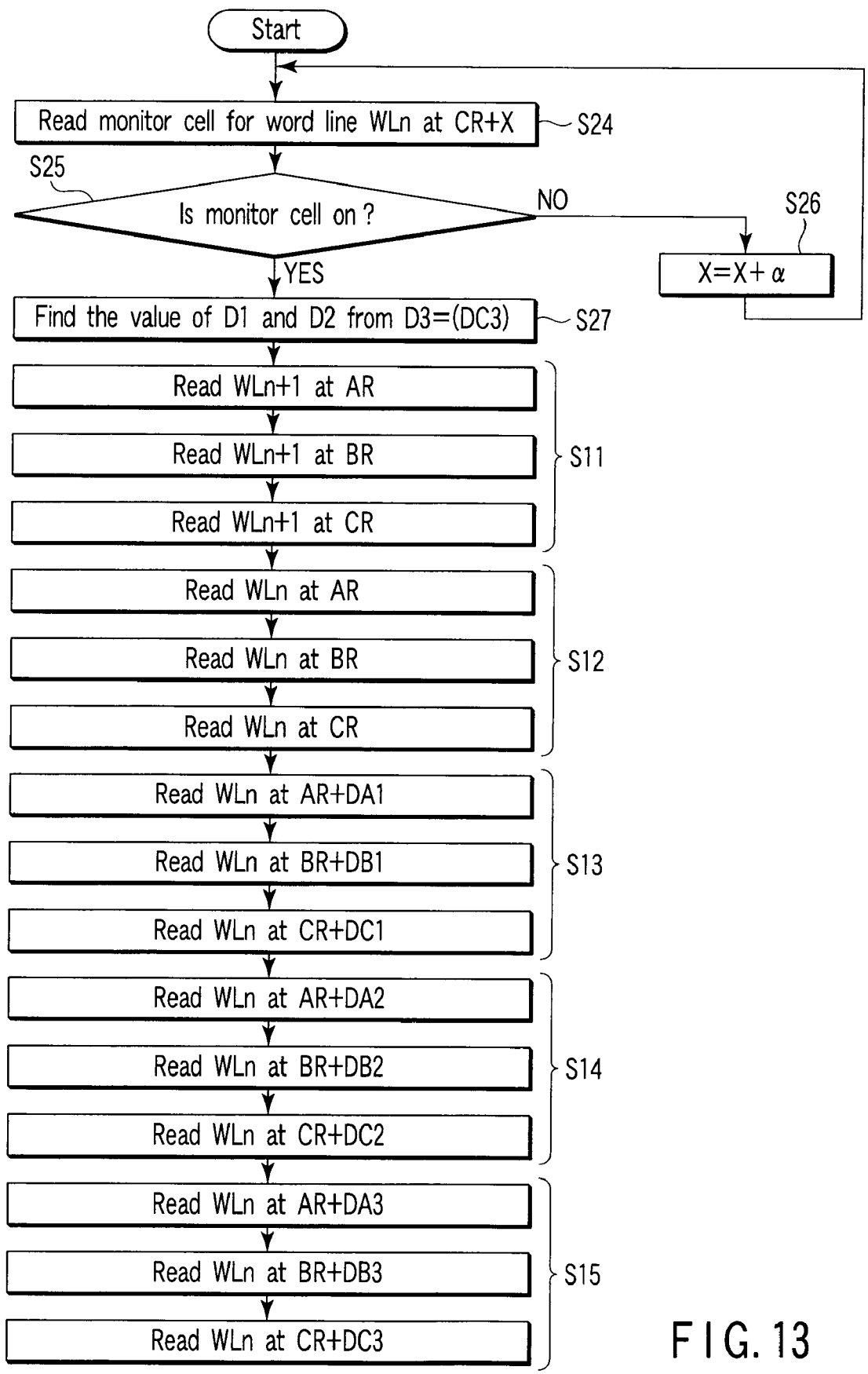
FIG. 13 is a flowchart to explain a read operation in the second embodiment.

FIG. 13 shows a read operation in the second embodiment. To detect the shift value of memory cell MC11, first the threshold level of monitor cell MMC11 is read at a read level of "CR+x" (S24). Then, it is determined whether monitor cell MMC11 has been turned on (S25). If monitor cell MMC11 has not been turned on, that is, if the read level is lower than the threshold level of monitor cell MMC11, the read level "x" is increased by, for example, "α" (S26) and reading is done again. When the operation of reading monitor cell MMC11 has been carried out in this way and monitor cell MMC11 has been turned on, the shift value DC3 of FIG. 7E can be detected. Specifically, since C-level is also written into monitor cell MMC11 adjacent to monitor cell MMC12 written to C-level, the shift values DA3, DB3, and DC3=D3 are known. Here, it is assumed that DA3=DB3=DC3, the values of D2 and D1 can be determined from the relational expression: D1:D2:D3=1:1.8:2.7 (S27).

Next, the same operation as in the first embodiment is performed. Specifically, it is determined whether the level of cell MC12 (the cell connected to word line WLn+1) has changed from erase level E to level E (no change in the threshold value), A-level, B-level, or C-level (S11). Thereafter, cell MC11 (the memory cell connected to word line WLn) is read at the read levels AR, BR, CR, sequentially and it is determined at which level the threshold level is (S12). Thereafter, memory cell (MC11) connected to word line WLn is read at the read levels AR+DA1, BR+DB1, CR+DC1 sequentially and it is determined at which level the threshold level is (S13). Next, memory cell (MC11) connected to word line WLn is read at the read levels AR+DA2, BR+DB2, CR+DC2 sequentially and it is determined at which level the threshold level is (S14). Moreover, memory cell (MC11) connected to word line WLn is read at the read levels AR+DA3, BR+DB3, CR+DC3 sequentially and it is determined at which level the threshold level is (S15). In this way, the threshold level of the memory cell connected to word line WLn+1 is read, a correction value is added according to the threshold level, and the threshold level of the memory cell connected to word line WLn is read out. From the read-out results, the data read at an appropriate level is selected and determined to be the read-out result. By doing this, the data in the memory cells can be read out accurately, while suppressing a fluctuation in the threshold level caused by the writing of adjacent cells.

In the second embodiment, a monitor cell MMC is provided in the memory cell array 1. When one of the threshold levels A, B, C is always written into the monitor cell MMC and the threshold level is read from a certain memory cell, the shift value D3 is detected from the amount of change in the threshold level of monitor cell MMC selected together with the memory cell, other related shift values D1, D2 are calculated from the shift value, and these shift values D1, D2, D3 are added to the read level, thereby reading the threshold level from the memory cell to be read from. For this reason, when data is written into a certain cell to suppress the effect of the coupling between adjacent cells, the following write operation required in the prior art need not be carried out: a certain cell is written into to a level lower than the original threshold level, then the adjacent cells around the cell are written into, and thereafter data is written into the original cell up to the original threshold level. Consequently, the write speed can be made faster.

Furthermore, when the data in a memory cell connected to word line WL is read, first a correction value for the effect of the coupling between adjacent cells varying from one chip to another or from one word line to another is determined using the monitor cell. Next, the threshold level of the memory cell connected to word line WLn+1 selected later than word line WL is read out. The previously determined correction value according to the read-out threshold level and the threshold level of the memory cell connected to word line WLn is read out. From the read-out results, the data read out at an appropriate level is selected and determined to be the read-out result. For this reason, the shift value need not be trimmed word line by word line in advance unlike in the first embodiment. Therefore, it is possible to simplify the test step. A plurality of monitor cells may be prepared for decision by a majority.

While in the second embodiment, all the cells arranged in the row direction have been written into in unison, the invention is not limited to this. For instance, the invention may be applied to a case where half of the cells arranged in the row direction are written into in unison.

Furthermore, in the second embodiment, the invention may be applied to a case where 4-level (2-bit) data, 8-level (3-bit) data, or 16-level (4-bit) data are stored.

Third Embodiment

FIGS. 14 to 17 show a third embodiment of the invention.

As described above, in the NAND flash memory, 2 KB (B: bytes) of data are simultaneously written into or read from all of or half of the cells arranged in the row direction. If the threshold level of the cell already written into has changed due to the effect of erroneous writing or the writing of adjacent cells, the accuracy of read-out data can decrease. To increase the accuracy of data, for example, 64-B ECC (Error Correction Code) code is added to 2-KB data, producing (2 KB+64 B) of data, which is written or read.

For this reason, for example, an ECC circuit 11-1 is provided in the controller 11. The ECC circuit 11-1 is designed to correct an error and output correct data, if incorrect data has been read from a memory cell. The ECC circuit 11-1 may be provided not only in the controller 11 but also in, for example, the NAND flash memory.

As the ECC code, for example, the BCH code used in correcting 4 to 8 bits or the Reed-Solomon code used in correcting 4 to 8 symbols is used. Moreover, the BCH code for correcting 100 or more bits or the Reed-Solomon code for correcting 100 or more symbols may be used. However, correcting 100 bits or 100 symbols using such codes causes a problem: the number of ECC codes added to data increases. To avoid this problem, the LDPC (Low Density Parity Check) code which suppresses an increase in the number of ECC codes and has a powerful correction capability is sometimes used these days.

Like other codes, the LDPC code is encoded by adding ECC codes to, for example, 16-KB data and writing the resulting data into memory cells. That is, the ECC circuit 11-1 of the controller 11 includes an encoder and a decoder (both not shown). The encoder adds an ECC code as, for example, a check bit to, for example, 16-KB data. The ECC-code-added data is written onto each page of the memory cell array 1. Therefore, a page of data is composed of writing data and a check bit. The decoder uses the check bit data read from the memory cell as a probability value and, on the basis of the probability value, corrects the data read from the memory cell. That is, on the basis of the probability value, the decoder corrects the incorrect data read from the memory cell and outputs the correct data. As described above, in the case of the LDPC code, if the read-out data is "1", the value of the provability that the read-out data is "1" is also needed.

FIGS. 14 to 17 show the allocation of data to be written into the memory cells of the NAND flash memory which stores 16-level (4-bit) data. Data is allocated in this order: FIG. 14, FIG. 15, FIG. 16, and FIG. 17. 4 bits are distinguished by a lower page, an upper page, a higher page, and a top page selected by addresses. In FIGS. 14 to 17, broken lines 0 to 64 indicate read levels.

Figure 26:
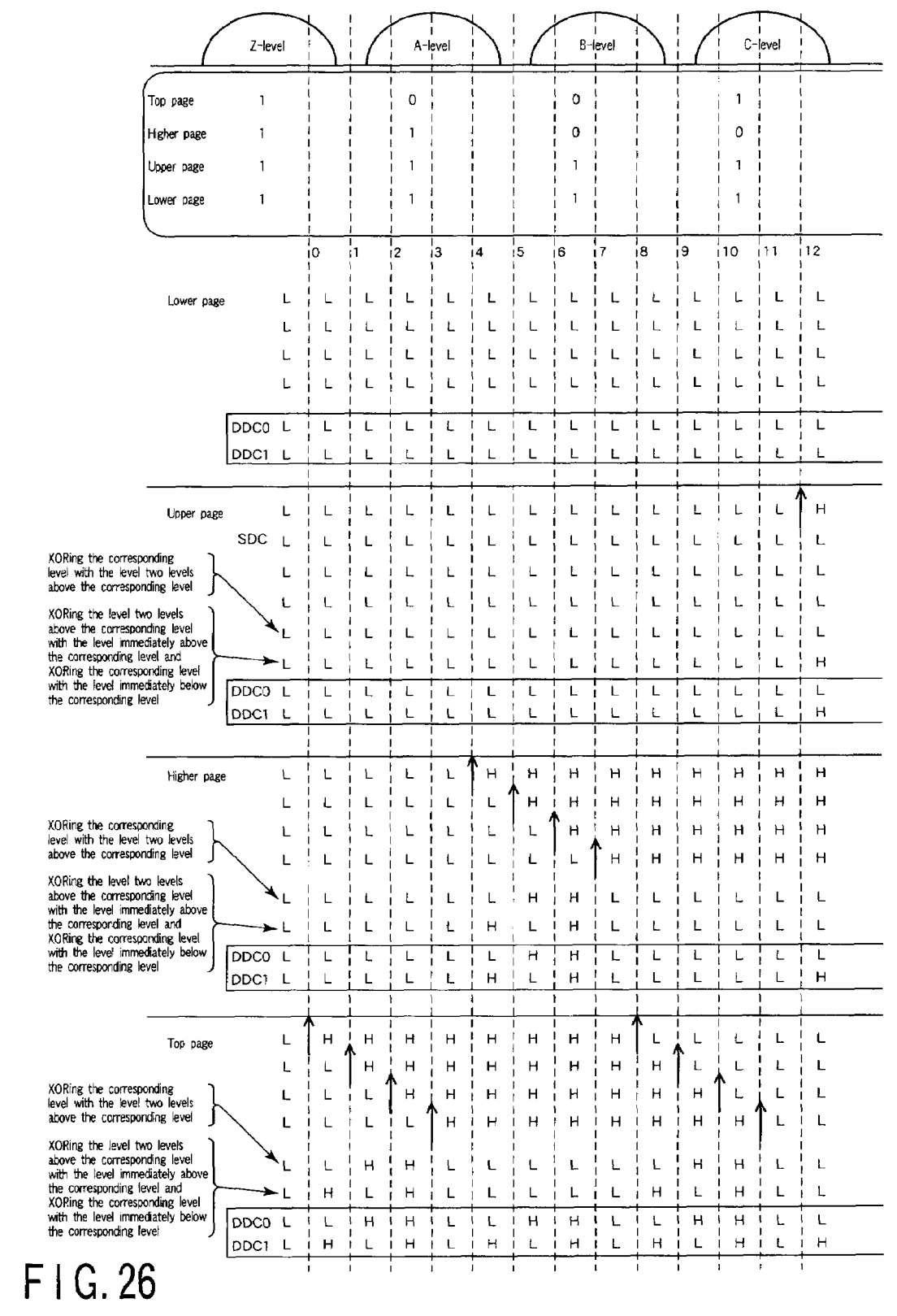

In a normal read operation, reading is done at a read level at the boundary between threshold distributions. For example, on the lower page of FIG. 14, the threshold level of the memory cell is read at read level 29 in FIG. 26 and it is determined whether the threshold level of the memory cell is equal to or higher than H-level or lower than H-level. If the threshold level is equal to or higher than H-level, the memory cell goes off, resulting in "H" (data "0"). If the threshold level is lower than H-level, the memory cell goes on, resulting in "L" (data "1").

Figure 14:
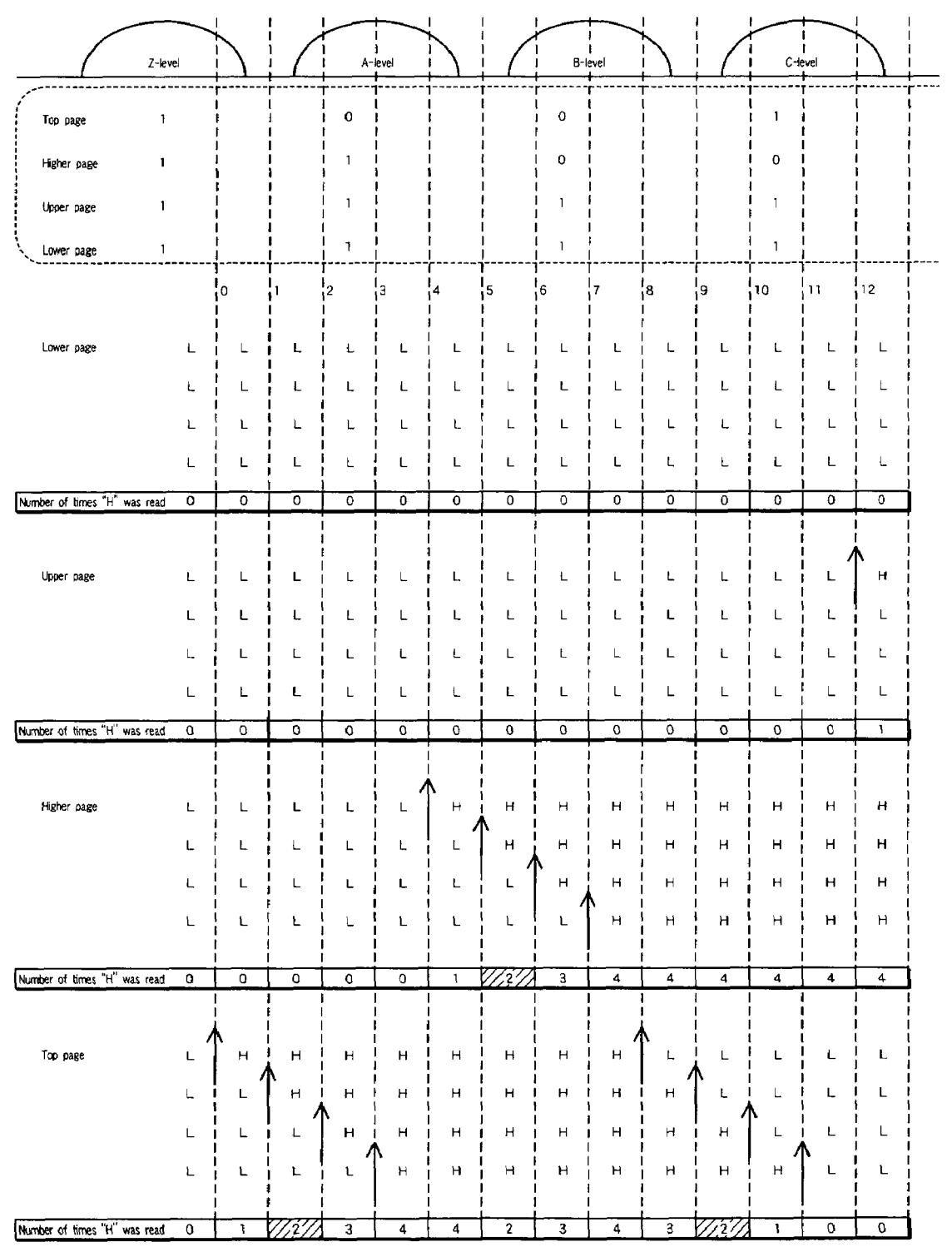
Figure 15:
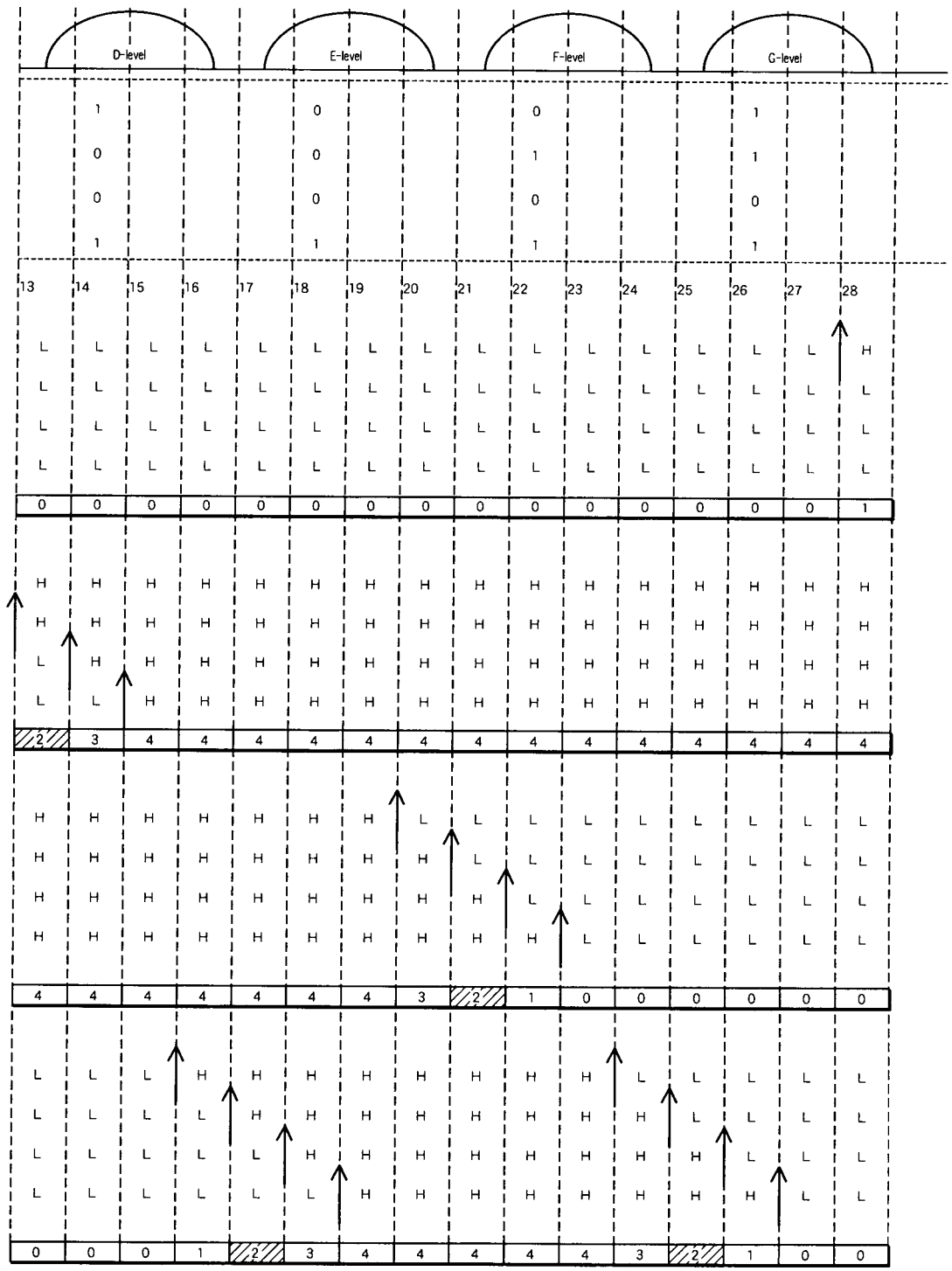
FIG. 15 shows a part of the relationship between threshold levels and read levels following FIG. 14.
Figure 17:
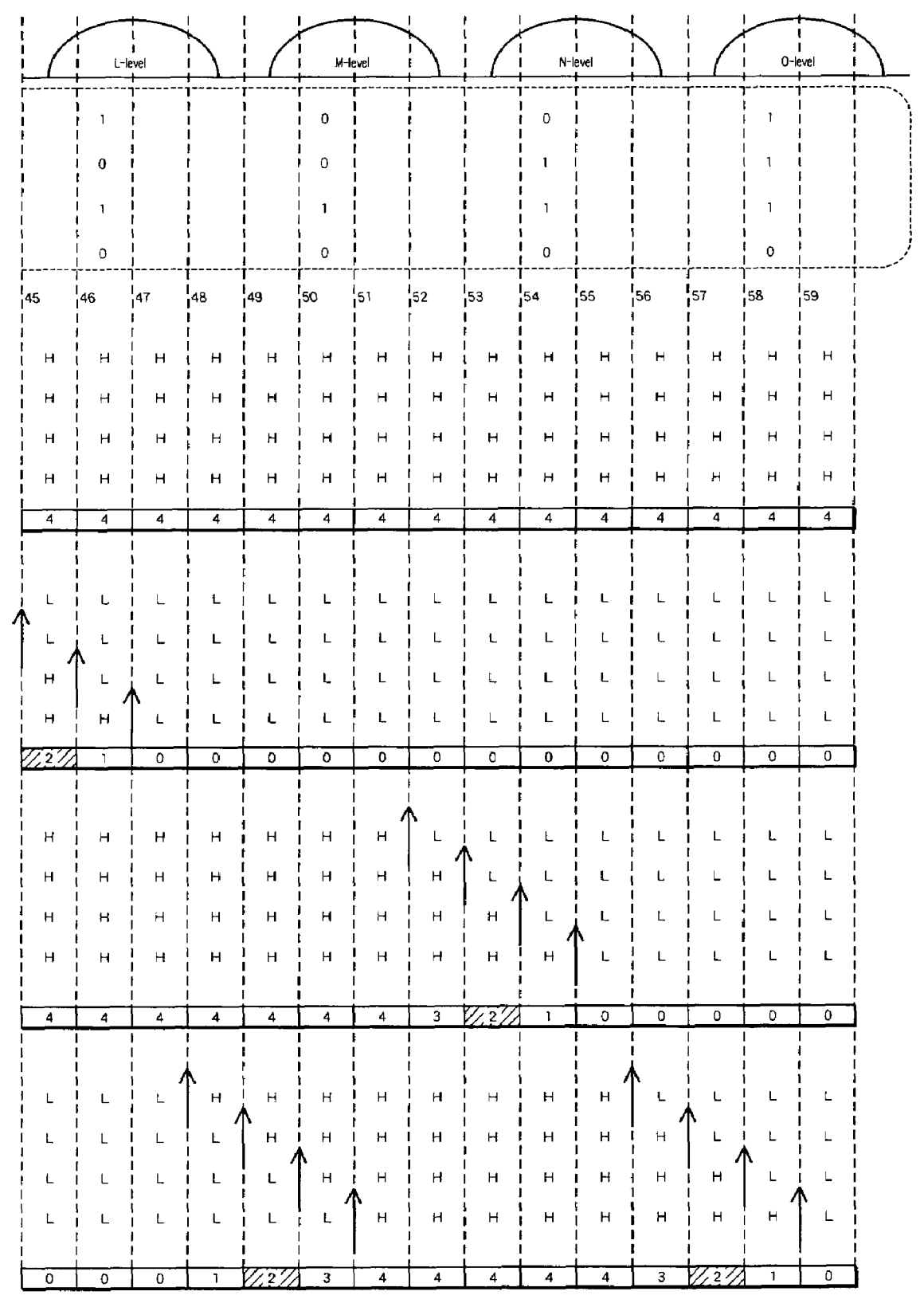

On the upper page of FIG. 14, the threshold level of the memory cell is read out at read level 13 in FIG. 15 and read level 45 in FIG. 17 and it is determined whether the threshold level of the memory cell is equal to or higher than D-level or lower than D-level and is equal to or higher than L-level or lower than L-level, that is, by two read operations. If the read-out threshold level is equal to or higher than D-level and is lower than L-level, the result is "H" (data "0"). If the threshold level is lower than D-level or is equal to or higher than L-level, the result is "L" (data "1").

Figure 16:
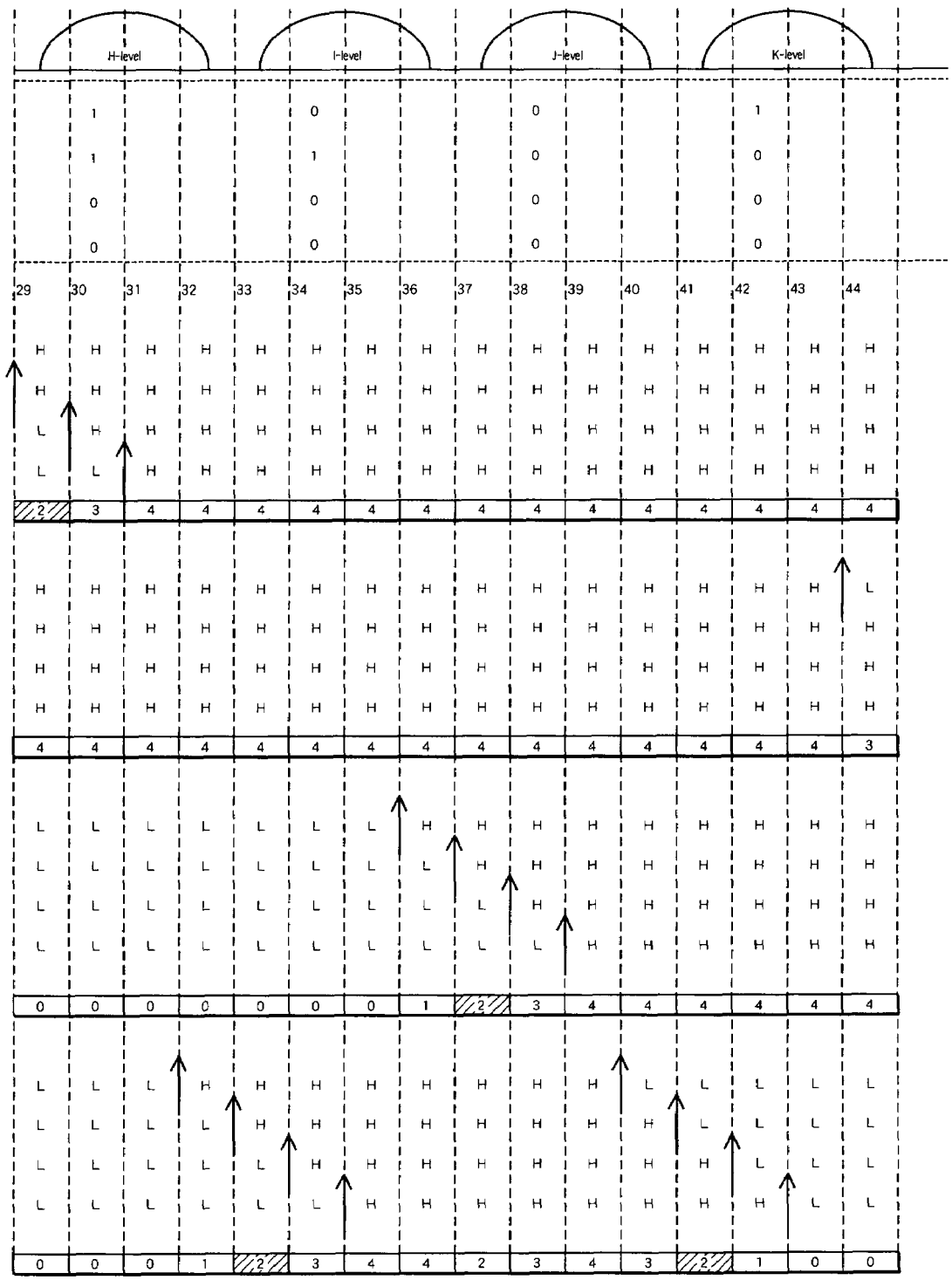
FIG. 16 shows a part of the relationship between threshold levels and read levels following FIG. 15.

On the higher page of FIG. 14, the threshold level of the memory cell is read out at read level 5 in FIG. 14, read level 21 in FIG. 15, read level 37 in FIG. 16, and read level 53 in FIG. 17 and it is determined whether the threshold level of the memory cell is equal to or higher than B-level or lower than B-level, is equal to or higher than F-level or lower than F-level, is equal to or higher than J-level or lower than J-level, and is equal to or higher than N-level or lower than N-level, that is, by four read operations. If the read-out threshold level is equal to or higher than B-level and is lower than F-level or is equal to or higher than J-level and is lower than N-level, the result is "H" (data "0"). If the threshold level is lower than B-level, is equal to or higher than F-level or is lower than J-level, or is equal to or higher than N-level, the result is "L" (data "1").

On the top page of FIG. 14, the threshold level of the memory cell is read out at read level 1 and read level 9 in FIG. 14, read level 17 and read level 25 in FIG. 15, read level 33 and read level 41 in FIG. 16, and read level 49 and read level 57 in FIG. 17, that is, at eight read levels, and it is determined whether the threshold level of the memory cell is equal to or higher than A-level or lower than A-level, is equal to or higher than C-level or lower than C-level, is equal to or higher than E-level or lower than E-level, is equal to or higher than G-level or lower than G-level, is equal to or higher than I-level or lower than I-level, is equal to or higher than K-level or lower than K-level, is equal to or higher than M-level or lower than M-level, and is equal to or higher than O-level or lower than O-level, that is, by eight read operations. If the read-out threshold level is equal to or higher than A-level and is lower than C-level, is equal to or higher than E-level and is lower than G-level, is equal to or higher than I-level and is lower than K-level, and is equal to or higher than N-level and is lower than O-level, the result is "H" (data "0"). If the threshold level is lower than A-level, is equal to or higher than C-level or is lower than E-level, is equal to or higher than G-level or is lower than I-level, is equal to or higher than K-level or is lower than N-level, or is equal to or higher that O-level, the result is "L" (data "1").

On the other hand, in the case of the LDPC code, a probability value is needed for each item of data read out as described above. For this reason, normally, 16-level data are distinguished by 15 levels. For example, each level, one level below each level, and two levels above each level, a total of four levels, are read. Specifically, when the lower page is read, the threshold level is read at read levels 28, 29, 30, and 31, or at four read levels, as shown by arrows in FIGS. 15 and 16 and the number of "Hs" read according to the four read levels is counted. A probability value is determined from the counted number. Specifically, in FIGS. 14 to 17, suppose the following holds:

When the number of "Hs" (data "0s") is 4,
the probability of "H" (data "0") is 100% (4/4).
When the number of "Hs" (data "0s") is 3,
the probability of "H" (data "0") is 75% (3/4).
When the number of "Hs" (data "0s") is 2,
the probability of "H" (data "0") is 50% (2/4).
When the number of "Hs" (data "0s") is 1,
the probability of "H" (data "0") is 25% (1/4).

The same holds true for the upper page, higher page, and top page. Specifically, in FIGS. 14 to 17, the threshold level is read using four read levels shown by the arrows and the number of "Hs" is counted. A probability value is determined from the counted number. The read-out one page of data makes a probability value. On the basis of the determined probability value for one page, the ECC circuit 11-1 processes the LDPC code and corrects the incorrect data.

Figure 18:
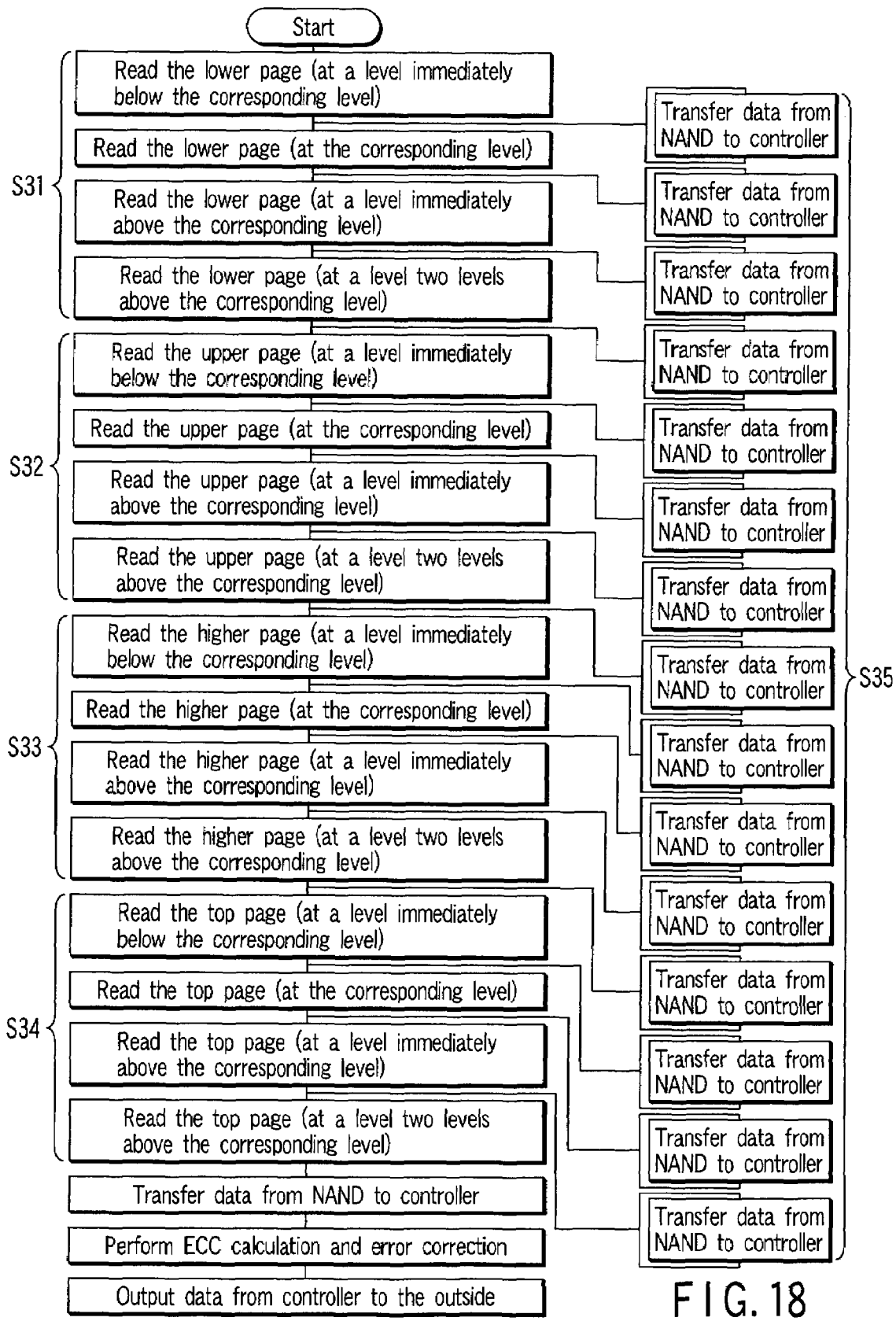
FIG. 18 is a flowchart to explain a read operation in the third embodiment.

FIG. 18 shows the read sequence. The lower page, upper page, higher page, and top page use the same sequence. As for each read level on each page, reading is done at a level immediately below the read level, the read level, and a level immediately above the read level, and a level two levels higher than the read level, that is, four times (S31, S32, S33, S34). That is, to read one item of data, the potential of the word line is changed four times. Each read level, a level immediately below the read level, a level immediately above the read level, and a level two levels higher than the read level are set to the levels obtained by, for example, quadrisecting the range of the threshold level as described later. The data read from the cells of the NAND flash memory using these read levels are held in the data storage circuit 10 of FIG. 2. The data is transferred from the data storage circuit 10 to the ECC circuit 11-1 via the data input/output buffer 4 and data input/output terminal 5 shown in FIG. 1 (S35, S36). While the data storage circuit 10 is transferring the data to the controller 11, the next data is read from the memory cells and stored in the data storage circuit 10. The data transferred to the controller 11 is subjected to an error correction process at the LDPC-code ECC circuit 11-2 (S37). The error-corrected data is output from the controller 11 (S38). Since the correction process at the ECC circuit 11-2 is not essential to the embodiment, a concrete explanation will be omitted.

Figure 19A:
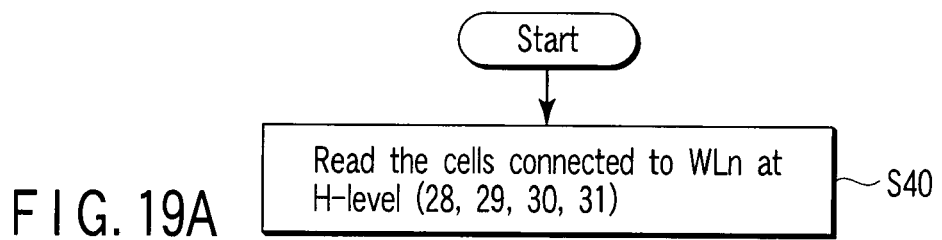
FIG. 19A shows a read sequence in a lower page.

FIG. 19A shows a read sequence on the lower page. As described above, in the case of H-level, data is read at read levels 28, 29, 30, and 31 (S40).

Figure 19B:
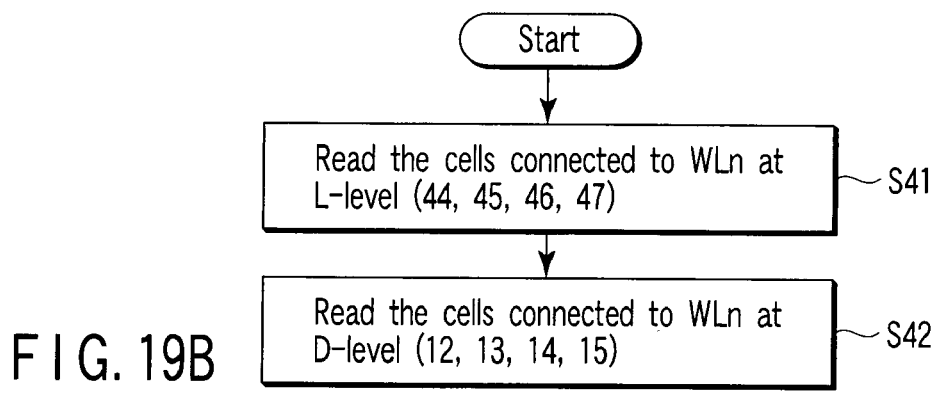
FIG. 19B shows a read sequence in an upper page.

FIG. 19B shows a read sequence on the upper page. In the case of L-level, data is read at read levels 44, 45, 46, and 47 (S41). In the case of D-level, data is read at read levels 12, 13, 14, and 15 (S42).

Figure 19C:
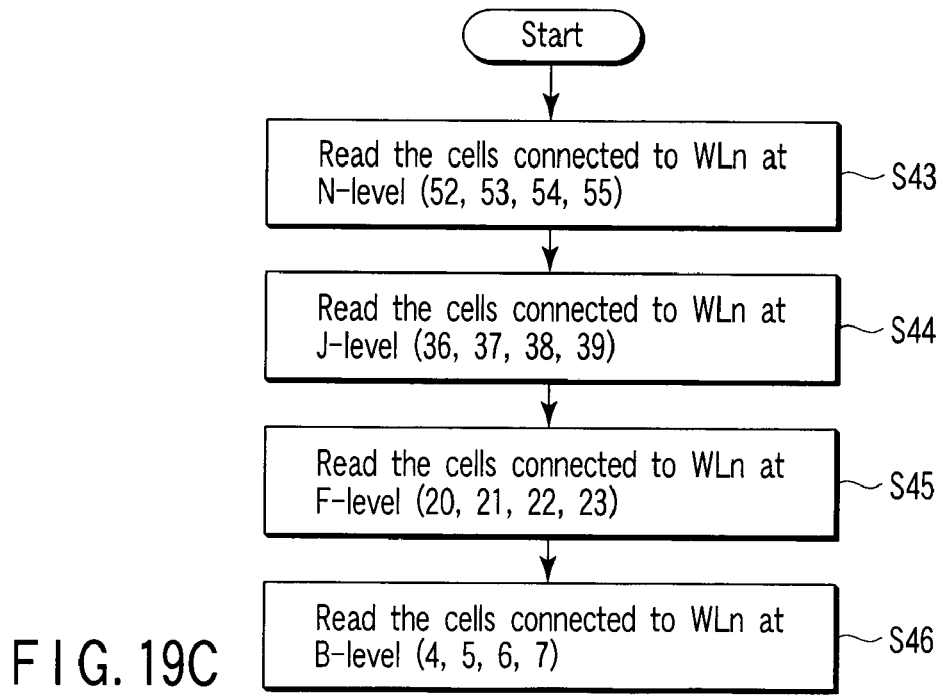
FIG. 19C shows a read sequence in a higher page.

FIG. 19C shows a read sequence on the higher page. In the case of N-level, data is read at read levels 52, 53, 54, and 55 (S43). In the case of J-level, data is read at read levels 36, 37, 38, and 39 (S44). Moreover, in the case of F-level, data is read at read levels 20, 21, 22, and 23 (S45). In the case of B-level, data is read at read levels 4, 5, 6, and 7 (S46).

Figure 20:
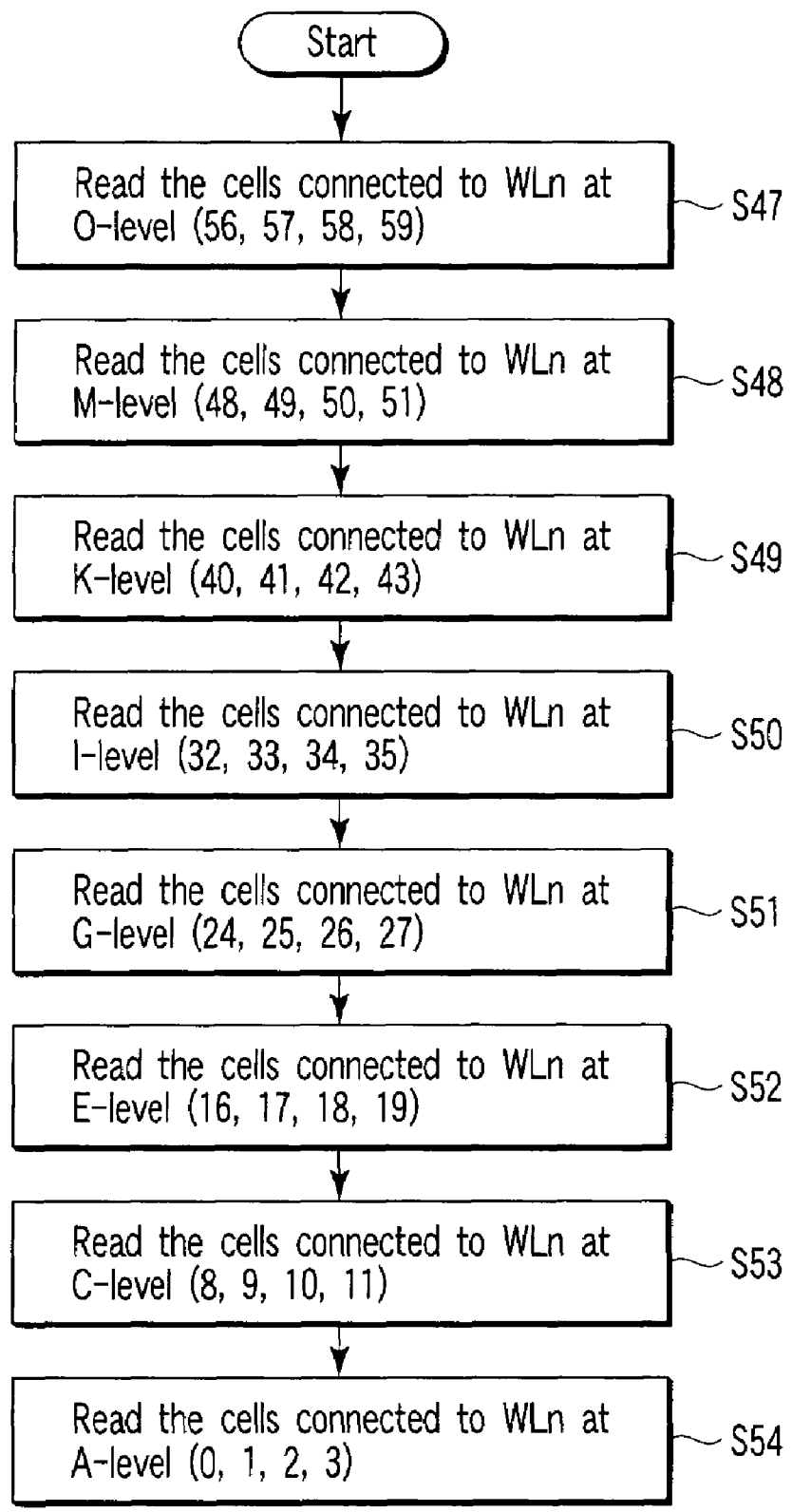
FIG. 20 is a flowchart to explain a read sequence at the top level.

FIG. 20 shows a read sequence on the top page. In the case of O-level, data is read at read levels 56, 57, 58, and 59 (S47). In the case of M-level, data is read at read levels 48, 49, 50, and 51 (S48). Moreover, in the case of K-level, data is read at read levels 40, 41, 42, and 43 (S49). In the case of I-level, data is read at read levels 32, 33, 34, and 35 (S50). In addition, in the case of G-level, data is read at read levels 24, 25, 26, and 27 (S51). In the case of E-level, data is read at read levels 16, 17, 18, and 19 (S52). Furthermore, in the case of C-level, data is read at read levels 8, 9, 10, and 11 (S53). In the case of the A-level, data is read at read levels 0, 1, 2, and 3 (S54).

While the ECC circuit 11-2 is performing an error correction process, the data may be read from the memory cells and transferred from the data storage circuit 10 to the ECC circuit 11-1.

If in FIGS. 14 to 17, Z-level is at −1.6V and O-level is at 4V, the level of each distribution is as follows: (4V−(−1.6V))/15=5.6/15=about 0.37V. When the LDPC code is used, if four read levels are provided in one level as in this example, the voltage difference between one read level and another is 0.37V/4=about 0.0925V. The higher the level, the poorer the data retention is. Therefore, it is desirable that the level interval should be increased gradually as the level gets higher. Moreover, the lower the level, the better the data retention is. Therefore, it is desirable that the level interval should be decreased gradually as the level gets lower. Setting the read levels this way makes it possible to maintain the data retention constant when the read level is both high and low and read the threshold levels reliably.

With the third embodiment, to read one threshold level stored in the memory cell, the probability value necessary to correct an error in the LDPC code can be determined by changing the level of the word line four times. For this reason, the LDPC code which has a higher correction capability than other ECC codes and requires a smaller number of check bits stored can be used for error correction.

In the third embodiment, to find the probability value, four read operations have been carried out, changing the read levels. The invention is not limited to this. For instance, the read level may be changed six times, eight times, or any other number of times. Moreover, four read operations may be carried out at the same level without changing the read level and the number of "H" levels read in the read operations may be counted. Furthermore, when other cells are read from, counting may be done by gradually changing the operation timing, precharge voltage, or the like.

Modification 1

FIG. 21 shows an example of the data storage circuit 10 shown in FIG. 2.

FIG. 21 shows a case where, for example, 4-bit, 16-level data are written into and read from the data storage circuit 10. The data storage circuit 10 includes a primary data cache (PDC), a secondary data cache (SDC), dynamic data caches (DDC0, DDC1, DDC2, DDC3), and a temporary data cache (TDC). The SDC, PDC, DDC0, DDC1, DDC2, and DDC3 hold input data in a write operation, hold read-out data in a read operation, temporarily hold data in a verify operation, and are used to manipulate internal data in storing multilevel data. The TDC not only amplifies data on a bit line in reading data and temporarily holds the data, but also is used to manipulate internal data in storing multilevel data.

The SDC is composed of clocked inverter circuits 61*a*, 61*b* constituting a static latch circuit and transistors 61*c*, 61*d*. The transistor 61*c* is connected between the input end of the clocked inverter circuit 61*a* and the input end of the clocked inverter circuit 61b. A signal EQ2 is supplied to the gate of the transistor 61c. The transistor 61d is connected between the output end of the clocked inverter circuit 61a and the ground. A signal PRST is supplied to the gate of the transistor 61d. Node N2a of the SDC is connected via a column select transistor 61e to an input/output data line IOn. Node N2b of the SDC is connected via a column select transistor 61f to an input/output data line IO. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j constituting a static latch circuit and a transistor 61k. The transistor 61k is connected between the input end of the clocked inverter circuit 61i and the input end of the clocked inverter circuit 61j. A signal EQ1 is supplied to the gate of the transistor 61k. Node N1b of the PDC is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to node N3. The other end of the current path of the transistors 61n, 61o is connected to a signal line COMi. The signal line COMi is connected equally to all of the data storage circuits 10. On the basis of the level of the signal line COMi, whether all of the data storage circuits 10 have been verified can be determined. Specifically, as described later, if the verification has been completed, node N1b of the PDC goes low (or node N1a goes high). In this state, when the signals CHK1, CHK2n are made high, if the verification has been completed, the signal line COMi goes high.

Furthermore, the TDC is composed of, for example, a MOS capacitor 61p. One end of the capacitor 61p is connected to a junction node N3 of the transistors 61g, 61h. A signal BOOST described later is supplied to the other end of the capacitor 61p. The DDC0, DDC1, DDC2, and DDC3 are connected to the junction node N3 via transistors 61qA to 61qD. Signals REGA to REGD are supplied to the gates of the transistors 61qA to 61qD.

The DDC0, DDC1, DDC2, and DDC3 constituting a dynamic latch circuit are composed of transistors 61rA to 61rD, respectively. Signal VPRE is supplied to one end of the current path of each of the transistors 61rA to 61rD. The other ends of the transistors 61rA to 61rD are connected to the current paths of the transistors 61qA to 61qD, respectively. The gates of the transistors 61rA to 61rD are connected to node N1a of the PDC via transistors 61sA to 61sD. Signals DTGA to DTGD are supplied to the gates of the transistors 61sA to 61sD, respectively.

Furthermore, one end of the current path of each of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected to one end of bit line BLo via a transistor 61v and to one end of bit line BLe via a transistor 61w. One end of bit line BLo is connected to one end of the current path of a transistor 61x. A signal BIASo is supplied to the gate of the transistor 61x. One end of bit line BLe is connected to one end of the current path of a transistor 61y. A signal BIASe is supplied to the gate of the transistor 61y. A signal BLCRL is supplied to the other ends of the current paths of these transistors 61x, 61y. The transistors 61x, 61y are turned on according to signals BIASo, BIASe so as to be complementary to the transistors 61v, 61w, thereby supplying the potential of the signal BLCRL to the unselected bit lines.

Between node N3 and the ground, for example, a MOS capacitor 61z is connected. The capacitor 61z adjusts the potential at node N3 so as to prevent the potential at node N3 from rising too much by coupling in raising the voltage of the capacitor 61p of the TDC described later by the signal BOOST. Hereinafter, suppose data in the PDC is the potential at node N1a, data in the SDC is the potential at node N2a, data in the TDC is the potential at node N3, and data in the DDC0 to DDC3 are the potentials of the gates of the transistors 61rA to 61rD.

The signal supplied to each section of the data storage circuit 10 is generated by the control voltage and control signal generator circuit 7 of FIG. 1. The data on a plurality of pages of the individual memory cells are read by changing addresses.

Figure 22:
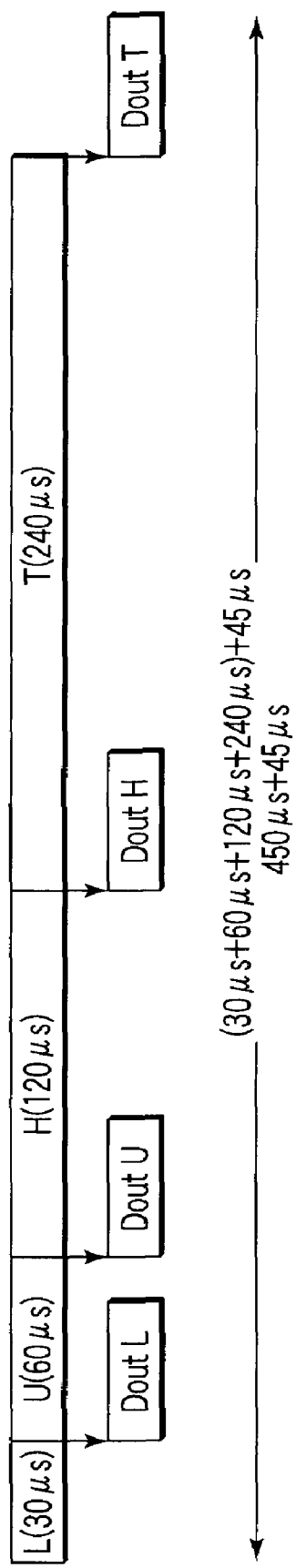
FIG. 22 shows a normal read sequence using the data storage circuit.

FIG. 22 shows a normal read sequence using the data storage circuit 10.

First, after the data on the lower page is read from the memory cells and held in the PDC, the data is transferred from the PDC to the SDC (L (30 μs)). While the data on the lower page is being output from the SDC to the outside (DoutL), the data on the upper page is read from the memory cells and held in the PDC (U (60 μs)). Thereafter, the data in the PDC is transferred to the SDC. While the data on the upper page is being output from the SDC to the outside (DoutU), the data on the higher page is read from the memory cells and held in the PDC (U (120 μs)). Then, the data in the PDC is transferred to the SDC. While the data on the higher page is being output from the SDC to the outside (DoutH), the data on the top page is read from the memory cells and held in the PDC (U (240 μs)). Thereafter, the data in the PDC is transferred to the SDC and the data on the top page is output from the SDC to the outside (DoutT). As described above, in the normal operation sequence, when four pages of data are read from the memory cells and transferred to the outside, four transfer operations are carried out.

Figure 23:
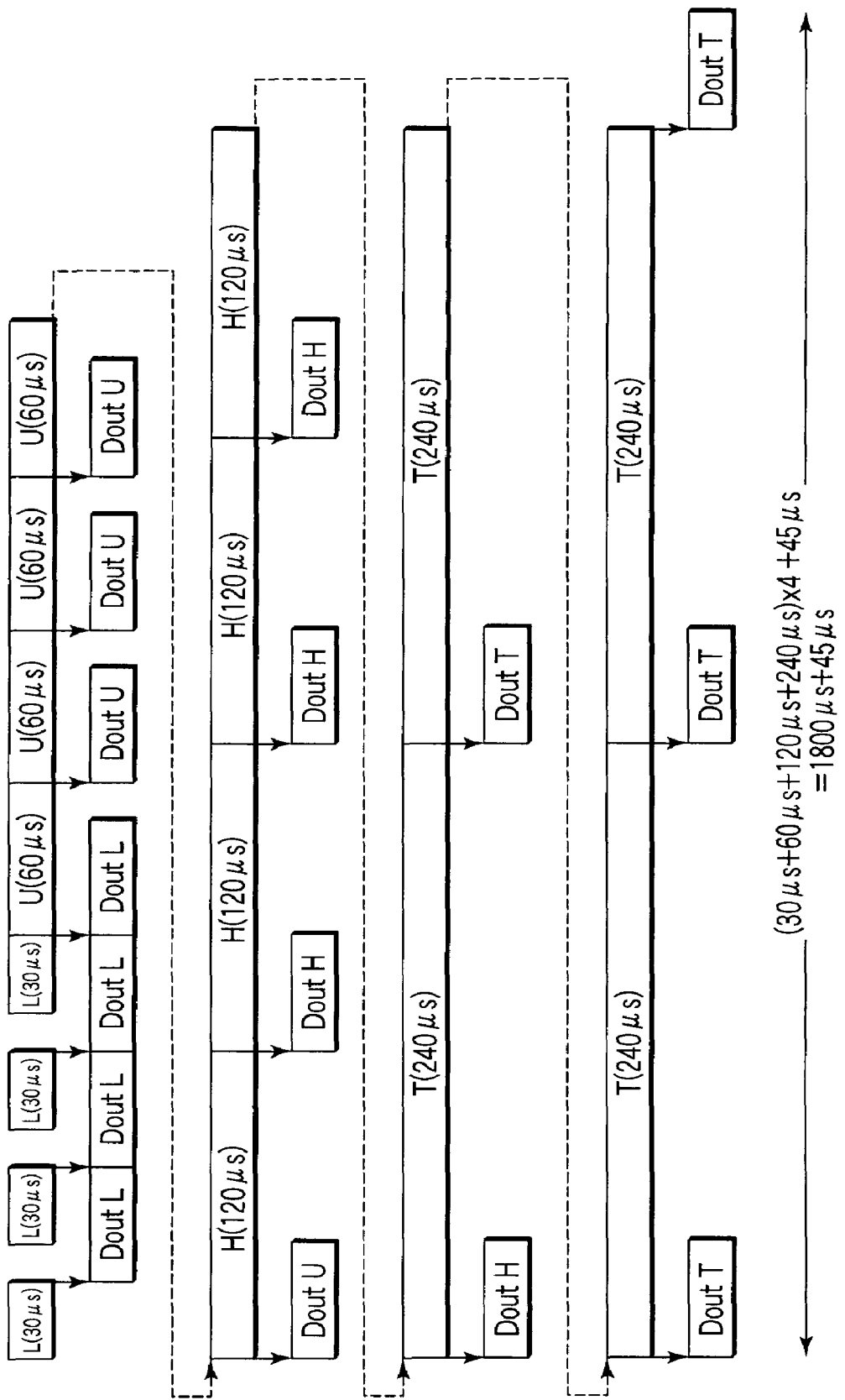
FIG. 23 shows an operation sequence in the third embodiment corresponding to FIG. 18.

In contrast, FIG. 23 shows an operation sequence in the third embodiment corresponding to FIG. 18. In the third embodiment, one page of data is read, changing the level four times. The data read at each level is output to the outside. For this reason, as shown in FIG. 23, the third embodiment requires four times as many transfer operations to the outside as in the normal operation sequence of FIG. 22. That is, in the normal operation sequence, four transfer operations to the outside are carried out, whereas the third embodiment requires 4×4=16 transfer operations to the outside.

Figure 24:
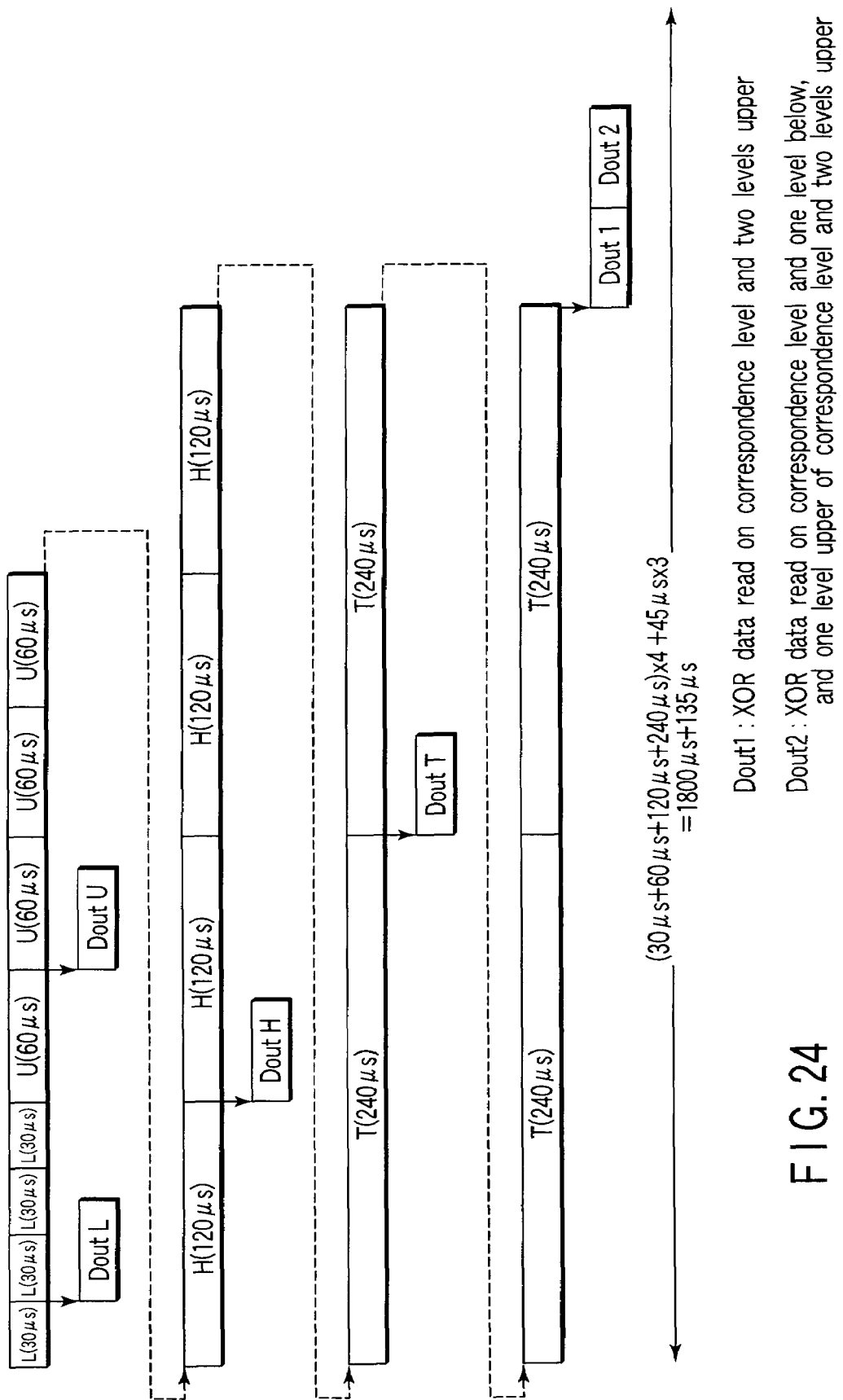
FIG. 24 shows an operation sequence according to modification 1 of the third embodiment.
Figure 28:
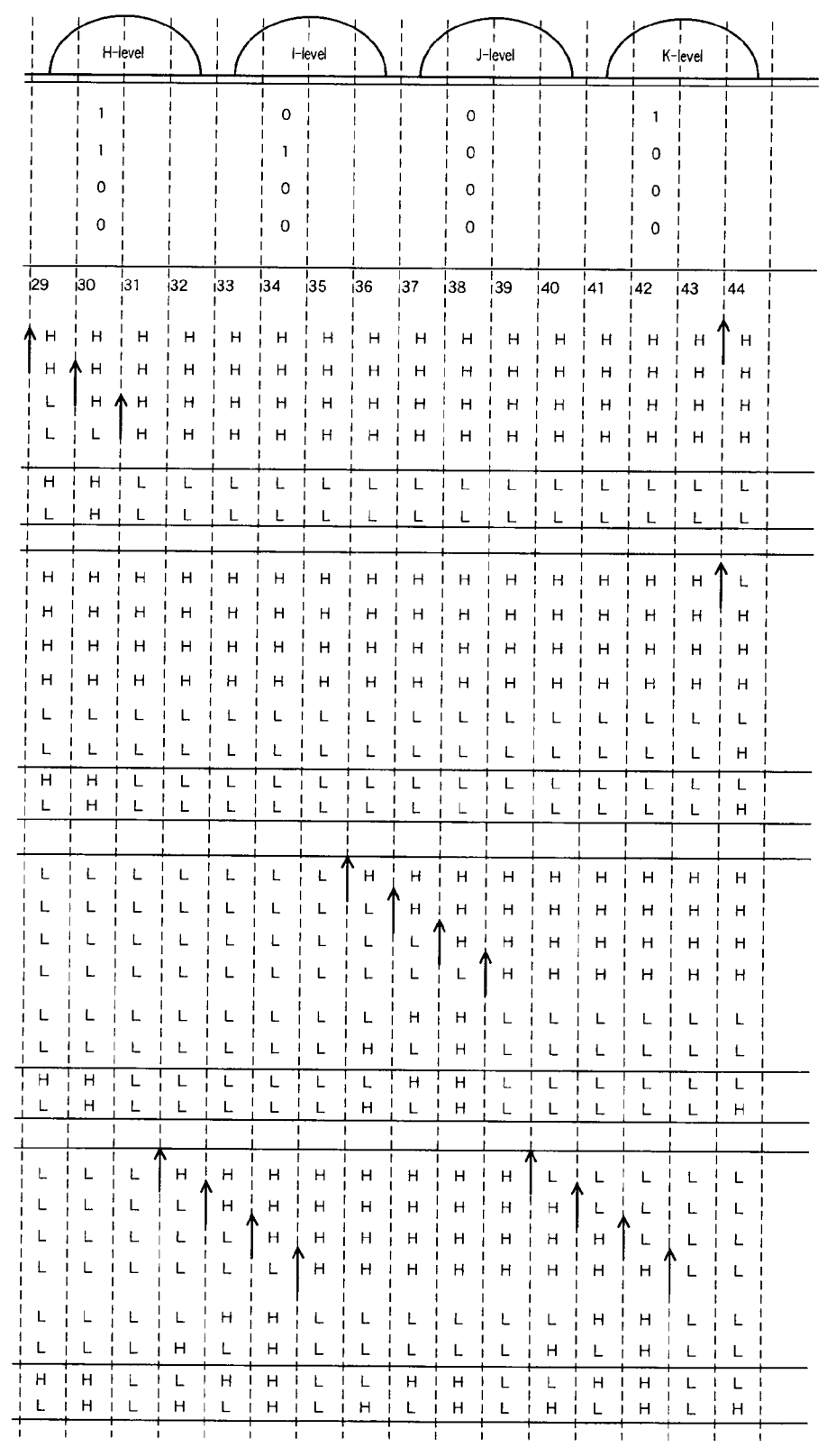
Figure 29:
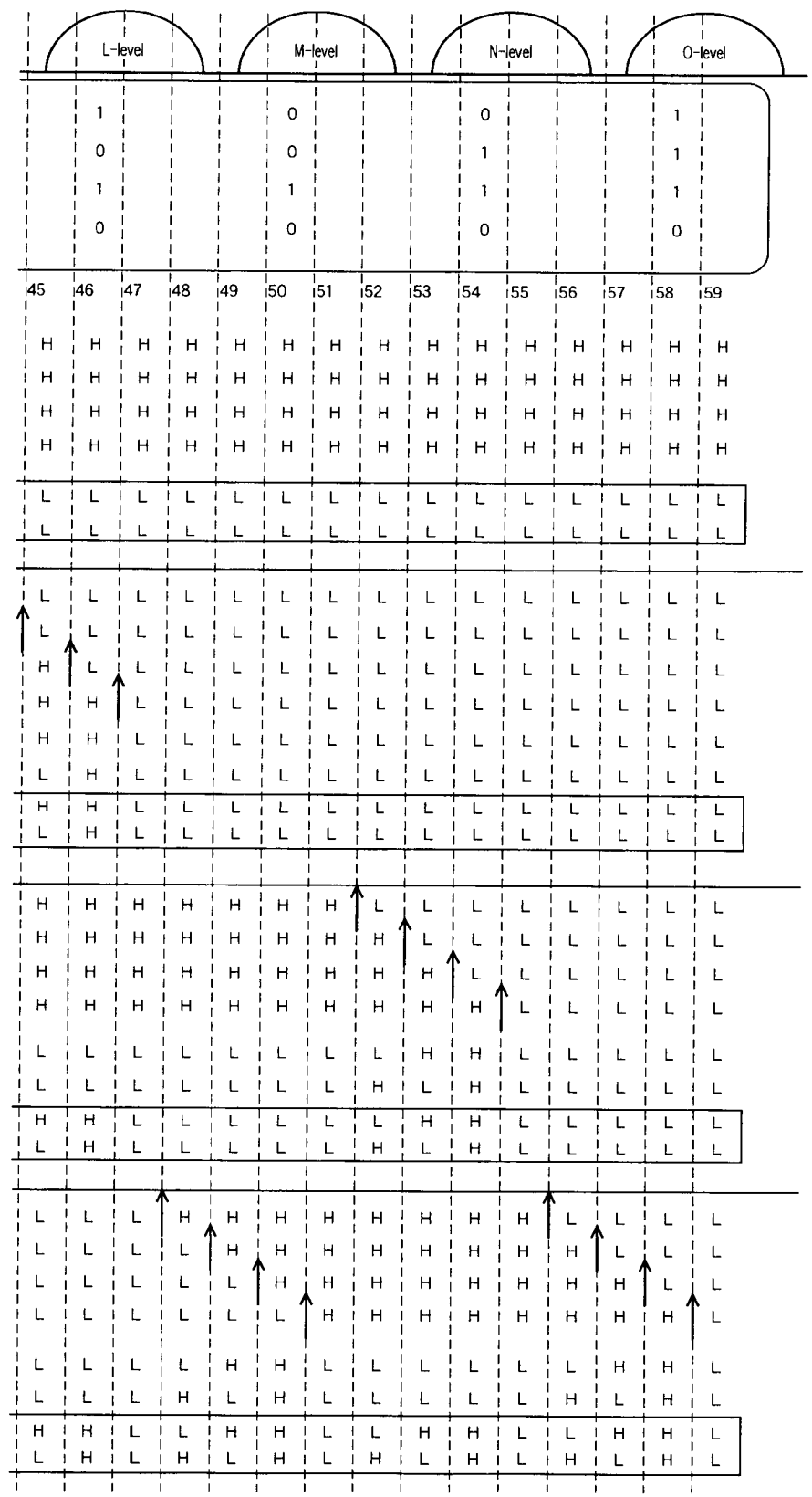
FIG. 29 shows a part of the relationship between the threshold level and the read level, following FIG. 28.
Figure 30:
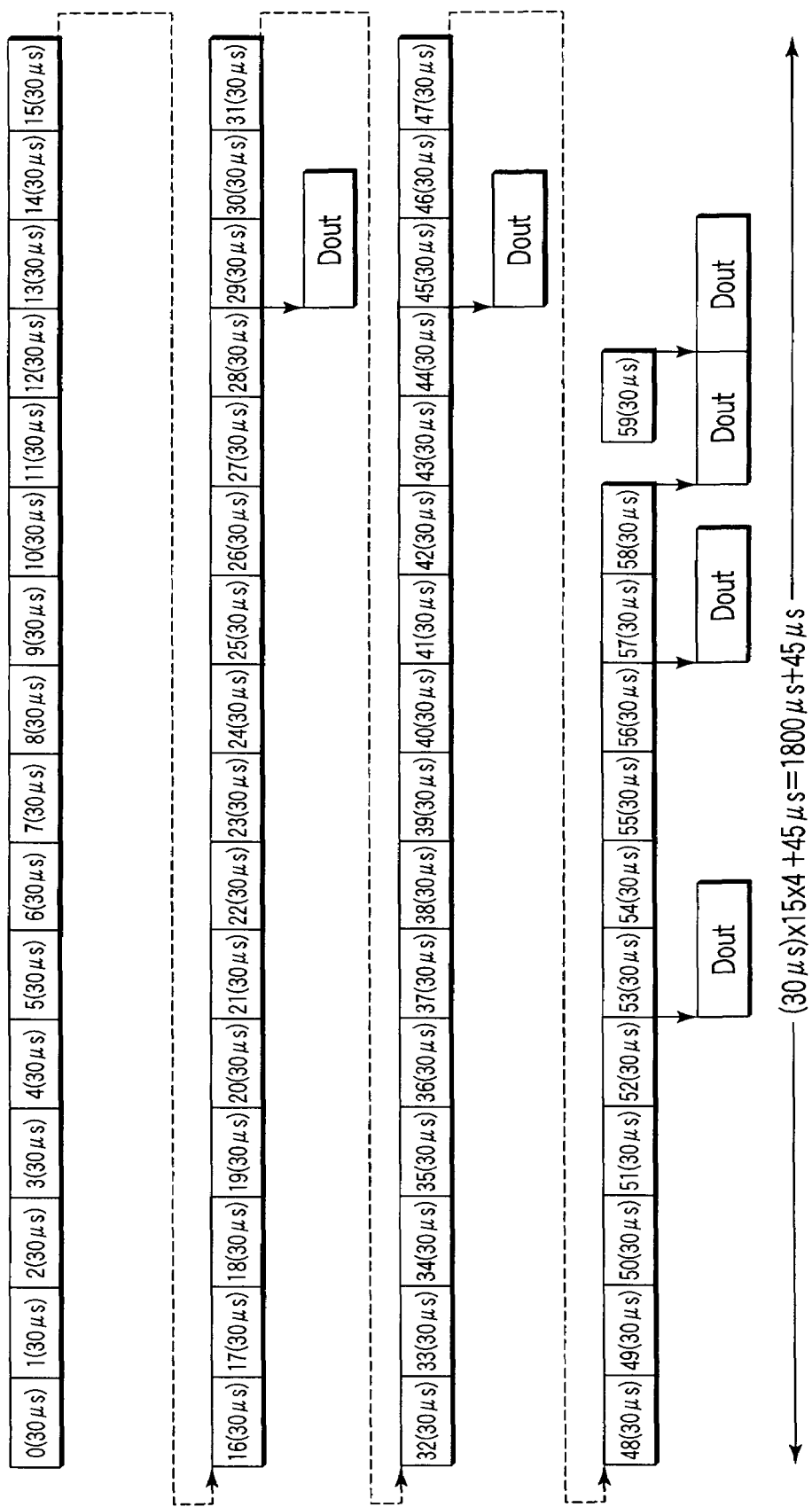
FIG. 30 shows an operation sequence according to modification 2 of the third embodiment.
Figure 31:
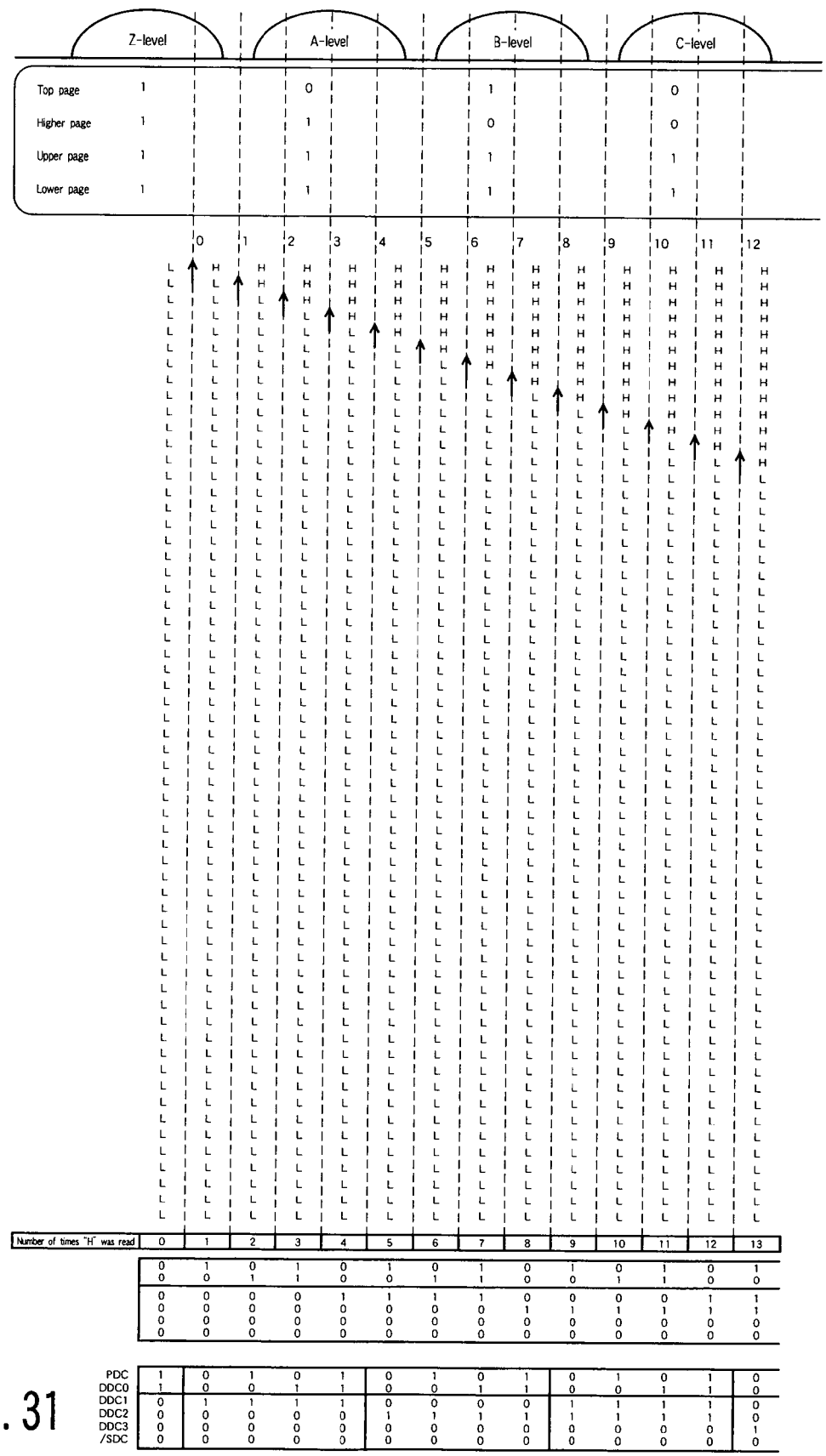
FIG. 31 shows a part of the relationship between the threshold level and the read level in modification 2.
Figure 33:
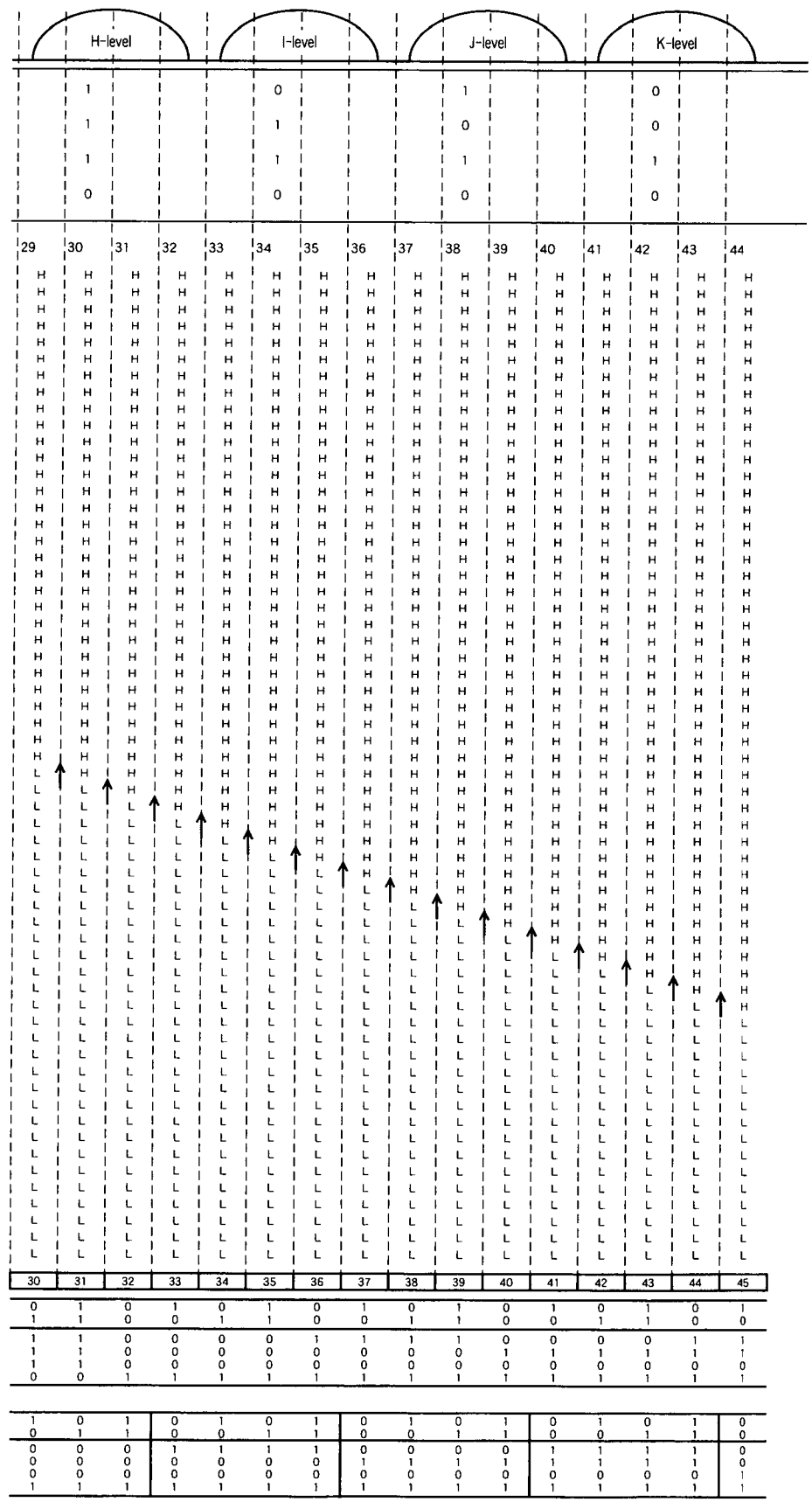
FIG. 33 shows a part of the relationship between the threshold level and the read level, following FIG. 32.
Figure 34:
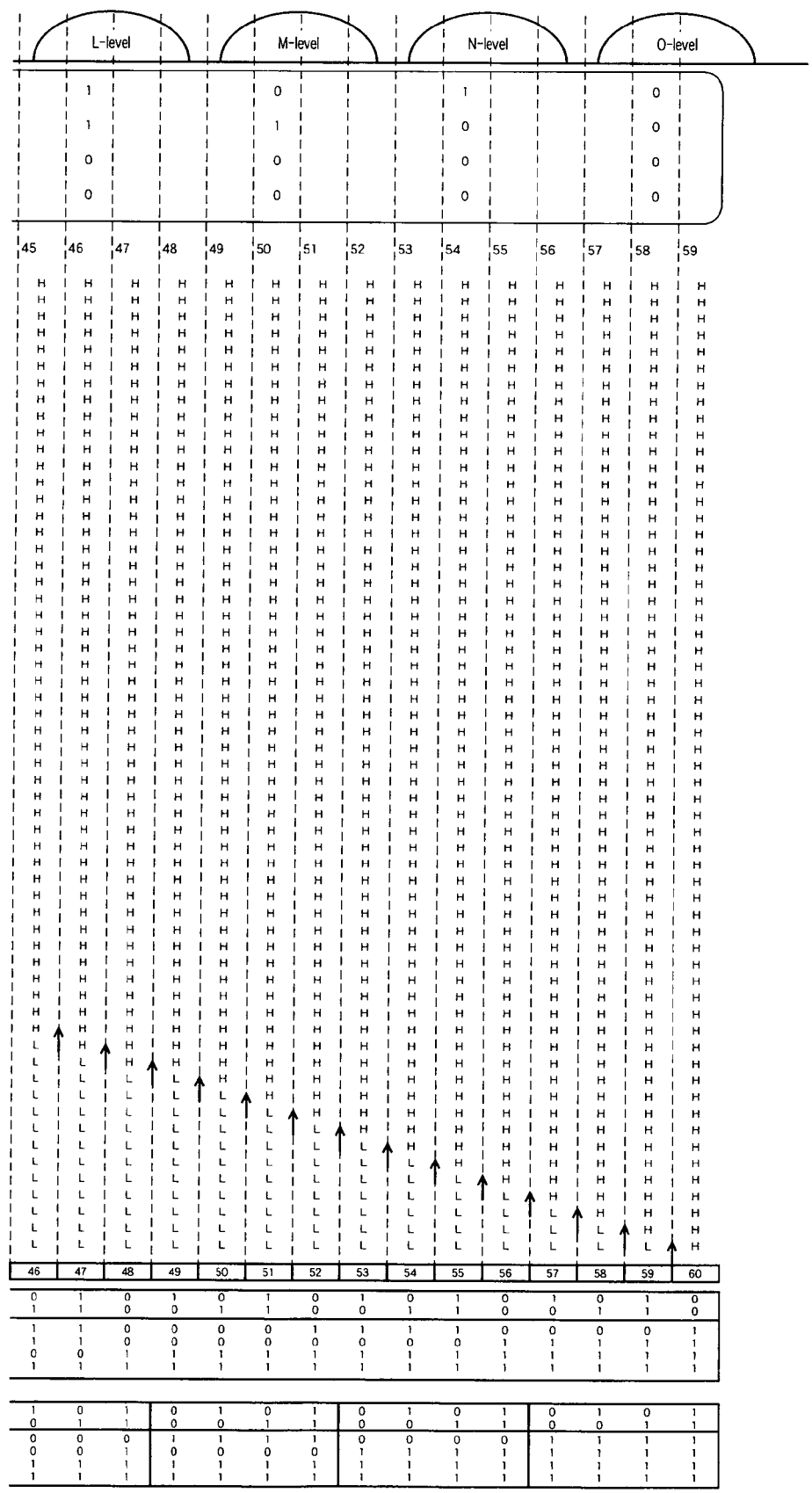
FIG. 34 shows a part of the relationship between the threshold level and the read level, following FIG. 33.
Figure 36:
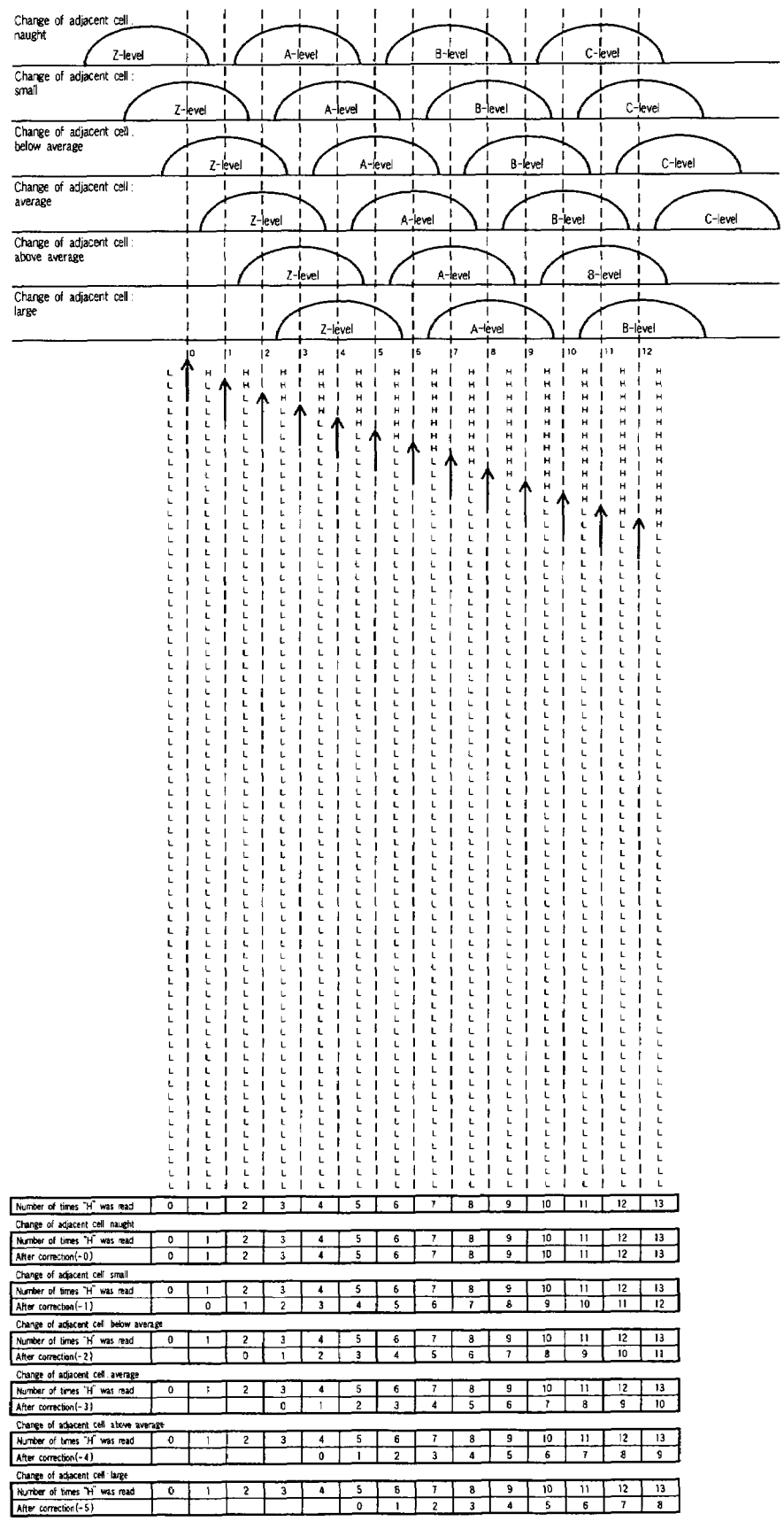
FIG. 36 shows a part of the relationship between the threshold level and the read level after an adjacent cell is written into in a fourth embodiment of the invention.
Figure 37:
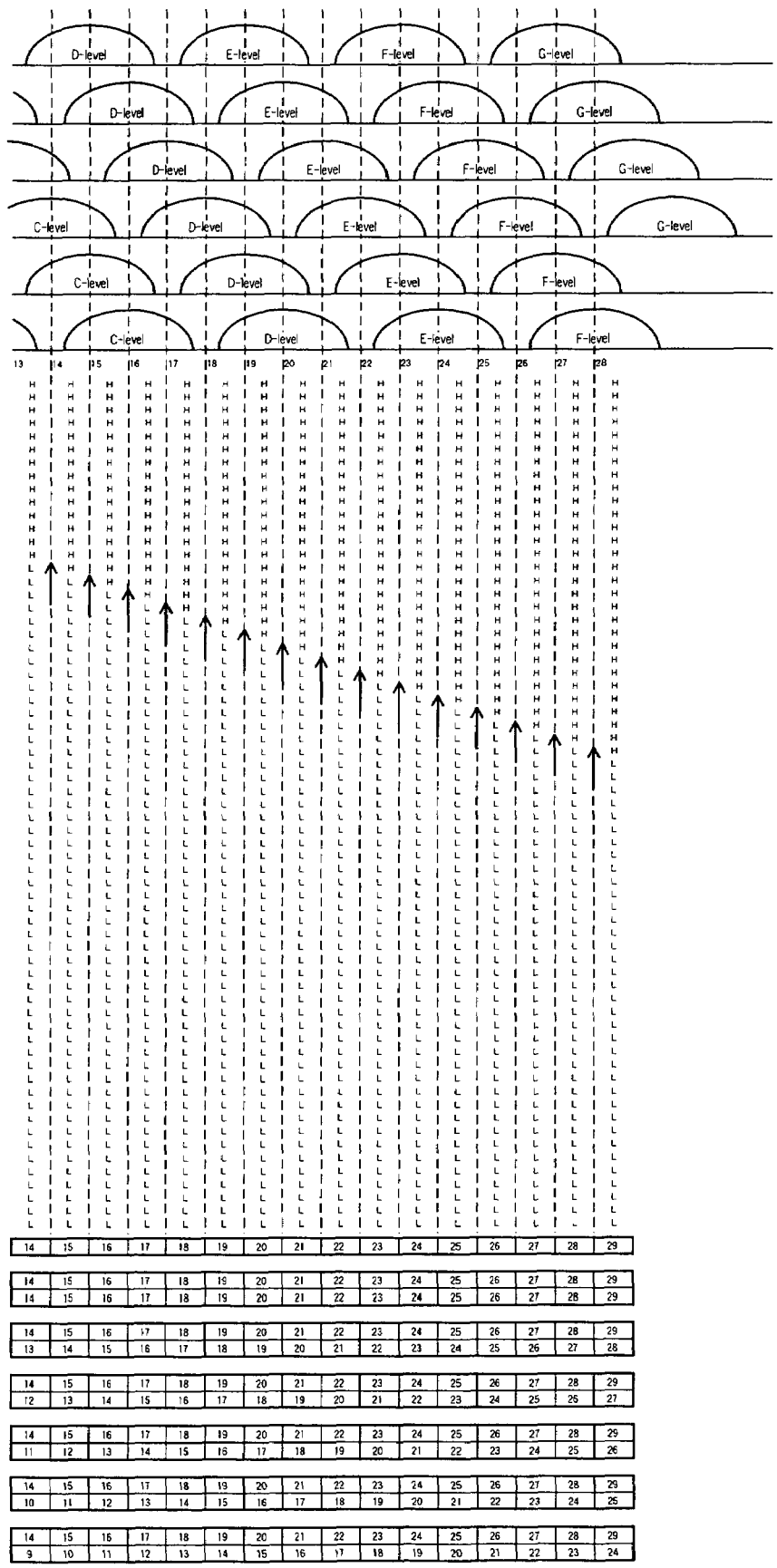
FIG. 37 shows a part of the relationship between the threshold level and the read level, following FIG. 36.
Figure 38:
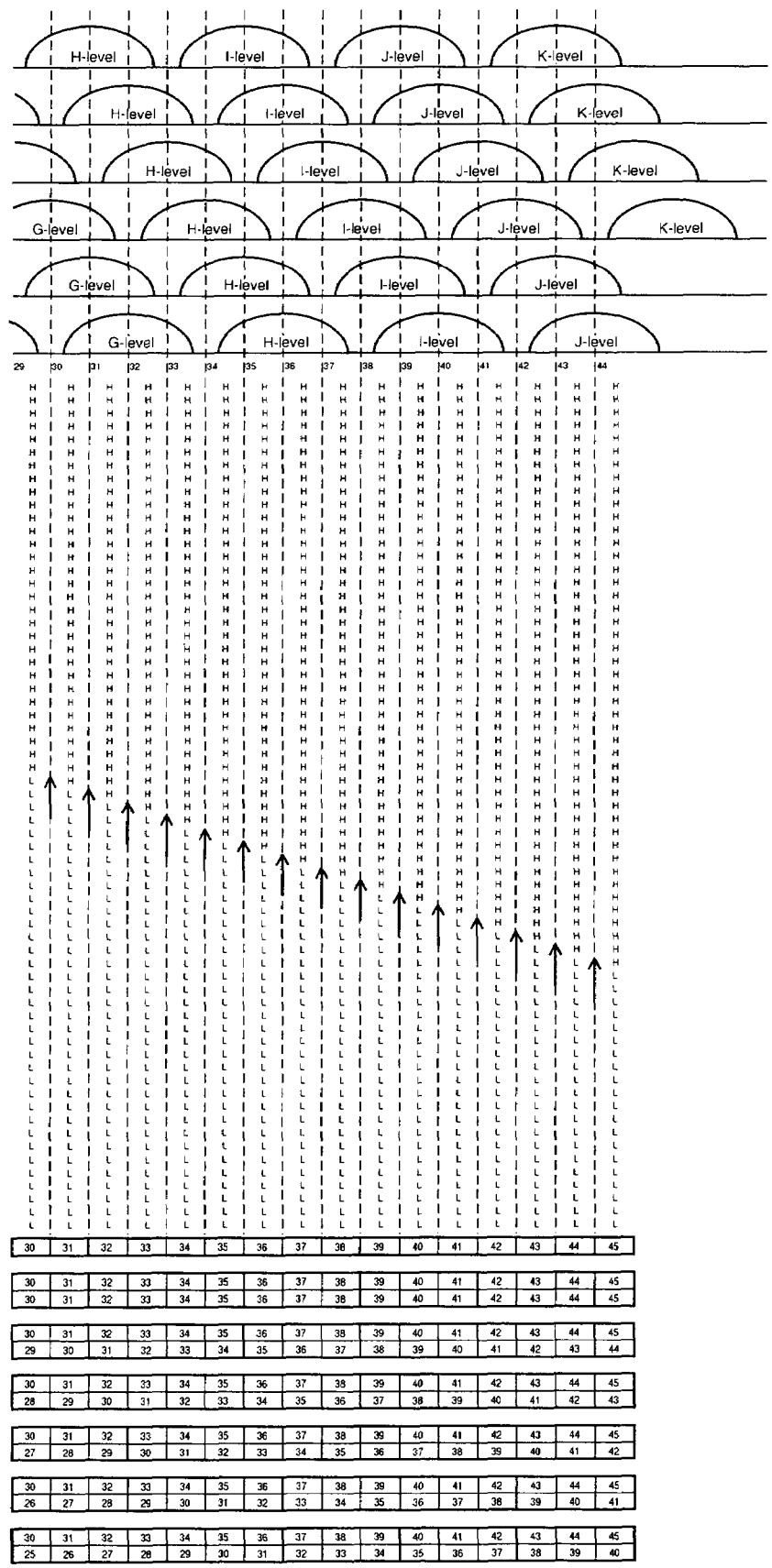
FIG. 38 shows a part of the relationship between the threshold level and the read level, following FIG. 37.
Figure 39:
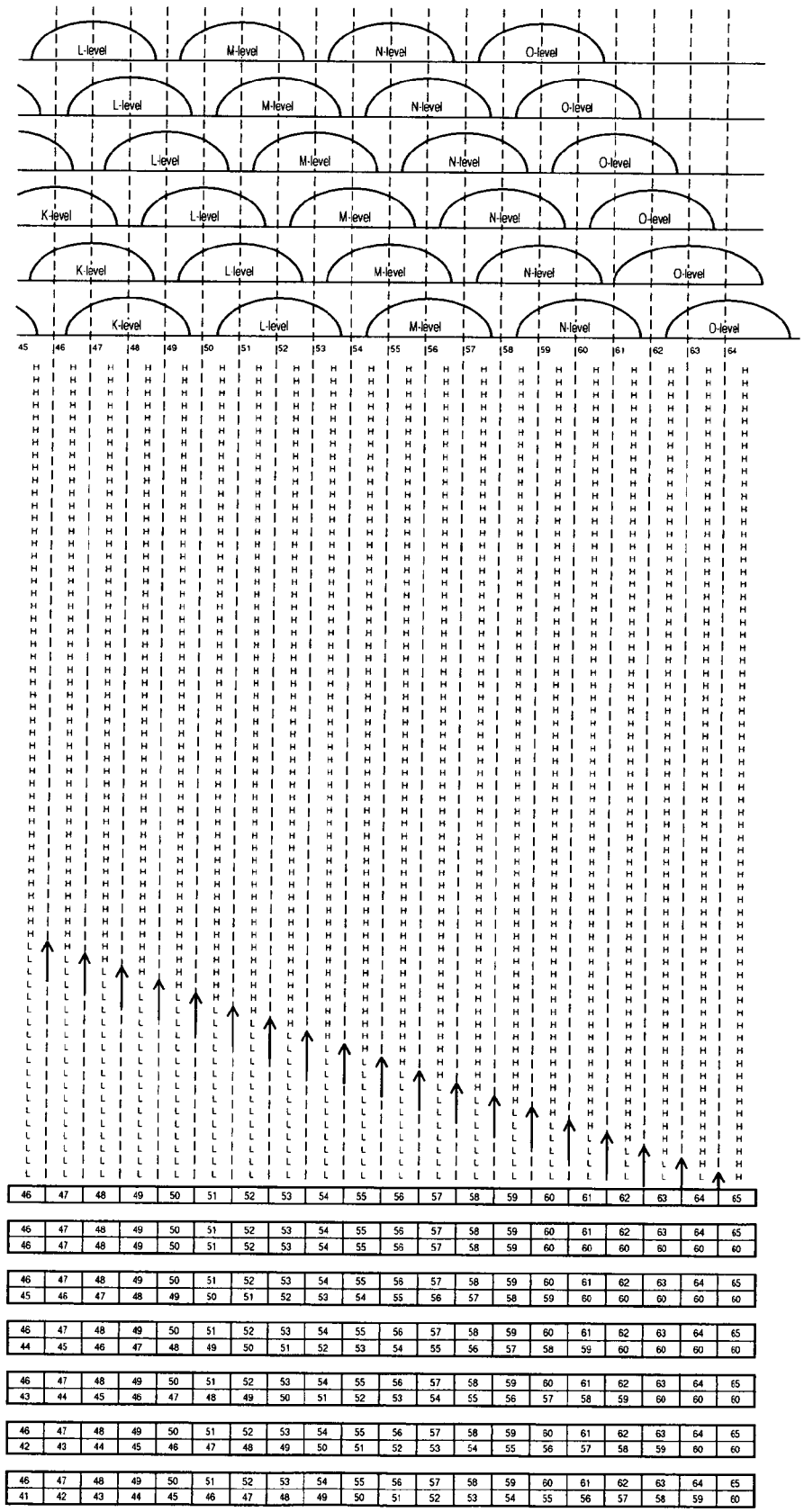
FIG. 39 shows a part of the relationship between the threshold level and the read level after the adjacent cell is written into, following FIG. 38.

On the other hand, FIGS. 24 and 25 and FIGS. 26 to 29 show modification 1 of the third embodiment. In the case of modification 1, as shown in FIGS. 24, 25, and 28, first the data on the lower page is read from the cells at level 29 (corresponding level) and held in the PDC (31a). Thereafter, the data is transferred from the PDC to the SDC and the data on the lower page is output from the SDC to the outside (31b). While the data on the lower page is being output from the SDC to the outside, the data on the lower page is read from the cells at a level two levels higher than the corresponding level (level 31) and held in the PDC (31c). The data in the PDC is XORed with the data read at level 29 held in the SDC (exclusive OR). The result is added to DDC0 (31d). DDC0 becomes "H" only when the memory cell is equal to or higher than level 29 and equal to or lower than level 31.

Next, the data on the lower page is read from the cells at a level (level 30) immediately above the corresponding level (S31*e*). The read-out data is XORed with the data read at the level (level 31) two level higher that the corresponding level stored in the PDC. The result is added to DDC1 (S31*f*). DDC1 becomes "H" only when the memory cell is equal to or higher than level 30 and equal to or lower than level 31.

Thereafter, the data on the lower page is read from the cells at a level (level 28) immediately below the corresponding level (S31*g*). The read-out data is XORed with the data read at the corresponding level (level 29) stored in the SDC. The result is added to DDC1 (S31*h*). As a result, DDC1 becomes "H" only when the memory cell is equal to or higher than level 30 and equal to or lower than level 31 and is equal to or higher than level 28 and equal to or lower than level 29.

Similarly, the data is read from the cells at the corresponding level of each of the upper page, higher page, and top page. Then, the data is transferred from the PDC to the SDC. While the data on the lower page is being output from the SDC to the outside, the data read at a level two level higher than the corresponding level is XORed with the data read at the corresponding level. The result is added to DDC0. Moreover, the data read at a level immediately above the corresponding level is XORed with the data read at a level two levels higher than the corresponding level. The result is added to DDC1. Furthermore, the data read at the corresponding level is XORed with the data read at a level immediately below the corresponding level. The result is added to DDC. Finally, the data in DDC0 and the data in DDC1 are output to the outside (S36*a*, S36*b*).

For example, the XOR is calculated as follows. First, the data to be XORed is transferred to DDC2 and DDC3. There are four combinations of the data stored in DDC2 and DDC3 as follows:

| | |
|---|---|
| DDC2 | 1 1 0 0 |
| DDC3 | 1 0 1 0 |

Thereafter, with signal VPRE=Vss and signal BLPRE=Vdd, the TDC is set at Vss. Then, with signal VPRE=Vdd and signal REG2="H", the data in DDC2 is copied into the TDC. With signal VPRE=Vss and signal REG3="H", if DDC3 is at "1", the TDC is forced to be set at Vss. Thereafter, the data in the TDC is transferred to the PDC. Then, the combinations of the data held in DDC2, DDC3, and PDC are as follows:

| | |
|---|---|
| DDC2 | 1 1 0 0 |
| DDC3 | 1 0 1 0 |
| PDC | 0 1 0 0 |

Thereafter, with signal VPRE=Vss and signal BLPRE=Vdd, the TDC is set at Vss. Then, with signal VPRE=Vdd and signal REG3="H", the data in DDC3 is copied into the TDC. With signal VPRE=Vss and signal REG2="H", if the data in DDC2 is at "1", the TDC is forced to be set at Vss. Then, the combinations of the data held in DDC2, DDC3, PDC, and TDC are as follows:

| | |
|---|---|
| DDC2 | 1 1 0 0 |
| DDC3 | 1 0 1 0 |

-continued

| | |
|---|---|
| PDC | 0 1 0 0 |
| TEC | 0 0 1 0 |

Thereafter, signal DTG2 is temporarily set at "H" and the data in the PDC is transferred to DD2. Then, with signal VPRE=Vdd and signal REG2="H", if the data in DDC2 is "1", the TDC is forced to be set at Vss. Thereafter, the data in the TDC is transferred to the PDC. Then, the combinations of the data held in DDC2, DDC3, and PDC are as follows:

| | |
|---|---|
| DDC2 | 0 1 0 0 |
| DDC3 | 1 0 1 0 |
| PDC | 0 1 1 0 |

As a result of the above operations, the result obtained by XORing DDC2 with DDC3 is held in the PDC.

According to modification 1, the number of transfer operations to the outside is reduced to 6(=4+2). However, when the caches are used, if the read time at one level is 30 μs and the transfer time to the outside is 45 μs, the operating time in the case of FIG. 22 is expressed by the following equation:

(30 μs+60 μs+120 μs+240 μs)×4+45 μs=1800 μs+45 μs

Moreover, the operating time in the case of modification 1 shown in FIG. 24 is expressed by the following equation:

(30 μs+60 μs+120 μs+240 μs)×4+45 μs×2=1800 μs+90 μs

As described above, in the case of modification 1, the problem is that the operating time increases.

Modification 2

FIGS. 30 to 34 show modification 2 of the third embodiment. As shown in FIGS. 31 to 34, the cell threshold values and the lower page, upper page, higher page, and top pages are allocated and the number of times "H" was read from a lower level is counted. Specifically, each cache of the data storage circuit 10 is caused to function as a counter. Then, the counted number is stored in the PDC, DDC0, DDC1, DDC2, DDC3, and SDC as shown in FIGS. 31 to 34. These stored values are the inversion of the allocation of the lower page, upper page, higher page, and top page. However, if the value is lower than "0"-level, the lower page, upper page, higher page, and top page take the value of "1111". If the value is higher than "1"-level, the lower page, upper page, higher page, and top page take the value of "1110". For this reason, first, "000011" is set in the SDC, DDC3, DDC2, DDC1, and DDC0.

Thereafter, the data in the cell is read at "0"-level. If the read-out data is "H", /SDC, DDC3, DDC2, DDC1, DDC0, and PDC hold "000100". If the read-out data is "L", /SDC, DDC3, DDC2, DDC1, and DDC0 hold "000011". Thereafter, the data in the cell is read at a lower level, starting with "1"-level downward. If the read-out data is "H", "1" is added to each of /SDC, DDC3, DDC2, DDC1, and DDC0. After reading is done at "28"-level, it is determined whether the data in the SDC is "0" or "1". As shown by Dout in FIG. 30, the data in the SDC is output to the outside. Moreover, after reading is done at "44"-level, the data in DDC3 is also determined. For this reason, the data in DDC3 is inverted and the resulting data is transferred to the SDC. Thereafter, the data in the SDC is output to the outside. In addition, after reading is done at "52"-level, the data in DDC2 is also determined. For this reason, the data in DDC2 is inverted and the resulting data is transferred to the SDC. Thereafter, the data in the SDC is output to the outside. Furthermore, after reading is done at "56"-level, the data in DDC1 is also determined. For this reason, the data in DDC1 is inverted and the resulting data is transferred to the SDC. Thereafter, the data in the SDC is output to the outside. Moreover, after reading is done at "58"-level, the data in DDC0 is also determined. For this reason, the data in DDC0 is inverted and the resulting data is transferred to the SDC. Thereafter, the data in the SDC is output to the outside. Furthermore, after reading is done at "59"-level, the data in the PDC is also determined. For this reason, the data in the PDC is inverted and the resulting data is transferred to the SDC. Thereafter, the data in the SDC is output to the outside. Giving a definition in this way reduces the number of transfer operations to the outside to 4+2=6 as in modification 1. The working speed of modification 2 can be made faster than that of modification 1 as shown by the following equation:

$$(30\ \mu s+60\ \mu s+120\ \mu s+240\ \mu s) \times 4 + 45\ \mu s \times 2 = 1800\ \mu s + 90\ \mu s.$$

In a write operation, when the lower page, upper page, higher page, and top page are allocated as shown in FIGS. 30 to 34 to write 16 levels at the same time and distinguish the 16 levels in a verify operation at each level, data is stored as shown in FIG. 35:

The data obtained by inverting the data on the top page is stored in DDC0.

The data obtained by inverting the data on the higher page is stored in DDC1.

The data obtained by inverting the data on the upper page is stored in DDC2.

The data on the lower page is stored in the SDC.

In a write operation, "0" is stored in the PDC. In a non-write operation, "1" is stored in the PDC.

In a normal write operation, the writing of a cell with a lower threshold level is completed earlier. For this reason, if the writing of level A to level G is completed, it is unnecessary for the SDC to be used to determine whether writing is to be done to level A to level G or to level H to level O. Therefore, the SDC can be used to hold the data on the next page. Moreover, if the writing of level H to level K is completed, DDC2 can also be used to hold the data on the next page. Furthermore, if the writing of level L and level M is completed, DDC1 can also be used to hold the data on the next page. In addition, if the writing of level N is completed, DDC0 can also be used to hold the data on the next page. For this reason, since the data on the next page can be held without waiting for the end of the writing of all the levels, a high-speed operation is possible.

As shown in FIGS. 14 to 17, data is set on the lower page, upper page, higher page, and top page as follows:

| Threshold level: | ZABC | DEFG | HIJK | LMNO |
|---|---|---|---|---|
| Lower page: | 1111 | 1111 | 0000 | 0000 |
| Upper page: | 1111 | 0000 | 0000 | 1111 |
| Higher page: | 1100 | 0011 | 1100 | 0011 |
| Top page: | 1001 | 1001 | 1001 | 1001 |

The interval between levels is made uniform. However, for example, the interval between G-level and H-level is set larger than the interval between other levels. This makes it possible to decrease the defective fraction of the lower page.

Furthermore, the interval between C-level and D-level and the interval between K-level and L-level are set larger than the interval between other levels. This makes it possible to decrease the defective fraction of the upper page.

The interval between A-level and B-level, the interval between E-level and F-level, the interval between I-level and J-level, and the interval between M-level and N-level are set larger than the interval between other levels. This makes it possible to decrease the defective fraction of the higher page.

The interval between Z-level and A-level, the interval between B-level and C-level, the interval between D-level and E-level, the interval between F-level and G-level, the interval between H-level and I-level, the interval between J-level and K-level, the interval between L-level and M-level, and the interval between N-level and O-level are set greater than the interval between other levels. This makes it possible to decrease the defective fraction of the top page.

Modification 3

Figure 48:
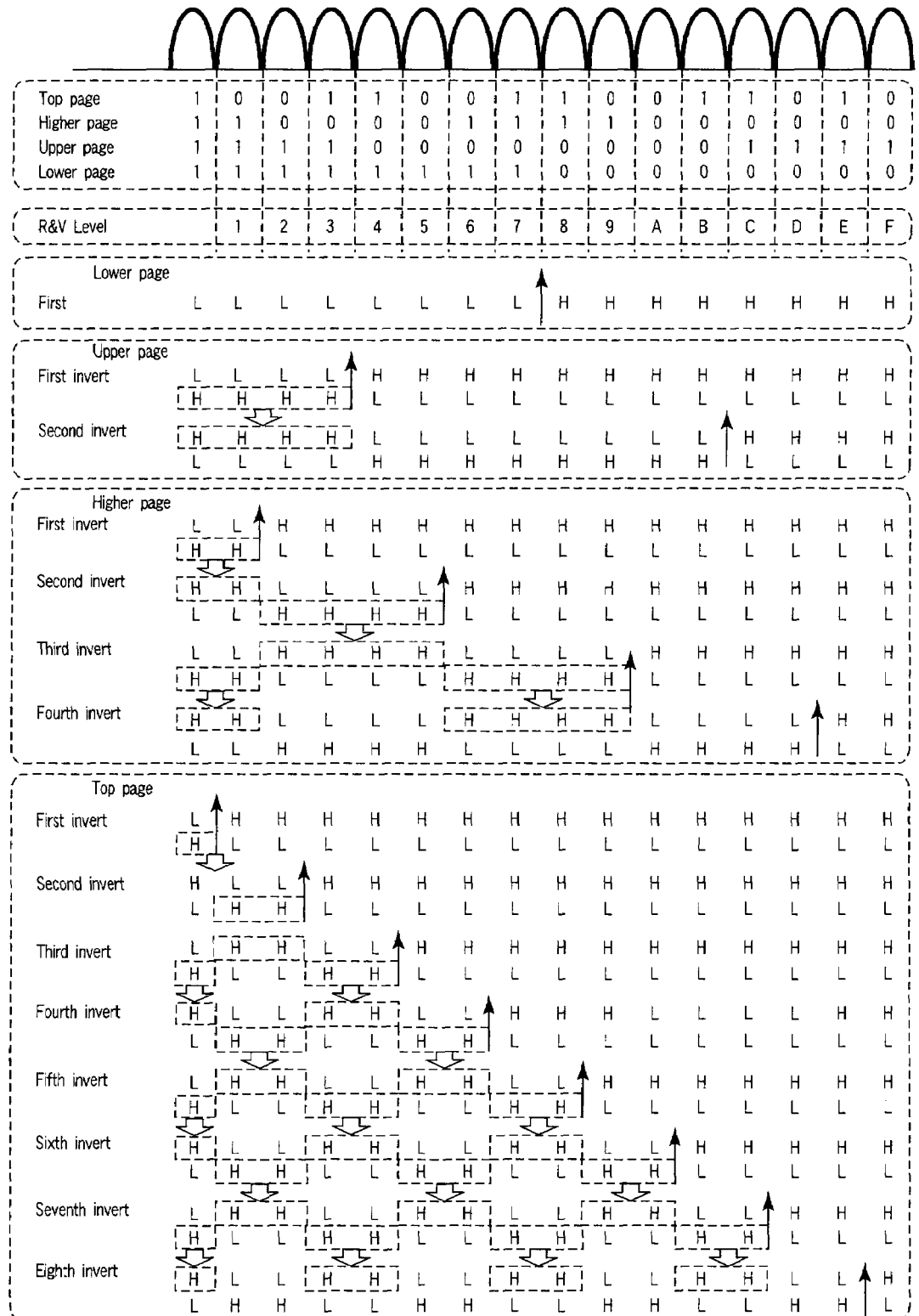
FIGS. 48 and 49 show an operation sequence according to modification 3 of the third embodiment.

FIG. 48 shows modification 3 of the third embodiment. As shown in FIG. 48, of the 16 levels, L-Page (lower page) is read at 8-level.

U-Page (upper page) is read at 4-level and C-level.

H-Page (higher page) is read at 2-level, 6-level, A-level, and E-level.

T-Page (top page) is read at 1-level, 3-level, 5-level, 7-level, 9-level, B-level, D-level, and F-level.

Figure 49:
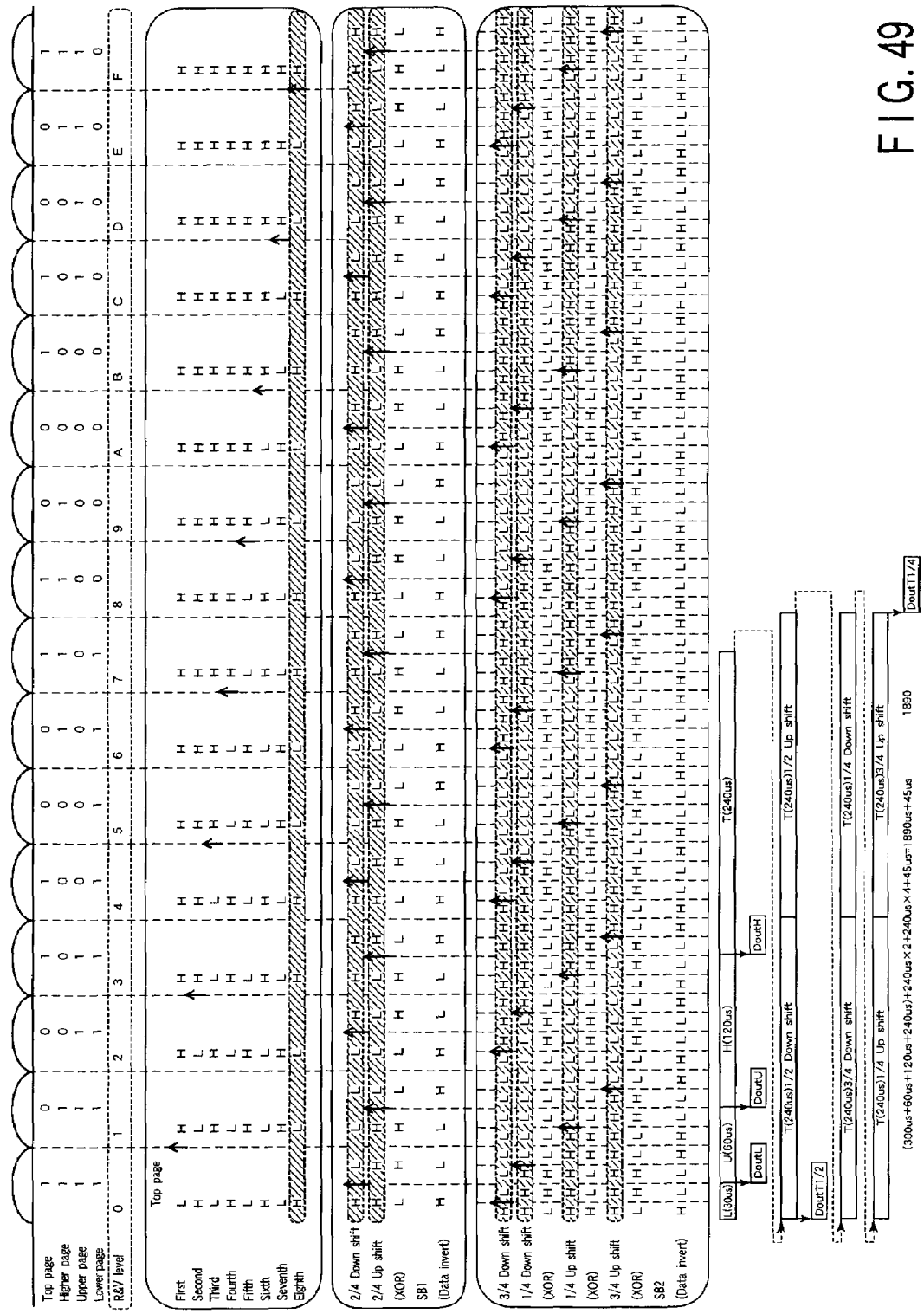

After this, as shown in FIG. 49, a level is shifted ¾ downward, and data is read in the completely same reading operation as T-Page. The read-out data is held in the data storage circuit.

Then, the level is shifted ¾ upward, and data is read in the completely same reading operation as that for reading T-Page. XOR of this read-out data and the data currently held in the data storage circuit is output.

The level is shifted ¾ downward, and data is read in the completely same reading operation as that for reading T-Page. This read-out data is held in the data storage circuit.

The level is shifted ¼ downward, and data is read in the completely same reading operation as that for reading T-Page. XOR of this read-out data and the data currently held in the data storage circuit is held in the data storage circuit.

The level is shifted ¼ upward, and data is read in the completely same reading operation as T-Page. XOR of this read-out data and the data currently held in the data storage circuit is held in the data storage circuit.

The level is shifted ¾ upward, and data is read in the completely same reading operation as that for reading T-Page. XOR of this read-out data and the data currently held in the data storage circuit is output.

The modification 1 needs time represented by the following formula.

$$(30\ \mu s+60\ \mu s+120\ \mu s+240\ \mu s) \times 4 + 45\ \mu s \times 2 = 1800\ \mu s + 90\ \mu s.$$

The modification 3 needs time represented by the following formula.

$$(30\ \mu s+60\ \mu s+120\ \mu s+240\ \mu s)+240\ \mu s \times 2+240\ \mu s \times 4 + 45\ \mu s = 1890\ \mu s + 45\ \mu s.$$

According to the modification 3, compared with a modification 1, read-out time becomes long a little. However, it is only necessary to change the read out level in the T-Page and the read-out data are XORed. Moreover, the number of times of read-out of the modification 1 is 15×4=60. The number of times of read-out of the modification 3 is 15+8×6=63, and its number of times is increasing compared with the modification 1. For this reason, the modification 3 is finely read a little compared with the modification 1.

The modification 3 is not limited to the above third embodiment, but is applicable to fourth to sixth embodiments described below.

Fourth Embodiment (When a threshold shift resulting from an adjacent cell being written into is corrected and the LDPC code is used)

The third embodiment has not taken into account a change in the threshold level as a result of an adjacent cell being written into. However, as described above, when 4-bit (16-level) data is written into cell MC12 after 4-bit (16-level) data is written into cell MC11 shown in FIG. 6, the threshold level of cell MC11 shifts toward a higher level because of the effect of the coupling capacitance between cells. To suppress the effect of the coupling, a cell to be written into is written to a threshold level lower than the original threshold level and then the surrounding cells are written to a threshold level lower than the original threshold level. Thereafter, the cell to be written into is written to the original threshold level and then the surrounding cells are written to the original threshold level. In this way, the effect of the coupling can be suppressed. However, there is a problem: the writing cannot be completed unless the data in the surrounding cells have been determined. As described above, in a case where the surrounding cells are not written into, when the LDPC code is used, since one threshold level is read as a probability value, the probability value has to be found by a plurality of read operations. For this reason, if the threshold level of the memory cell has changed because of the writing of the adjacent cells, the accuracy of the data read at four read levels decreases and therefore the accuracy of error correction decreases.

FIGS. 36 to 39 show the amount of change in the threshold level as a result of adjacent cells being written into at the threshold levels shown in FIGS. 14 to 17. Suppose six cases where the amount of change is naught, small, below average, average, above average, large. FIGS. 36 to 39 show the number of "Hs" read in the respective cases. When the threshold level changes in this way, if reading is done at a normal read level, it is difficult to read data correctly. For this reason, it is necessary to correct a change in the threshold level caused by the writing of adjacent cells and then do reading.

When the amount of change in each of six threshold levels corresponds to each of Z-level to O-level respectively and the four read levels are set to find the probability value for each level, a total of 65 read levels are needed as shown by broken lines 0 to 64 in FIGS. 36 to 39.

Figure 40:
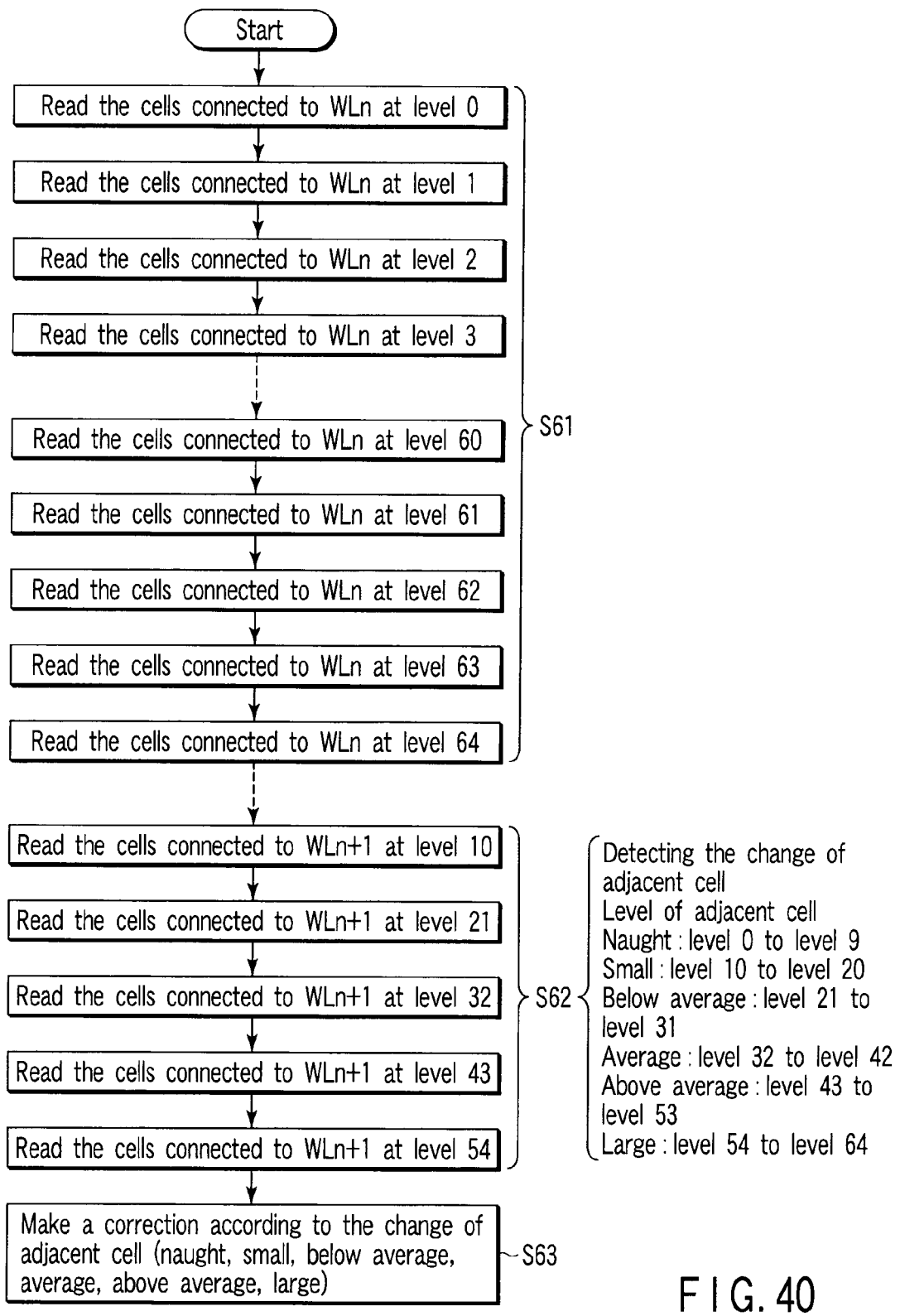
FIG. 40 is a flowchart to explain a read operation in the fourth embodiment.

FIG. 40 shows a read sequence in a fourth embodiment of the invention. In the fourth embodiment, for example, cell MC11 to be read from shown in FIG. 6 is read at level 0 to level 64, or at 65 read levels (S61).

Specifically, the control signal and control voltage generator circuit 7 of FIG. 1 generates read levels ranging from level 0 to level 64 and supplies them to the selected word line WLn of memory cell 1. For example, the threshold level of the cell is higher than the read level, the cell goes off. For this reason, the result is "H" (data "0"). If the threshold level is lower than the H-level, since the cell goes on, the result is "L" (data "1"). The data read at each read level is held in the data storage circuit 10 shown in FIG. 2. The data held in the data storage circuit 10 is transferred to the controller 11, while reading the data from the memory cell at the next read level as in the operation of FIG. 18.

Thereafter, a change in the threshold level of memory cell MC12 adjacent to memory cell MC11 is detected (S62). In this case, the shift of the threshold level of adjacent cells has only to be determined to be naught, small, below average, average, above average, or large. For this reason, there is no need to perform a read operation at 65 read levels ranging from level 0 to level 64 and reading is done at read levels 10, 21, 32, 43, and 54 shown in, for example, FIGS. 36 to 39. That is, read levels 10, 21, 32, 43, 54 are supplied to word line WLn+1, thereby reading the threshold level. Six items of data corresponding to the changes in the threshold level of the adjacent cells read by changing the level of word line WLn+1 are supplied sequentially to the controller 11.

The controller 11 counts the number of "Hs" (data "0") from the data obtained in step S61. Thereafter, on the basis of the six items of data corresponding to a change in the threshold level of adjacent cells, the 65 items of data are corrected. Accordingly, as a result of reading in step S 62, the number of "Hs" counted according to the amount of change in the threshold level of an adjacent cell is decreased.

Specifically, the number is decreases as follows:

When the amount of change in the threshold voltage is naught, no correction is made.

When the amount of change in the threshold voltage is small, the number of "Hs" is decreased by 1.

When the amount of change in the threshold voltage is below average, the number of "Hs" is decreased by 2.

When the amount of change in the threshold voltage is average, the number of "Hs" is decreased by 3.

When the amount of change in the threshold voltage is above average, the number of "Hs" is decreased by 4.

When the amount of change in the threshold voltage is large, the number of "Hs" is decreased by 5.

As a result, the number of times "H" (data "0") read from cell MC11 is output is 0 to 60, which corrects the effect of a change in the threshold level of adjacent cells.

Figures 41A, 41B:
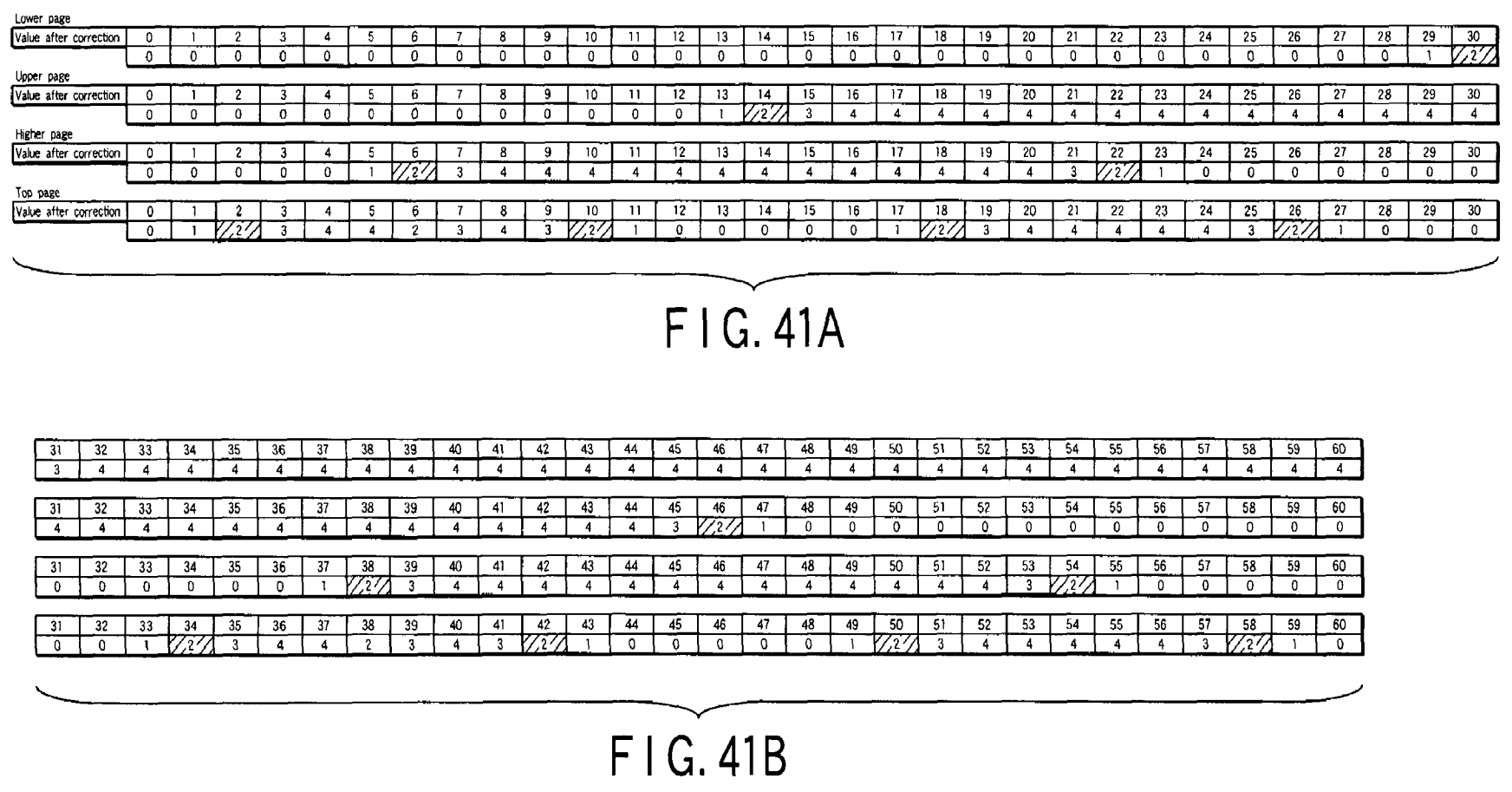

The top row of each of FIGS. 41A and 41B shows the number of "Hs" after each page is corrected. These correspond to the results of reading at level 0 to level 59 in FIGS. 14 to 17. For example, when the number of "Hs" after the correction is "30", this means that reading was done at level 29 in FIGS. 14 to 17. In the case of the lower page, the number of "Hs" is 2. Moreover, when the number of "Hs" after the correction is "29", this means that reading was done at level 28 in FIGS. 14 to 17. In the case of the lower page, the number of "Hs" is 1. On the basis of the number of "Hs", the probability of "H" is set as follows:

When the number of "Hs" is 4, the probability of "H" (data "0") is 100% (4/4).

When the number of "Hs" is 3, the probability of "H" (data "0") is 75% (3/4).

When the number of "Hs" is 2, the probability of "H" (data "0") is 50% (2/4).

When the number of "Hs" is 1, the probability of "H" (data "0") is 25% (1/4).

On the basis of the probability set in this way, the ECC circuit 11-1 for the LDPC code corrects the incorrect data.

In the flowchart of FIG. 40, after cell MC11 is read, cell MC12 adjacent to cell MC11 is read. The invention is not limited to this. For instance, cell MC12 may be read earlier than cell MC11.

In the fourth embodiment, the amount of change in the threshold level due to the effect of the coupling with the adjacent cells is detected. On the basis of the detected amount of change, the LDPC code reading result is corrected. Accordingly, a fluctuation in the threshold level as a result of the writing of adjacent cells can be eliminated, which enables the accuracy of error correction using the LDPC code to be improved.

Of course, when the LDPC code is not used, the probability values need not be output. For this reason, the number of "Hs" counted according to the amount of change in the threshold level of adjacent cells is decreased. The result is used directly as the read result.

Fifth Embodiment

The coupling between cells depends greatly on a variation in process or the like. For this reason, the threshold level is corrected using the shift value trimmed word line by word line or chip by chip as shown in the first embodiment. Alternatively, as shown in the second embodiment, a monitor cell is provided in the memory cell array. The shift value of the related threshold level is calculated from the threshold level of the monitor cell and the threshold level of the memory cell is read out.

As in the second embodiment, in the fifth embodiment, the effect of the coupling between cells is detected using the monitor cell MMC of FIG. 11. In the fifth embodiment, the highest threshold level in FIG. 17, such as O-level, is always written into the monitor cell. Then, the amount of change in the threshold level of O-level as a result of an adjacent cell being written into is detected, thereby correcting the read level of the adjacent cell.

Figure 42:
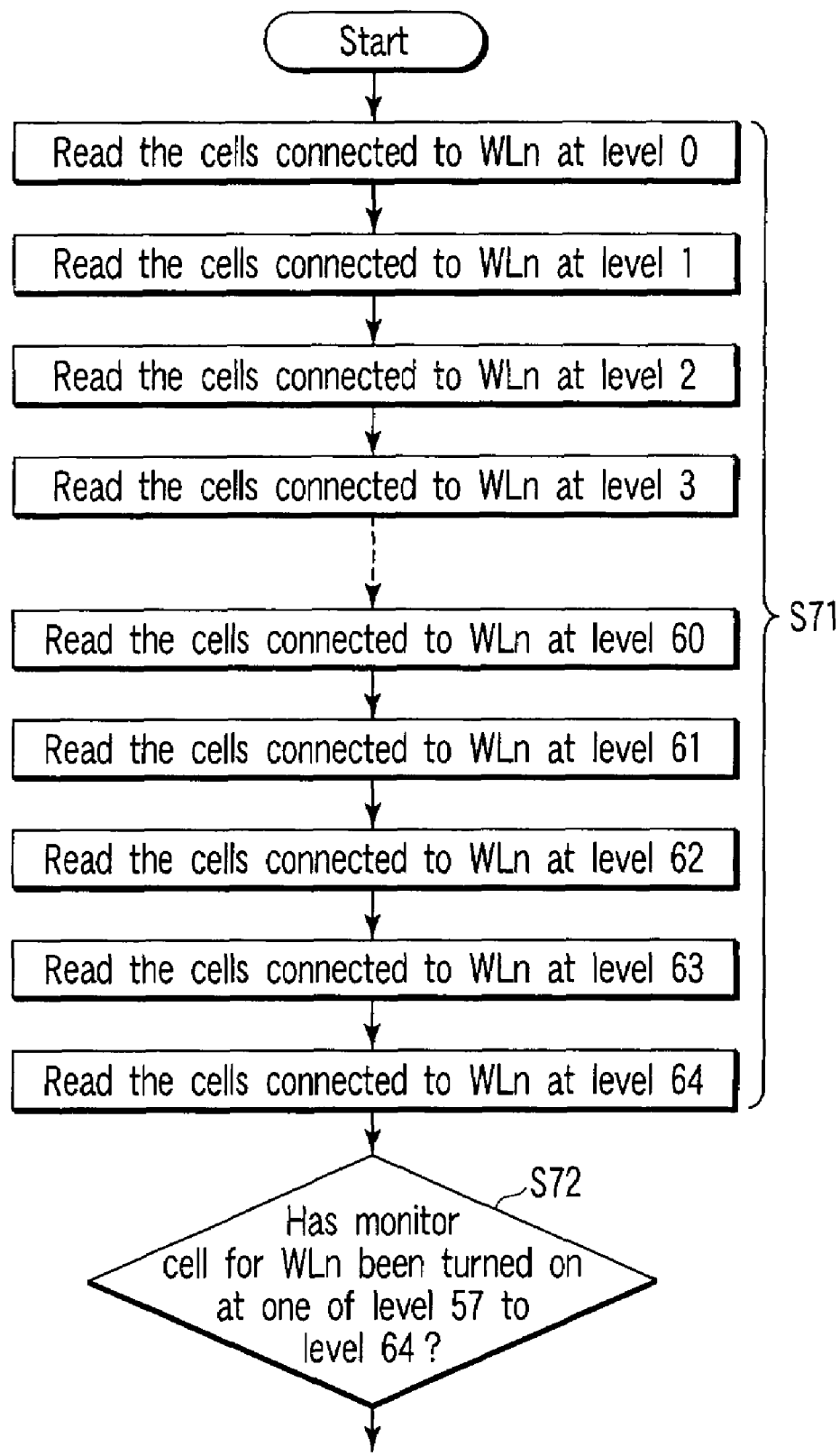
FIG. 42 is a flowchart to explain a read operation in a fifth embodiment of the invention.
Figure 43:
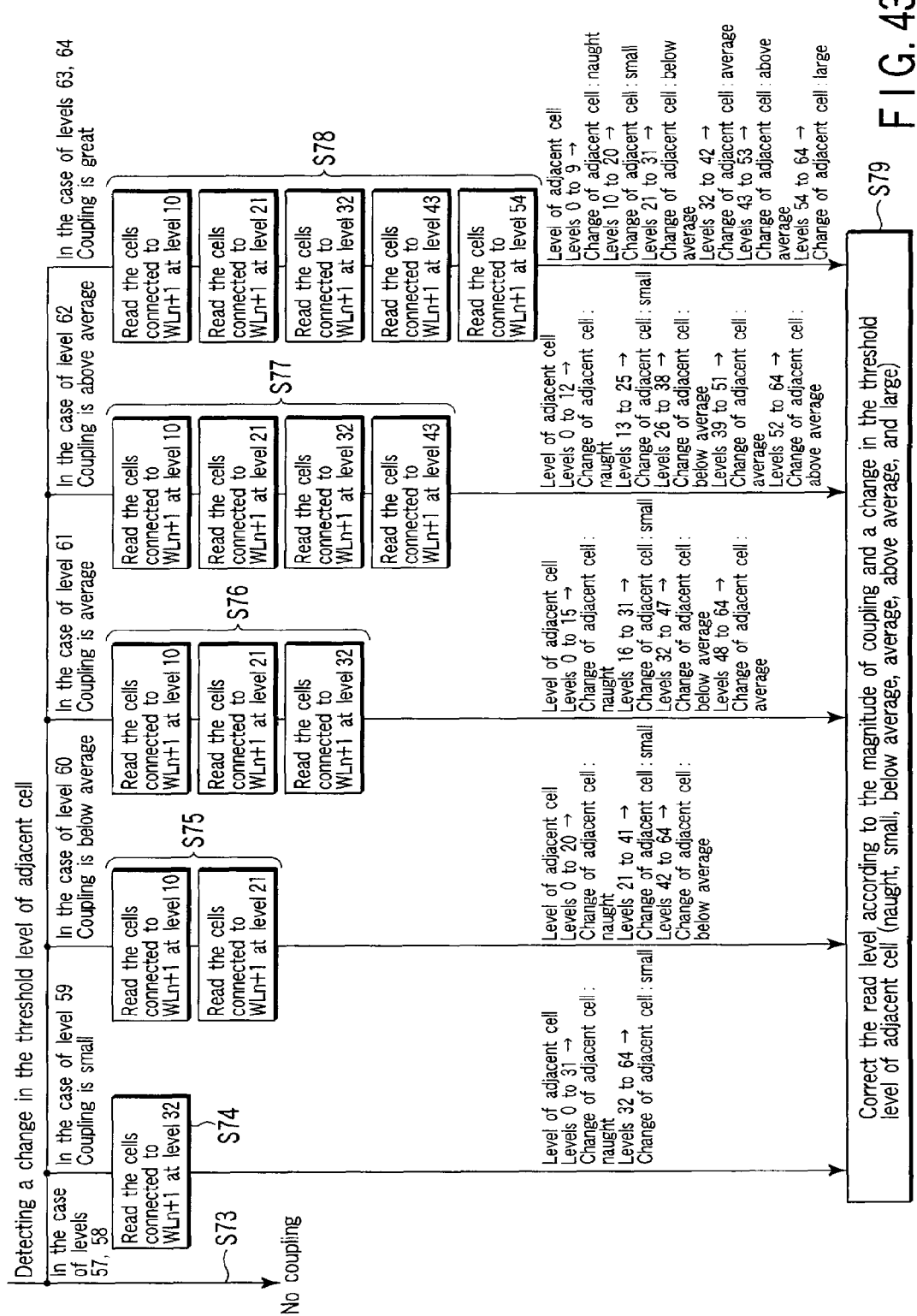
FIG. 43 is a flowchart to explain the read operation following FIG. 42 in the fifth embodiment.

FIGS. 42 and 43 show a read operation. As shown in FIG. 6, first, cell MC11 is read from. The read operation is almost the same as in the fourth embodiment shown in FIG. 40. Specifically, the control signal and control voltage generator circuit 7 of FIG. 1 generates read levels ranging from level 0 to level 64 and supplies them to the selected word line WLn of memory cell 1 (S71). For example, the threshold level of the cell is higher than the read level, the cell goes off. Thus, the result is "H" (data "0"). If the threshold level is lower than the H-level, since the cell goes on, the result is "L" (data "1"). At this time, it is detected at which one of level 57 to level 64 the monitor cell MMC has been turned on (S72). According to the level at which the monitor cell has been turned on, the read level of cell MC12 is determined. On the basis of the reading result, a correction is made.

Specifically, as shown in FIG. 43, when the threshold level of the monitor cell MMC is level 57 and level 58, since there is no coupling effect, cell MC12 is read from without correcting the read level (S73).

If the threshold level of the monitor cell MMC is level 59, since the effect of the coupling is "small", level 32 is supplied to word line WLn+1. At level 32, the threshold level of adjacent cell MC12 is read (S74).

If the threshold level of the monitor cell MMC is level 60, since the effect of the coupling is "below average", level 10 is supplied to word line WLn+1. At level 10, the threshold level of adjacent cell MC12 is read. Then, level 21 is supplied to word line WLn+1. At level 21, the threshold level of adjacent cell MC12 is read (S75).

If the threshold level of the monitor cell MMC is level 61, since the effect of the coupling is "average", level 10 is supplied to word line WLn+1. At level 10, the threshold level of adjacent cell MC12 is read. Then, level 21 is supplied to word line WLn+1. At level 21, the threshold level of adjacent cell MC12 is read. Moreover, level 32 is supplied to word line WLn+1. At level 32, the threshold level of adjacent cell MC12 is read (S76).

If the threshold level of the monitor cell MMC is level 62, since the effect of the coupling is "above average", level 10 is supplied to word line WLn+1. At level 10, the threshold level of adjacent cell MC12 is read. Then, level 21 is supplied to word line WLn+1. At level 21, the threshold level of adjacent cell MC12 is read. Moreover, level 32 is supplied to word line WLn+1. At level 32, the threshold level of adjacent cell MC12 is read. Thereafter, level 43 is supplied to word line WLn+1. At level 43, the threshold level of adjacent cell MC12 is read (S77).

If the threshold level of the monitor cell MMC is level 63 and level 64, since the effect of the coupling is "large", level 10 is supplied to word line WLn+1. At level 10, the threshold level of adjacent cell MC12 is read. Then, level 21 is supplied to word line WLn+1. At level 21, the threshold level of adjacent cell MC12 is read. Moreover, level 32 is supplied to word line WLn+1. At level 32, the threshold level of adjacent cell MC12 is read. Thereafter, level 43 is supplied to word line WLn+1. At level 43, the threshold level of adjacent cell MC12 is read. Then, level 54 is supplied to word line WLn+1. At level 54, the threshold level of adjacent cell MC12 is read (S78).

In this way, a change in the threshold level of cell MC12 adjacent to memory cell MC11 is detected. According to the magnitude of the coupling of adjacent cells and the shift of the threshold level (any one of naught, small, below average, average, above average, large), the result of reading memory cell MC11 is corrected (S79). Accordingly, a fluctuation in the threshold level caused by the magnitude of the coupling of adjacent cells and the writing of adjacent cells can be eliminated, which enables the data in the memory cell MC to be read with high accuracy.

In the fifth embodiment, a monitor cell MMC written into together with the memory cell is provided. In the monitor cell, the highest threshold level is always written. By determining the threshold level in the monitor cell MMC, the amount of change in the threshold level of the monitor cell MMC due to the coupling with adjacent cells is detected at six stages. This enables the effect of the coupling with the adjacent cells can be detected more accurately. Therefore, correcting the read-out level of the adjacent cell on the basis of the detected amount of change makes it possible to read the threshold level of the adjacent cell accurately.

The number of read levels is not limited to 0 to 64 and may be made finer or rougher. The effect of the coupling with adjacent cells is classified into naught, small, below average, average, above average, and large, a total of six groups. Moreover, the amount of change in the threshold level of adjacent cells is also classified into naught, small, below average, average, above average, and large, a total of six groups. These classifications may be changed.

In the fifth embodiment, a plurality of monitor cells may be provided. Using the items of the data read from the monitor cells, a decision may be made by majority. On the basis of the result, a correction may be made.

Of course, when the LDPC code is not used, probability values need not be output. For this reason, the number of "Hs" counted according to the amount of change in the threshold level of adjacent cells is decreased. The result is used directly as the read result.

Sixth Embodiment

A sixth embodiment of the invention enables a variation in the threshold level from one chip to another or from one word line to another to be corrected without using the trimming data or monitor cell.

In a NAND flash memory, since all of or half of the cells arranged in the row direction are written in unison as, for example, (2 KB×4) of data, it follows that, for example, 2 KB×4 (4 bits/cell)=16 k×4 (4 bits/cell). Specifically, suppose 16 k cells exist uniformly as follows: 1 k cells exist at Z-level, 1 k cells exist at A-level, 1 k cells exist at B-level, 1 k cells exist at C-level, 1 k cells exist at D-level, 1 k cells exist at E-level, 1 k cells exist at F-level, 1 k cells exist at G-level, 1 k cells exist at H-level, 1 k cells exist at I-level, 1 k cells exist at J-level, 1 k cells exist at K-level, 1 k cells exist at L-level, 1 k cells exist at M-level, 1 k cells exist at N-level, and 1 k cells exist at O-level. When data is written into adjacent cells in this state, suppose the threshold levels of these cells have changed uniformly. If the data read from these cells are classified into six patterns where the amount of change in the threshold level is naught, small, below average, average, above average, or large, there are 16 k/6=2666 cells for one pattern. If there are 16 levels uniformly for one pattern, there are supposed to be 166 cells for one level.

Figure 47:
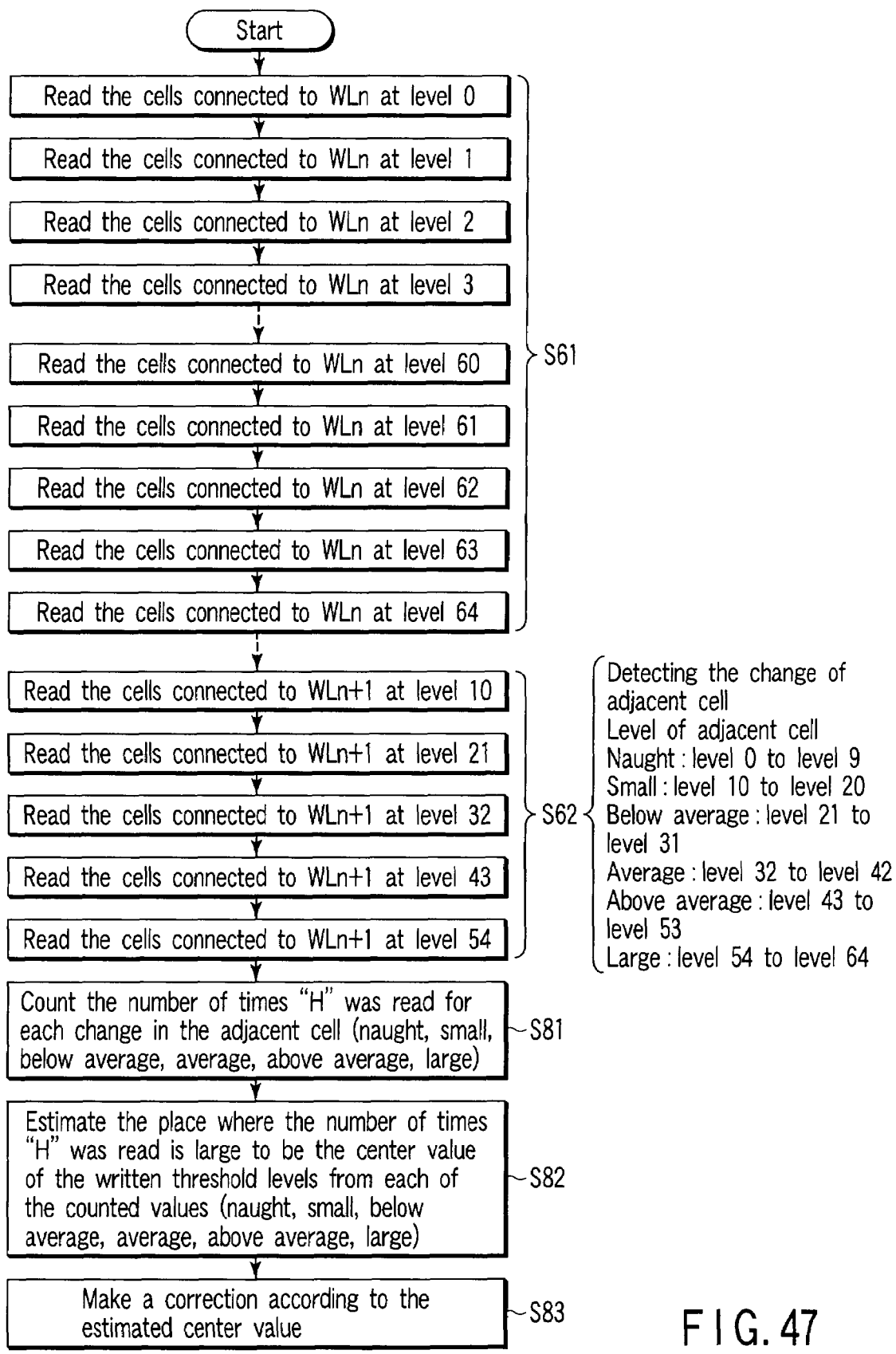
FIG. 47 is a flowchart to explain a read operation in the sixth embodiment.

FIG. 47 shows an operation in the sixth embodiment. The same parts as those in FIG. 40 are indicated by the same reference numerals.

(1) As shown in FIG. 47, the cells of WLn are read from at each of level 0 to level 64 (S61).

(2) The cells of WLn+1 are read from at levels 10, 21, 32, 43, and 65 and a check is made to see if the amount of change in the threshold level of adjacent cell (WLn+1) is naught, small, below average, average, above average, or large (S62).

Figure 45:
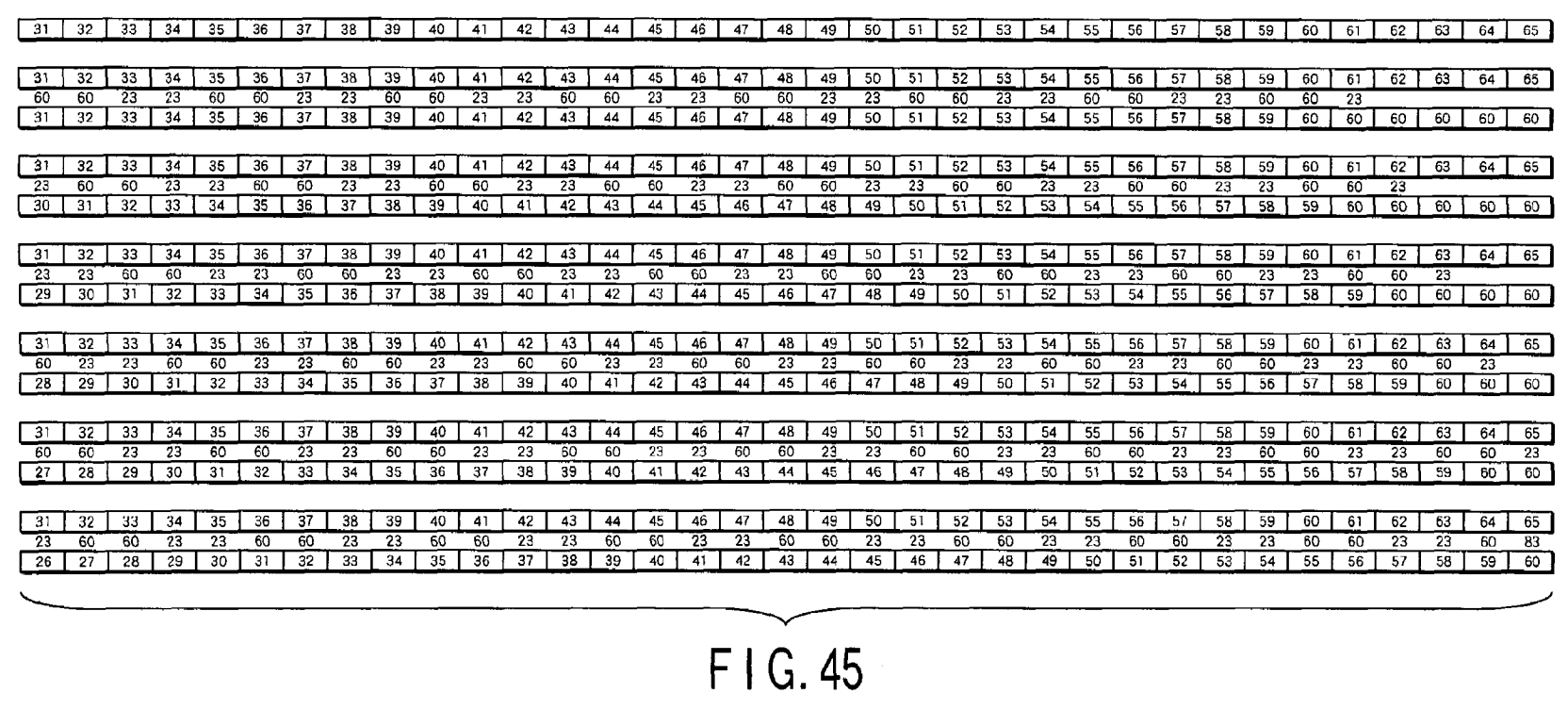

(3) The number of times "H" was read out at the cells of WLn is counted for each amount of change in the threshold level of adjacent cell (WLn+1) (that is, for each of naught, small, below average, average, above average, and large). FIGS. 44 and 45 show the result of the counting (S81).

In FIGS. 44 and 45, the result of the counting when the amount of change in the threshold level of, the adjacent cell is, for example, naught is as follows:
The number of times "H" was read is 0 is at 143 cells.
The number of times "H" was read is 1 is at 23 cells.
The number of times "H" was read is 2 is at 23 cells.
The number of times "H" was read is 3 is at 60 cells.
The number of times "H" was read is 4 is at 60 cells.
The number of times "H" was read is 5 is at 23 cells.
The number of times "H" was read is 6 is at 23 cells.
The number of times "H" was read is 7 is at 60 cells.
The number of times "H" was read is 8 is at 60 cells.
The number of times "H" was read is 9 is at 23 cells.
The number of times "H" was read is 10 is at 23 cells.
The number of times "H" was read is 11 is at 60 cells.
The rest is omitted.

Moreover, for example, the result of the counting when the amount of change in the threshold level of the adjacent cell is, for example, "large" is as follows:
The number of times "H" was read is 0 is at 0 cell.
The number of times "H" was read is 1 is at 0 cell.
The number of times "H" was read is 2 is at 0 cell.
The number of times "H" was read is 3 is at 23 cells.
The number of times "H" was read is 4 is at 60 cells.
The number of times "H" was read is 5 is at 60 cells.
The number of times "H" was read is 6 is at 23 cells.
The number of times "H" was read is 7 is at 23 cells.
The number of times "H" was read is 8 is at 60 cells.
The number of times "H" was read is 9 is at 60 cells.
The number of times "H" was read is 10 is at 23 cells.
The rest is omitted.

As described above, the number of cells increases or decreases for the number of times "H" was read. The place where the number of cells is large, for example, "60 cells" can be estimated to be the center value (S82). For this reason, according to the estimated center value, the read level is corrected (S83).

As described above, changes corresponding to six patterns of a change in the threshold level are as shown in FIGS. 44 and 45. When the amount of change in the threshold level is naught, small, below average, average, above average, or large, the correction value is set to, for example, "0", "−1", "−2", "−3", "−4", or "−5". These correction values are subtracted from the number of times "H" was read, giving the values shown in "after conversion" in FIGS. 44 and 45. The "after conversion" corresponds to a read level being corrected according to a correction value. That is, "after conversion" corresponds to the top row of FIG. 41. As in the fourth embodiment, a probability value is found on the basis of the number of "Hs" on each page. Accordingly, even if the coupling capacitance between cells is large due to a variation in the process or the like, it is possible to correct a fluctuation in the threshold level as a result of adjacent cells being written into and perform reading. Of course, when the LDPC code is not used, probability values need not be output. For this reason, the place where the number of cells is large can be considered to be the center value of each threshold level. The result of correcting the read level according to the center value is the read-out data.

With the sixth embodiment, it is possible to detect a variation in the threshold level from one memory cell to another and from one word line to another without using a monitor cell and correct a fluctuation in the threshold level. This enables high-accuracy reading.

In the sixth embodiment, it has been assumed that 1 k cells exist at each level uniformly. However, actual data exists randomly. For this reason, in an extreme case, only one cell exists at one level. As the page size increases, the probability that data will be in such a state is very low. Accordingly, in such a case, data is changed by the controller so that a plurality of cells (e.g., 10 cells) may always exist at one level.

While the shift of the threshold level as a result of adjacent cells being written into is classified into six states, naught, small, below average, average, above average, and large, the shift may be classified into more than six states. In this case, the reading accuracy can be improved.

Each of the above embodiments is not limited to 3-bit, 8-level data or 4-bit, 16-level data and may be applied to other bits of data.

Figure 46:
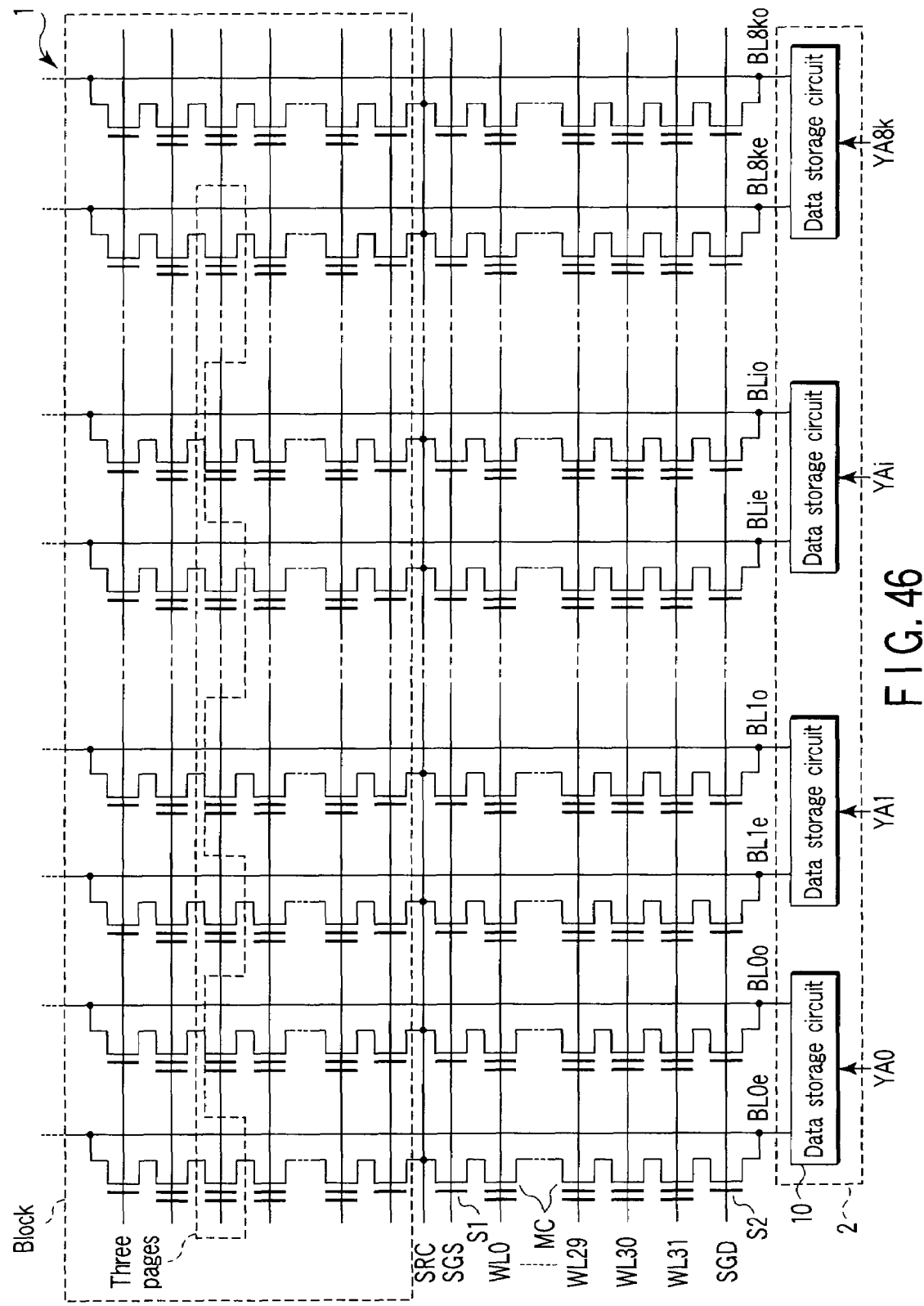
FIG. 46 is a circuit diagram of another example of the memory cell array.

FIG. 46 shows an example of selecting half of the plurality of memory cells connected the word line at a time. A pair of bit lines is connected to the data storage circuit 10. One of the pair of bit lines is selectively connected to the data storage circuit 10. The first to sixth embodiments may be applied to the memory cell array whose configuration is as shown in FIG. 46.

As in the third embodiment, in the fourth, fifth, and sixth embodiments, the threshold level is read from the cells connected to word line WLn 65 times and the data is transferred from the data storage circuit to the controller 65 times as shown in FIGS. 40, 42, 44, and 45. However, 65 levels can be expressed as $2^7$ and represented in 7 bits as follows.
The number of times "H" was read is 0: 0000000
The number of times "H" was read is 1: 0000001
The number of times "H" was read is 2: 0000010
The number of times "H" was read is 3: 0000011
The number of times "H" was read is 4: 0000100
The number of times "H" was read is 5: 0000101
. . .
The number of times "H" was read is 63: 1000000
The number of times "H" was read is 64: 1000001

The number of times "H" was read is 65: 1000010

For this reason, each data storage circuit is caused to function as, for example, a counter. The counter counts the number of times reading is done and transfers data to the controller one bit by one bit seven times.

As in the third embodiment, when the memory cells have been read from as many times as half of the total number of times reading is done, the top digit can be output to the outside. For this reason, while the top digit data is being output to the outside, the next data is read from the memory cells. Similarly, since reading is done several times, the result of the counting can be output to the outside. Thus, while the result is being output sequentially to the outside, the next data may be read from the memory cells.

Of course, when the LDPC code is not used, probability values need not be output. For this reason, the number of "Hs" calculated according to the amount of change in the threshold level of adjacent cells is reduced. Then, the result is used directly as the read-out data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array in which a plurality of memory cells are arranged in a matrix, each of said plurality of memory cells storing a plurality of bits;
    a storage portion which is formed so as to store a correction level; and
    a control portion which is formed so as to read a threshold level of a second memory cell adjacent to a first memory cell in the memory cell array and which reads the correction level from the storage portion according to the threshold level read from the second memory cell, adds the read-out correction level to a threshold level of the first memory cell, and reads the threshold level of the first memory cell,
    wherein the correction level is determined for each chip or for each word line.

2. The semiconductor memory device according to claim 1, wherein the storage portion stores the correction level for each of the chips or for each of the word lines.

3. The semiconductor memory device according to claim 2, wherein the correction level is determined when the semiconductor memory device is tested.

4. A semiconductor memory device comprising:
    a memory cell array in which a plurality of memory cells are arranged in a matrix, each of said plurality of memory cells storing a plurality of bits;
    a first memory cell in the memory cell array;
    a second memory cell which is adjacent to the first memory cell and is written into later than the first memory cell;
    a third memory cell which is selected simultaneously with the first memory cell and into which a constant threshold level is written;
    a fourth memory cell which is selected simultaneously with the second memory cell and into which the constant threshold level is written; and
    a control portion which reads a threshold level of the third memory cell when a threshold level of the first memory cell is read and which adds a first correction level corresponding to the read-out threshold level and a second correction level corresponding to a threshold level of the second memory cell to a read level of the first memory cell and reads the threshold level of the first memory cell.

5. The semiconductor memory device according to claim 4, wherein a plurality of units of the third memory cell and a plurality of units of the fourth memory cell are provided and the control portion decides the threshold level read from said plurality of third memory cells by majority.

6. A memory system comprising:
    a memory cell array in which a plurality of memory cells are arranged in a matrix and which has a first memory cell for storing write data and a second memory cell for storing an error correction bit for the data in the first memory cell;
    an error correcting portion which corrects an error in the data read from the first memory cell on the basis of the data read from the first and second memory cells; and
    a control portion which reads data from the first and second memory cells at a plurality of read levels a plurality of times to create probability data used in the error correcting portion.

7. The memory system according to claim 6, wherein the control portion detects the threshold level of a memory cell adjacent to one of the memory cells and corrects the data read from the one memory cell according to the amount of change in the detected threshold level of the adjacent memory cell.

8. The memory system according to claim 6, wherein said plurality of memory cells simultaneously selected store a plurality of pages of data and the control portion reads the data on each of the pages at a plurality of read levels.

9. The memory system according to claim 8, further comprising a controller which counts the number of first logical levels included in the data on each of the pages and creates a probability value for one page,
    wherein the error correcting portion corrects incorrect data on the basis of the probability value.

10. A memory system comprising:
    a memory cell array in which a plurality of memory cells are arranged in a matrix, each of said plurality of memory cells storing a plurality of bits;
    a first memory cell in the memory cell array;
    a second memory cell which is adjacent to the first memory cell and is written into later than the first memory cell;
    a control portion which reads a threshold level of the first memory cell at an n number of read levels (n is a natural number) and further reads a threshold level of the second memory cell at a k number of read levels (k is equal to or smaller than n); and
    a controller which counts a number of first logical levels read at the n number of read levels and which finds an amount of change in the threshold level of the second memory cell read at the k number of read levels, corrects the result of the counting according to the amount of change, and outputs the corrected data as read-out data.

11. The memory system according to claim 10, wherein the controller counts the number of the first logical level data items included in the data read at the n number of read levels to obtain a counted number and subtracts a different value from the counted number according to the amount of change in the data read at the k number of read levels.

12. The memory system according to claim 10, wherein said plurality of memory cells simultaneously selected store a plurality of pages of data and the control portion reads the data on each of the pages at a plurality of read levels.

13. A memory system comprising:
a memory cell array in which a plurality of memory cells are arranged in a matrix, each of said plurality of memory cells storing a plurality of bits;
a first memory cell in the memory cell array;
a second memory cell which is adjacent to the first memory cell and is written into later than the first memory cell;
a third memory cell which is selected simultaneously with the first memory cell and into which a constant threshold level is written;
a fourth memory cell which is selected simultaneously with the second memory cell and into which a constant threshold level is written;
an error correcting portion which corrects an error in the read-out data on the basis of the data read from said plurality of memory cells; and
a control portion which not only reads data from the first memory cell at a plurality of read levels a plurality of times but also reads a threshold level of the third memory cell to create probability data used in the error correcting portion and which adds a first correction level corresponding to the read-out threshold level of the third memory cell and a second correction level corresponding to a threshold level of the second memory cell to the data read from the first memory cell and uses the corrected data as the probability data.

14. The memory system according to claim 13, wherein the highest threshold level is written into the third and fourth memory cells.

15. The memory system according to claim 14, wherein the control portion, when the threshold level of the third memory cell is the highest threshold level, reads the read level in the second memory cell without correction and, when the threshold level of the third memory cell is lower than the highest threshold level, reads the threshold level of the second memory cell at a read level corrected according to the level, and adds a value corresponding to a change in the threshold level of the second memory cell to the data read from the first memory cell.

16. The memory system according to claim 13, wherein said plurality of memory cells simultaneously selected store a plurality of pages of data and the control portion read the data on each of the pages at a plurality of read levels.

17. A memory system comprising:
a memory cell array in which a plurality of memory cells are arranged in a matrix, each of said plurality of memory cells storing a plurality of bits;
a first memory cell in the memory cell array;
a second memory cell which is adjacent to the first memory cell and is written into later than the first memory cell;
a control portion which reads not only a threshold level of the first memory cell at an n number of read levels (n is a natural number) but also a threshold level of the second memory cell at a k number of read levels (k is equal to or smaller than n), thereby finding the threshold level of the second memory cell; and
a controller which counts a number of first logical levels read from the first memory for each threshold level of the second memory cell, estimates a center value of the threshold levels written into the first memory cell on the basis of the result of the counting, and corrects the read level according to the center value.

18. The memory system according to claim 17, wherein said plurality of memory cells simultaneously selected store a plurality of pages of data and the control portion reads the data on each of the pages at a plurality of read levels.

* * * * *